(12) United States Patent
Oliver et al.

(10) Patent No.: US 10,396,269 B2
(45) Date of Patent: Aug. 27, 2019

(54) INTERCONNECT STRUCTURES FOR ASSEMBLY OF SEMICONDUCTOR STRUCTURES INCLUDING SUPERCONDUCTING INTEGRATED CIRCUITS

(71) Applicant: Massachusetts Institute of Technology, Cambridge, MA (US)

(72) Inventors: William D. Oliver, Arlington, MA (US); Andrew J. Kerman, Arlington, MA (US); Rabindra N. Das, Lexington, MA (US); Donna-Ruth W. Yost, Acton, MA (US); Danna Rosenberg, Arlington, MA (US); Mark A. Gouker, Belmont, MA (US)

(73) Assignee: Massachusetts Institute of Technology, Cambridge, MA (US)

(*) Notice: Subject to any disclaimer, the term of this patent is extended or adjusted under 35 U.S.C. 154(b) by 0 days.

(21) Appl. No.: 15/342,478

(22) Filed: Nov. 3, 2016

(65) Prior Publication Data
US 2018/0012932 A1 Jan. 11, 2018

Related U.S. Application Data

(60) Provisional application No. 62/251,248, filed on Nov. 5, 2015.

(51) Int. Cl.
*H01L 39/04* (2006.01)
*G06N 10/00* (2019.01)
(Continued)

(52) U.S. Cl.
CPC .......... *H01L 39/04* (2013.01); *G06N 10/00* (2019.01); *H01L 21/02063* (2013.01);
(Continued)

(58) Field of Classification Search
CPC ..... H01L 27/18; H01L 39/025; H01L 39/223; H01L 25/0652; H01L 25/0657; H01L 39/04; G06N 99/002
See application file for complete search history.

(56) References Cited

U.S. PATENT DOCUMENTS

| 4,316,200 A | 2/1982 | Ames et al. |
| 4,612,083 A | 9/1986 | Yasumoto et al. |

(Continued)

FOREIGN PATENT DOCUMENTS

| WO | WO 2016/025451 A1 | 2/2016 |
| WO | WO 2016/025478 A1 | 2/2016 |

(Continued)

OTHER PUBLICATIONS

International Preliminary Report dated Feb. 23, 2017 for PCT Application No. PCT/US2015/044608; 9 pages.
(Continued)

*Primary Examiner* — Tucker J Wright
(74) *Attorney, Agent, or Firm* — Daly Crowley Mofford & Durkee

(57) ABSTRACT

A multi-layer semiconductor structure includes a first semiconductor structure and a second semiconductor structure, with at least one of the first and second semiconductor structures provided as a superconducting semiconductor structure. The multi-layer semiconductor structure also includes one or more interconnect structures. Each of the interconnect structures is disposed between the first and second semiconductor structures and coupled to respective ones of interconnect pads provided on the first and second semiconductor structures. Additionally, each of the interconnect structures includes a plurality of interconnect sections.
(Continued)

At least one of the interconnect sections includes at least one superconducting and/or a partially superconducting material.

12 Claims, 22 Drawing Sheets

(51) Int. Cl.
| | |
|---|---|
| *H01L 21/02* | (2006.01) |
| *H01L 21/66* | (2006.01) |
| *H01L 23/00* | (2006.01) |
| *H01L 39/02* | (2006.01) |
| *H01L 25/065* | (2006.01) |
| *H01L 25/00* | (2006.01) |
| *H01L 27/18* | (2006.01) |
| *H01L 39/22* | (2006.01) |
| *H01L 23/498* | (2006.01) |
| *H01L 23/552* | (2006.01) |
| *B82Y 10/00* | (2011.01) |

(52) U.S. Cl.
CPC .. *H01L 21/02282* (2013.01); *H01L 21/02345* (2013.01); *H01L 22/26* (2013.01); *H01L 23/49827* (2013.01); *H01L 23/552* (2013.01); *H01L 24/05* (2013.01); *H01L 24/11* (2013.01); *H01L 25/0652* (2013.01); *H01L 25/0657* (2013.01); *H01L 25/50* (2013.01); *H01L 27/18* (2013.01); *H01L 39/02* (2013.01); *H01L 39/025* (2013.01); *H01L 39/223* (2013.01); *B82Y 10/00* (2013.01); *H01L 24/13* (2013.01); *H01L 24/81* (2013.01); *H01L 25/0655* (2013.01); *H01L 2224/0401* (2013.01); *H01L 2224/04042* (2013.01); *H01L 2224/0558* (2013.01); *H01L 2224/05111* (2013.01); *H01L 2224/05116* (2013.01); *H01L 2224/05166* (2013.01); *H01L 2224/05169* (2013.01); *H01L 2224/05609* (2013.01); *H01L 2224/05644* (2013.01); *H01L 2224/06181* (2013.01); *H01L 2224/08503* (2013.01); *H01L 2224/11001* (2013.01); *H01L 2224/11005* (2013.01); *H01L 2224/117* (2013.01); *H01L 2224/1111* (2013.01); *H01L 2224/11462* (2013.01); *H01L 2224/11474* (2013.01); *H01L 2224/11902* (2013.01); *H01L 2224/131* (2013.01); *H01L 2224/13023* (2013.01); *H01L 2224/13109* (2013.01); *H01L 2224/16145* (2013.01); *H01L 2224/16146* (2013.01); *H01L 2224/17181* (2013.01); *H01L 2224/32145* (2013.01); *H01L 2224/48091* (2013.01); *H01L 2224/48137* (2013.01); *H01L 2224/48227* (2013.01); *H01L 2224/73204* (2013.01); *H01L 2224/73207* (2013.01); *H01L 2224/80896* (2013.01); *H01L 2224/8181* (2013.01); *H01L 2224/81815* (2013.01); *H01L 2224/92125* (2013.01); *H01L 2225/0651* (2013.01); *H01L 2225/06506* (2013.01); *H01L 2225/06513* (2013.01); *H01L 2225/06517* (2013.01); *H01L 2225/06531* (2013.01); *H01L 2225/06541* (2013.01); *H01L 2225/06568* (2013.01); *H01L 2225/06572* (2013.01)

(56) References Cited

U.S. PATENT DOCUMENTS

| | | | |
|---|---|---|---|
| 5,057,877 A | 10/1991 | Briley et al. | |
| 5,156,997 A | 10/1992 | Kumar et al. | |
| 5,179,070 A * | 1/1993 | Harada | H01L 39/2461 257/33 |
| 5,371,328 A | 12/1994 | Gutierrez et al. | |
| 5,650,353 A | 7/1997 | Yoshizawa et al. | |
| 5,773,875 A | 6/1998 | Chan | |
| 6,108,214 A | 8/2000 | Fuse | |
| 6,297,551 B1 | 10/2001 | Dudderar et al. | |
| 6,324,755 B1 | 12/2001 | Borkowski et al. | |
| 6,346,469 B1 | 2/2002 | Greer | |
| 6,355,501 B1 | 3/2002 | Fung et al. | |
| 6,396,371 B2 | 5/2002 | Streeter et al. | |
| 6,436,740 B1 | 8/2002 | Jen et al. | |
| 6,485,565 B1 | 11/2002 | Springer | |
| 6,678,167 B1 * | 1/2004 | Degani | H01L 23/36 257/E23.101 |
| 6,819,000 B2 | 11/2004 | Magerlein et al. | |
| 6,825,534 B2 | 11/2004 | Chen et al. | |
| 6,838,774 B2 | 1/2005 | Patti | |
| 7,427,803 B2 | 9/2008 | Chao et al. | |
| 7,589,390 B2 | 9/2009 | Yao | |
| 7,624,088 B2 | 11/2009 | Johnson et al. | |
| 7,932,515 B2 | 4/2011 | Bunyk | |
| 7,939,926 B2 | 5/2011 | Kaskoun et al. | |
| 7,993,971 B2 | 8/2011 | Chatterjee et al. | |
| 8,159,825 B1 | 4/2012 | Dotsenko | |
| 8,202,785 B2 | 6/2012 | Castex et al. | |
| 8,354,746 B2 | 1/2013 | Huang et al. | |
| 8,466,036 B2 | 6/2013 | Brindle et al. | |
| 8,487,444 B2 | 7/2013 | Law et al. | |
| 8,492,911 B2 | 7/2013 | Bachman et al. | |
| 8,519,543 B1 | 8/2013 | Song et al. | |
| 8,546,188 B2 | 10/2013 | Liu et al. | |
| 8,564,955 B2 | 10/2013 | Schmidt et al. | |
| 8,736,068 B2 | 5/2014 | Bartley et al. | |
| 8,754,321 B2 | 6/2014 | Schroeder et al. | |
| 8,828,860 B2 | 9/2014 | Gruber et al. | |
| 8,928,128 B2 | 1/2015 | Karikalan et al. | |
| 8,954,125 B2 | 2/2015 | Corcoles Gonzalez et al. | |
| 9,076,658 B1 | 7/2015 | Brown et al. | |
| 9,171,792 B2 | 10/2015 | Sun et al. | |
| 9,836,699 B1 | 12/2017 | Rigetti et al. | |
| 2001/0016383 A1 | 8/2001 | Chen et al. | |
| 2002/0094661 A1 | 7/2002 | Enquist et al. | |
| 2003/0067073 A1 | 4/2003 | Akram et al. | |
| 2004/0124538 A1 | 7/2004 | Reif et al. | |
| 2004/0188845 A1 | 9/2004 | Iguchi et al. | |
| 2004/0223380 A1 | 11/2004 | Hato | |
| 2006/0191640 A1 | 8/2006 | Johnson | |
| 2007/0087544 A1 | 4/2007 | Chang et al. | |
| 2007/0119812 A1 | 5/2007 | Kerdiles et al. | |
| 2007/0207592 A1 | 9/2007 | Lu et al. | |
| 2008/0093747 A1 | 4/2008 | Enquist et al. | |
| 2008/0122115 A1 | 5/2008 | Popa et al. | |
| 2008/0169559 A1 | 7/2008 | Yang | |
| 2008/0230916 A1 | 9/2008 | Saito et al. | |
| 2008/0290790 A1 | 11/2008 | Jin | |
| 2008/0316714 A1 | 12/2008 | Eichelberger et al. | |
| 2009/0078966 A1 | 3/2009 | Asai et al. | |
| 2009/0173936 A1 | 7/2009 | Bunyk | |
| 2009/0186446 A1 | 7/2009 | Kwon et al. | |
| 2009/0233436 A1 | 9/2009 | Kim et al. | |
| 2010/0001399 A1 | 1/2010 | Topacio | |
| 2010/0026447 A1 | 2/2010 | Keefe et al. | |
| 2010/0122762 A1 | 5/2010 | George | |
| 2010/0130016 A1 | 5/2010 | DeVilliers | |
| 2010/0148371 A1 | 6/2010 | Kaskoun et al. | |
| 2010/0171093 A1 | 7/2010 | Kabir | |
| 2011/0049675 A1 | 3/2011 | Nagai et al. | |
| 2011/0089561 A1 | 4/2011 | Kurita et al. | |
| 2011/0140271 A1 | 6/2011 | Daubenspeck et al. | |
| 2011/0189820 A1 | 8/2011 | Sasaki et al. | |
| 2011/0204505 A1 | 8/2011 | Pagaila et al. | |
| 2011/0237069 A1 | 9/2011 | Miyazaki | |
| 2011/0248396 A1 | 10/2011 | Liu et al. | |
| 2012/0032340 A1 | 2/2012 | Choi et al. | |
| 2012/0074585 A1 | 3/2012 | Koo et al. | |
| 2012/0217642 A1 | 8/2012 | Sun et al. | |
| 2012/0228011 A1 | 9/2012 | Chang et al. | |
| 2012/0231621 A1 | 9/2012 | Chang et al. | |

(56) References Cited

U.S. PATENT DOCUMENTS

| | | |
|---|---|---|
| 2012/0252189 A1 | 10/2012 | Sadaka et al. |
| 2012/0292602 A1 | 11/2012 | Guo et al. |
| 2013/0029848 A1 | 1/2013 | Gonzalez et al. |
| 2013/0093104 A1 | 4/2013 | Wu et al. |
| 2013/0099235 A1 | 4/2013 | Han |
| 2013/0147036 A1 | 6/2013 | Choi et al. |
| 2013/0153888 A1 | 6/2013 | Inoue et al. |
| 2013/0187265 A1 | 7/2013 | Shih et al. |
| 2013/0244417 A1 | 9/2013 | Markunas et al. |
| 2014/0001604 A1 | 1/2014 | Sadaka |
| 2014/0065771 A1 | 3/2014 | Gruber et al. |
| 2014/0113828 A1 | 4/2014 | Gilbert et al. |
| 2014/0246763 A1* | 9/2014 | Bunyk .................... H01L 27/18 257/663 |
| 2014/0264890 A1 | 9/2014 | Breuer et al. |
| 2015/0041977 A1 | 2/2015 | Daubenspeck et al. |
| 2015/0054151 A1 | 2/2015 | Choi et al. |
| 2015/0054167 A1 | 2/2015 | Pendse |
| 2015/0054175 A1 | 2/2015 | Meinhold et al. |
| 2015/0348874 A1 | 12/2015 | Tsai et al. |
| 2016/0364653 A1 | 12/2016 | Chow et al. |
| 2017/0125383 A1 | 5/2017 | Liu |

FOREIGN PATENT DOCUMENTS

| | | | |
|---|---|---|---|
| WO | WO 2016/073049 A1 | 5/2016 | |
| WO | WO 2016/118209 A2 | 7/2016 | |
| WO | WO 2016/118210 A2 | 7/2016 | |
| WO | WO 2017/015432 A1 | 1/2017 | |

OTHER PUBLICATIONS

International Preliminary Report dated Feb. 23, 2017 for PCT Application No. PCT/US2015/044679; 9 pages.
International Preliminary Report dated Feb. 23, 2017 for PCT Application No. PCT/US2015/044651; 10 pages.
Office Action dated Mar. 24, 2017 for U.S. Appl. No. 15/303,800, 39 pages.
PCT Search Report of the ISA for PCT/US2016/060296 dated Mar. 10, 2017; 5 pages.
PCT Written Opinion of the ISA for PCT/US2016/060296 dated Mar. 10, 2017; 5 pages.
PCT Search Report of the ISA for PCT/US2016/060309 dated Mar. 24, 2017; 6 pages.
PCT Written Opinion of the ISA for PCT/US2016/060309 dated Mar. 24, 2017; 10 pages.
Restriction Requirement dated Apr. 28, 2017 for U.S. Appl. No. 15/342,444; 9 pages.
Response to Restriction Requirement and Preliminary Amendment dated Apr. 28, 2017 for U.S. Appl. No. 15/342,444, filed May 19, 2017; 6 pages.
Restriction Requirement dated May 16, 2017 for U.S. Appl. No. 15/327,249; 6 pages.
PCT International Preliminary Report on Patentability dated May 18, 2017 for PCT Appl. No. PCT/US2015/059181; 11 pages.
PCT International Preliminary Report on Patentability dated May 18, 2017 for PCT Appl. No. PCT/US2015/059200; 11 pages.
Burns, et al.; "3D Circuit Integration Technology for Multiproject Fabrication;" MIT Lincoln Laboratory Presentation; Apr. 7, 2000; 15 pages.
Courtland; "Google Aims for Quantum Computing Supremacy;" Spectrum.IEEE.Org; North America; Jun. 2017; 2 pages.
International Search Report of the ISA for PCT Appl. No. PCT/US2016/060343 dated Jul. 18, 2017; 3 pages.
International Written Opinion of the ISA for PCT Appl. No. PCT/US2016/060343 dated Jul. 18, 2017; 12 pages.
Notice of Allowance for U.S. Appl. No. 15/327,235 dated Jun. 30, 2017; 17 pages.
Notice of Allowance for U.S. Appl. No. 14/694,540 dated Jul. 31, 2017; 9 pages.
Notice of Allowance for U.S. Appl. No. 15/312,063 dated Aug. 2, 2017; 17 pages.
Office Action dated Jul. 7, 2017 for U.S. Appl. No. 15/271,755; 26 pages.
Response to Office Action dated Mar. 3, 2017 for U.S. Appl. No. 14/694,540, filed Jun. 1, 2017; 24 pages.
Response to Office Action dated Mar. 24, 2017 for U.S. Appl. No. 15/303,800, filed Jun. 26, 2017; 22 pages.
Response to Restriction Requirement dated May 16, 2017 for U.S. Appl. No. 15/327,249, filed Jun. 27, 2017; 1 page.
Response to Restriction Requirement dated Jun. 8, 2017 for U.S. Appl. No. 15/271,755, filed Jun. 19, 2017; 1 page.
Office Action dated Aug. 11, 2017 for U.S. Appl. No. 15/342,444; 22 pages.
U.S. Appl. No. 15/684,269, filed Aug. 23, 2017, Das, et al.
U.S. Appl. No. 15/684,337, filed Aug. 23, 2017, Das, et al.
U.S. Appl. No. 15/684,393, filed Aug. 23, 2017, Das, et al.
Notice of Allowance dated Oct. 12, 2017 for U.S. Appl. No. 15/303,800; 16 pages.
Restriction Requirement for U.S. Appl. No. 15/271,755 dated Jun. 8, 2017; 6 pages.
Response to Jul. 7, 2017 Office Action for U.S. Appl. No. 15/271,755, filed Oct. 10, 2017; 33 pages.
Response to Aug. 11, 2017 Office Action for U.S. Appl. No. 15/342,444, filed Sep. 15, 2017; 20 pages.
Office Action dated Oct. 20, 2017 for U.S. Appl. No. 15/327,249; 30 pages.
Final Office Action dated Dec. 6, 2017 for U.S. Appl. No. 15/342,444; 18 pages.
Final Office Action dated Dec. 20, 2017 for U.S. Appl. No. 15/271,755; 25 pages.
Restriction Requirement dated Oct. 23, 2017 for U.S. Appl. No. 15/342,517; 6 pages.
U.S. Appl. No. 15/745,914, filed Jan. 18, 2018, Oliver, et al.
Office Action dated Jan. 11, 2018 for U.S. Appl. No. 15/327,239; 33 pages.
PCT International Preliminary Report on Patentability dated Feb. 1, 2018 for PCT Appl. No. PCT/US2016/043266; 11 pages.
Response to Final Office Action dated Dec. 6, 2017 for U.S. Appl. No. 15/342,444; Response filed Mar. 2, 2018; 16 pages.
Response to Restriction Requirement dated Oct. 23, 2017 for U.S. Appl. No. 15/342,517, filed Dec. 22, 2017; 1 pages.
Advisory Action dated Mar. 20, 2018 for U.S. Appl. No. 15/342,444; 3 pages.
U.S. Non-Final Office Action dated Mar. 21, 2018 for U.S. Appl. No. 15/342,589; 25 pages.
Ohya, et al.; "Room Temperature Deposition of Sputtered TiN Films for Superconducting Coplanar Waveguide Resonators;" IOP Publishing—Superconductor Science and Technology; vol. 27; Mar. 26, 2014; 10 pages.
Tarniowy, et al.; "The Effect of Thermal Treatment on the Structure, Optical and Electrical Properties of Amorphous Titanium Nitride Thin Films;" Thin Solid Films 311; 1997; 8 pages.
PCT Search Report of the ISA for PCT/US2016/052824 dated Feb. 3, 2017; 6 pages.
PCT Written Opinion of the ISA for PCT/US2016/052824 dated Feb. 3, 2017; 6 pages.
PCT Search Report of the ISA for PCT/US2016/043266 dated Dec. 5, 2016; 5 pages.
PCT Written Opinion of the ISA for PCT/US2016/043266 dated Dec. 5, 2016; 9 pages.
Office Action dated Mar. 3, 2017 for U.S. Appl. No. 14/694,540; dated 16 pages.
PCT International Search Report of the ISA for Appl. No. PCT/US2016/060263 dated Jan. 10, 2017; 3 pages.
PCT Written Opinion of the ISA for Appl. No. PCT/US2016/060263 dated Jan. 10, 2017; 6 pages.
U.S. Appl. No. 15/312,063, filed Nov. 17, 2016, Das, et al.
U.S. Appl. No. 15/342,589, filed Nov. 3, 2016, Oliver, et al.
U.S. Appl. No. 15/342,444, filed Nov. 3, 2016, Oliver, et al.
U.S. Appl. No. 15/342,517, filed Nov. 3, 2016, Oliver, et al.
U.S. Non-Final Office Action dated Apr. 19, 2018 for U.S. Appl. No. 15/342,517; 8 Pages.

(56) References Cited

OTHER PUBLICATIONS

Response to U.S. Non-Final Office Action dated Jan. 11, 2018 for U.S. Appl. No. 15/327,239; Response filed Apr. 9, 2018; 25 Pages.
Response to U.S. Non-Final Office Action dated Oct. 20, 2017 for U.S. Appl. No. 15/327,249; Response filed Apr. 19, 2018; 19 Pages.
Response to U.S. Final Office Action dated Dec. 20, 2017 for U.S. Appl. No. 15/271,755; Response filed Apr. 23, 2018; 23 Pages.
U.S. Final Office Action dated May 9, 2018 for U.S. Appl. No. 15/327,239; 25 Pages.
Response to U.S. Final Office Action dated Dec. 6, 2017 for U.S. Appl. No. 15/342,444; Response filed May 4, 2018; 18 Pages.
U.S. Non-Final Office Action dated May 11, 2018 for U.S. Appl. No. 15/684,393; 15 Pages.
PCT International Preliminary Report dated May 17, 2018 for International Application No. PCT/US2016/060296; 7 Pages.
PCT International Preliminary Report dated May 17, 2018 for International Application No. PCT/US2016/060343; 9 Pages.
PCT International Preliminary Report dated May 17, 2018 for International Application No. PCT/US2016/060263; 8 Pages.
PCT International Preliminary Report dated May 17, 2018 for International Application No. PCT/US2016/060309; 8 Pages.
Notice of Allowance dated Jul. 9, 2018 for U.S. Appl. No. 15/327,249; 15 Pages.
Notice of Allowance dated Jul. 18, 2018 for U.S. Appl. No. 15/342,444; 11 Pages.
Office Action dated Aug. 9, 2018 for U.S. Appl. No. 15/271,755; 29 Pages.
Response to Office Action dated Apr. 19, 2018 for U.S. Appl. No. 15/342,517, filed Jul. 17, 2018; 14 Pages.
U.S. Appl. No. 14/694,540, filed Apr. 23, 2015, Das, et al.
U.S. Appl. No. 15/271,755, filed Sep. 21, 2016, Das.
U.S. Appl. No. 15/303,800, filed Oct. 13, 2016, Das, et al.
PCT Search Report of the ISA for PCT Appl. No. PCT/US2015/059181 dated Sep. 7, 2016; 5 pages.
PCT Written Opinion of the ISA for PCT Appl. No. PCT/US2015/059181 dated Sep. 7, 2016; 12 pages.
PCT Search Report of the ISA for PCT Appl. No. PCT/US2015/059200 dated Jul. 21, 2016; 3 pages.
PCT Written Opinion of the ISA for PCT Appl. No. PCT/US2015/059200 dated Jul. 21, 2016; 13 pages.
PCT Search Report of the ISA for PCT Appl. No. PCT/US2015/044608 dated Dec. 31, 2015; 5 pages.
PCT Written Opinion of the ISA for PCT Appl. No. PCT/US2015/044608 dated Dec. 31, 2015; 7 pages.
PCT Search Report of the ISA for PCT Appl. No. PCT/US2015/044679 dated Apr. 13, 2016; 3 pages.
PCT Written Opinion of the ISA for PCT Appl. No. PCT/US2015/044679 dated Apr. 13, 2016; 7 pages.
PCT Search Report of the ISA for PCT Appl. No. PCT/US2015/044651 dated Nov. 4, 2015; 3 pages.
PCT Written Opinion of the ISA for PCT Appl. No. PCT/US2015/044651 dated Nov. 4, 2015; 12 pages.
Appeal Brief filed on Mar. 28, 2019 for U.S. Appl. No. 15/327,239; 41 pages.
Non-Final Office Action dated Nov. 8, 2018 for U.S. Appl. No. 15/327,239; 26 pages.
Notice of Allowance dated Oct. 3, 2018 for U.S. Appl. No. 15/342,517, 13 pages.
Notice of Allowance dated Nov. 8, 2018 for U.S. Appl. No. 15/684,393; 8 pages.
Restriction Requirement dated Oct. 11, 2018 for U.S. Appl. No. 15/684,337; 8 pages.
Response to Restriction Requirement dated Oct. 11, 2018 for U.S. Appl. No. 15/684,337, filed Nov. 9, 2018; 10 pages.
Response to Office Action dated Aug. 9, 2018 for U.S. Appl. No. 15/271,755, filed Sep. 28, 2018; 16 pages.
Office Action dated Jan. 8, 2019 for U.S. Appl. No. 15/684,269; 23 pages.
Amendment filed on Apr. 8, 2019 for U.S. Appl. No. 15/684,269; 17 pages.
Non-Final Office Action dated Feb. 1, 2019 for U.S. Appl. No. 15/684,337; 10 Pages.

* cited by examiner

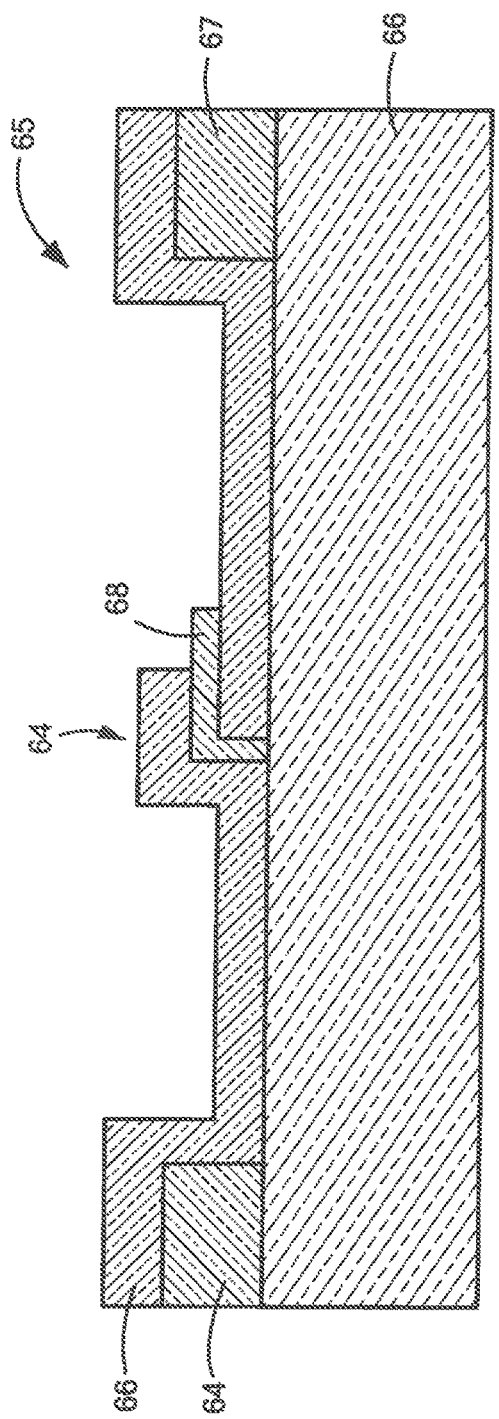
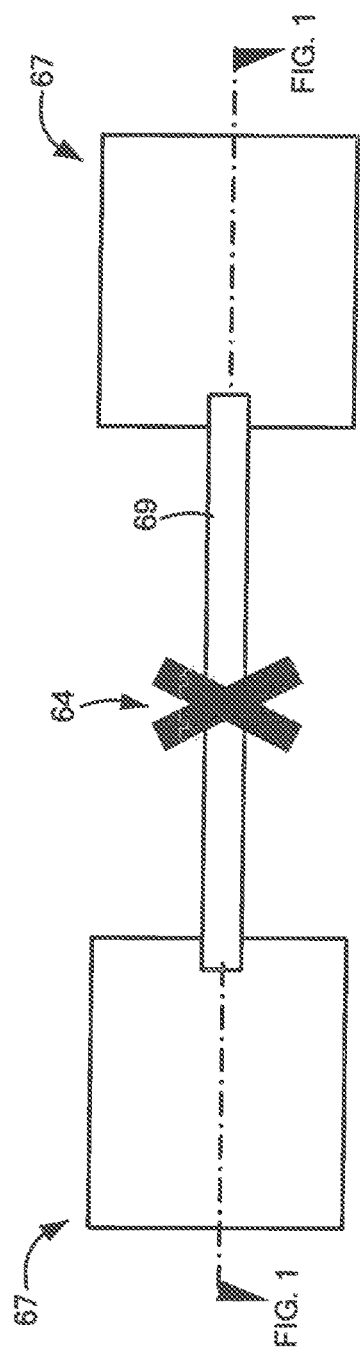
FIG. 1
FIG. 1A

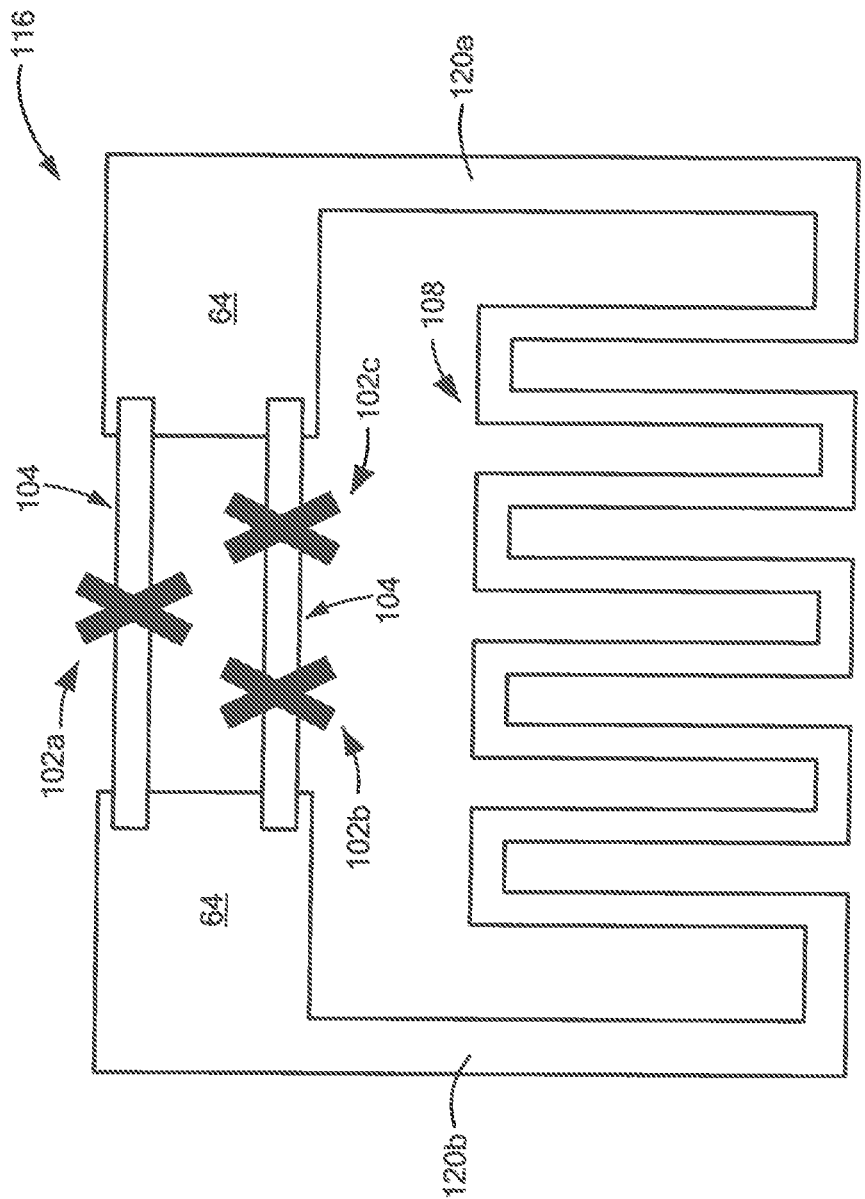

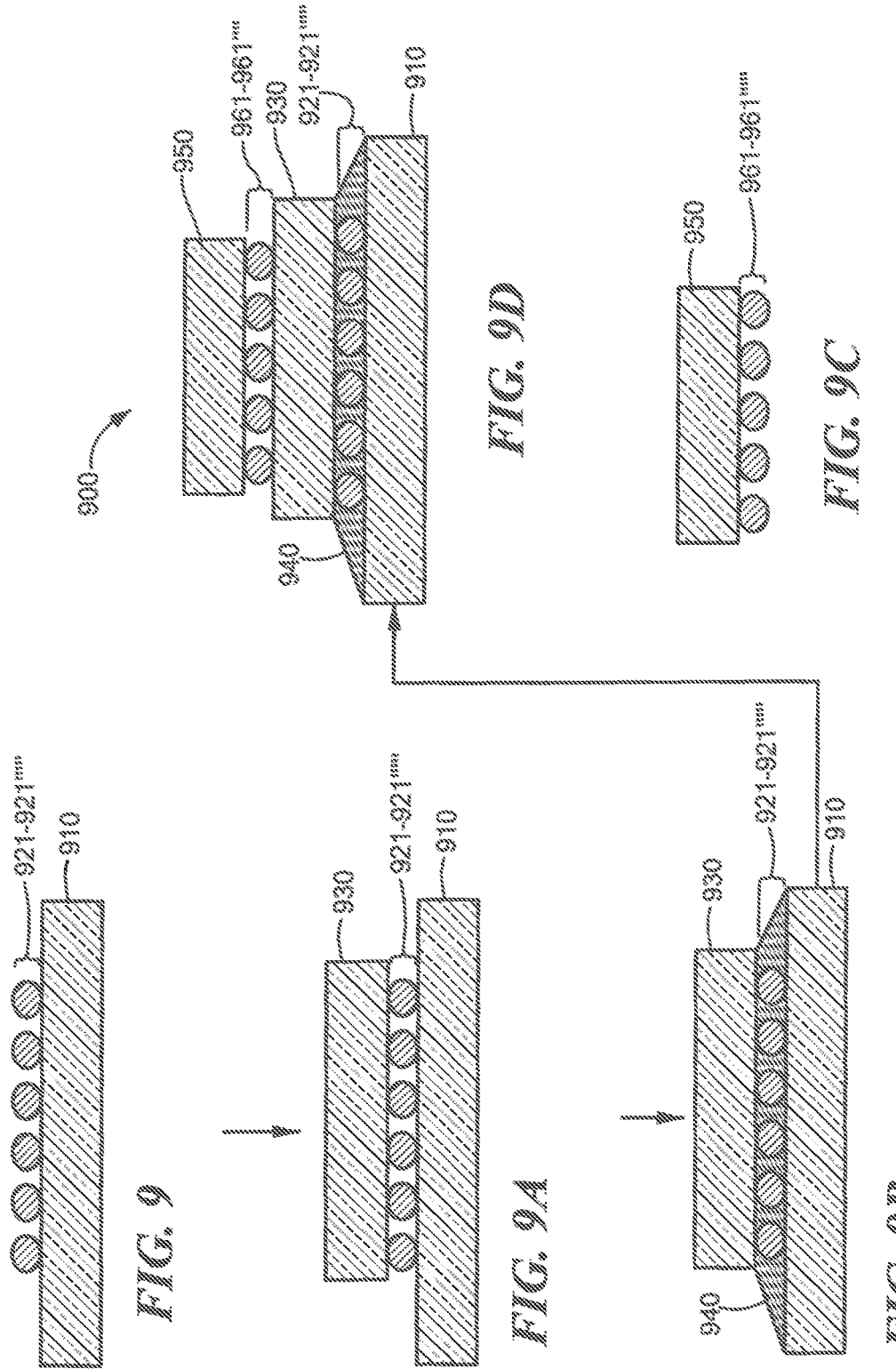

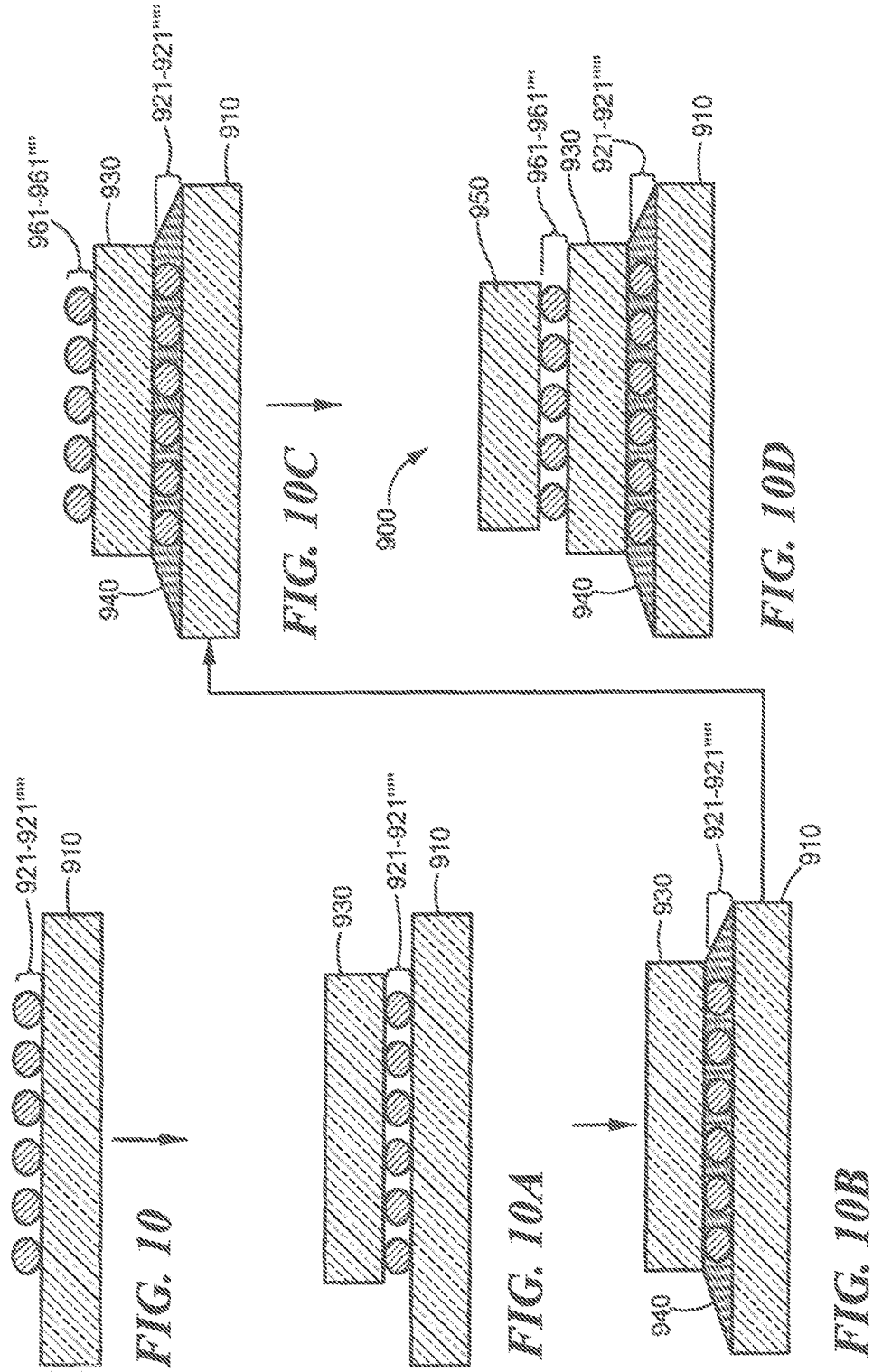

+

INTERCONNECT STRUCTURES FOR ASSEMBLY OF SEMICONDUCTOR STRUCTURES INCLUDING SUPERCONDUCTING INTEGRATED CIRCUITS

CROSS REFERENCE TO RELATED APPLICATION

This application claims the benefit of U.S. Provisional Application No. 62/251,248 filed Nov. 5, 2015 under 35 U.S.C. § 119(e) which application is hereby incorporated herein by reference in its entirety. Also, the subject matter of application Ser. Nos. 12/342,589, 15/342,444 and 15/342,517 all filed on even date herewith are hereby incorporated herein by reference in their entireties.

GOVERNMENT RIGHTS

This invention was made with Government support under Contract No. FA8721-05-C-0002 awarded by the U.S. Air Force. The Government has certain rights in the invention.

FIELD

This disclosure relates generally to interconnect structures, and more particularly, to interconnect structures for assembly of semiconductor structures including superconducting integrated circuits.

BACKGROUND

As is known, there is trend toward miniaturization of electronic products such as mobile phones, tablets, digital cameras, and the like. There is also a demand for development of electronic products which have an increased number of functionalities and have increased electronic capabilities (e.g., increased speed, memory, and operational life). These trends have resulted in a demand for integrated circuits which enable these and other increased capabilities (e.g., increased density, computing power and extended operational life).

In particular, the foregoing trends and demand drive a need for integrated circuits which utilize superconducting materials and properties (so-called "superconducting integrated circuits"). Superconductor materials have substantially no electrical resistance below a certain critical temperature, which may provide for increased performance in integrated circuit devices. The foregoing trends and demand also drive a need for interconnects (or interconnect structures) which enable assembly of semiconductor structures including superconducting integrated circuits.

As is also known, superconducting integrated circuits are a leading candidate technology for large-scale quantum computing. Long coherence times compared to logic gate times are necessary for building a fault tolerant quantum computer. In the case of superconducting quantum bits (qubits), coherence time improvements are attributable to a number of design changes for specific superconducting materials.

One indicator of the coherence time of a superconducting quantum integrated circuit is intrinsic quality factor $Q_i$. Although many studies have been done on qubits, a major technical challenge is the lack of existing high performance integration schemes, which meet the stringent requirements of qubit applications. Such requirements include: maintaining high intrinsic quality factor materials, keeping a substantially high qubit coherence time, reproducibility, and stability over a large temperature range—from room temperature to a few milliKelvin—in addition to the mandatory requirements of scalability.

SUMMARY

Described herein are concepts, systems, circuits and techniques related to semiconductor structures and interconnect structures for assembly of semiconductor structures including superconducting integrated circuits. The described interconnect structures and techniques allow for integration of superconducting integrated circuits with one or more non-superconducting semiconductor structures (e.g., substrates and multi-chip modules (MCMs).

In one aspect of the concepts described herein, semiconductor structures and interconnect structures are provided for attaching a plurality of superconducting qubit ICs and performing fast and nearly lossless operations between any arbitrary qubit ICs for possible quantum computer architecture.

In another aspect of the concepts described herein, an integration scheme to couple qubit ICs through an active and/or passive superconducting base (e.g. TSV, MCM) which distributes information among the superconducting qubit ICs is provided. The disclosure illustrates various implementations of such a superconducting base to couple multiple superconducting qubit ICs to demonstrate cryogenic integration approaches for possible quantum computing systems.

In another aspect of the concepts described herein, a three dimensional (3D) integration approach is disclosed. The 3D integration approach gives the ability to design computing circuitry to fit the cryogenic space, rather than adjusting the cryogenic space to fit computer circuitry.

In another aspect of the concepts described herein, a 3D design approach is provided to minimize the use of physical space, and increase functionality of semiconductor structures. The 3D design approach may, for example, be used to increase integration density of semiconductor structures, maximize superconducting paths and other considerations, while still having substantially all of the functional components to be considered a quantum computer.

In one aspect of the concepts described herein, a multi-layer semiconductor structure (includes combinations of metal, semiconductor, insulator, and superconductor layers) including an interconnect structure according to the disclosure includes a first semiconductor structure having first and second opposing surfaces and including one or more interconnect pads disposed on at least one of the first and second surfaces. The multi-layer semiconductor structure also includes a second semiconductor structure having first and second opposing surfaces and including one or more interconnect pads disposed on at least one of the first and second surfaces. At least one of the first and second semiconductor structures is a superconducting semiconductor structure.

The multi-layer semiconductor structure also includes one or more interconnect structures. Each of the interconnect structures is disposed between the first and second semiconductor structures and coupled to respective ones of the interconnect pads provided on the first and second semiconductor structures. Additionally, each of the interconnect structures including a plurality of interconnect sections, wherein at least one of the interconnect sections includes at least one superconducting and/or a partially superconducting material.

The multi-layer semiconductor structure may also include one or more of the following features individual or in combination with other features. Each of the interconnect sections may include one or more electrically conductive materials. Each of interconnect sections may have a different, respective melting point than other ones of the interconnect sections. Each of the interconnect structures may have first and second opposing portions and include a first interconnect section having first and second opposing portions. The first portion of the first interconnect section may correspond to the first portion of the interconnect structure.

Each of the interconnect structures may include a second interconnect section having first and second opposing portions. The first portion of the second interconnect section may be disposed over the second portion of the first interconnect section. Each of the interconnect structures may include a third interconnect section having first and second opposing portions. The first portion of the third interconnect section may be disposed over the second portion of the second interconnect section. The second portion of the third interconnect section may correspond to the second portion of the interconnect structure.

The first interconnect section may include a plurality of conductive layers. Each of the conductive layers may include a different, respective metal or alloy material or combination of materials. Each of the conductive layers may have a different, respective melting point. A first one of the conductive layers may include Titanium (Ti) and/or Lead (Pb). A second one of the conductive layers may include Platinum (Pt) and/or Tin (Sn). A third one of the conductive layers may include Gold (Au) and/or Indium (In). The third interconnect section may include a plurality of conductive layers. Each of the conductive layers may include a different, respective metal or alloy material or combination of materials.

The first interconnect section and the third interconnect section may both be provided as under bump metals (UBMs). The second interconnect section may be provided as a solder ball, sphere, pillar or micro-bump. The first semiconductor may have a first package pitch and the second semiconductor structure may have a second package pitch. One or more characteristics of the interconnect structures may be selected based upon at least one of the first package pitch and the second package pitch. The one or more characteristics may include dimensions of the interconnect structures and materials of the interconnect structures.

The interconnect structures may form a micro bump assembly on at least one of the first and second semiconductor structures. The first semiconductor structure may be a multi-chip module (MCM) or an interposer module. The second semiconductor structure may include a qubit. The second semiconductor structure may be a superconducting semiconductor structure and designed to operate in at least one of a radio frequency (RF) region and a microwave frequency region.

In one aspect of the concepts described herein, an interconnect structure for coupling two or more semiconductor structures together, with at least one of the semiconductor structures provided as a superconducting semiconductor structure, includes a first interconnect section having first and second opposing portions. The first portion of the first interconnect section corresponds to a first portion of the interconnect structure. The interconnect structure also includes a second interconnect section having first and second opposing portions. The first portion of the second interconnect section is disposed over the second portion of the first interconnect section. The interconnect structure additionally includes a third interconnect section having first and second opposing portions. The first portion of the third interconnect section is disposed over the second portion of the second interconnect section. Additionally, at least one of the first, second and third interconnect sections includes a superconducting and/or a partially superconducting material.

The interconnect structure may also include one or more of the following features individual or in combination with other features. The first interconnect section may include a plurality of conductive layers. Each of the conductive layers may include a different, respective metal or alloy material or combination of materials. Each of the conductive layers may have a different, respective melting point. The third interconnect section may include a plurality of conductive layers. Each of the conductive layers may include a different, respective metal or alloy material or combination of materials. The first interconnect section and the third interconnect section may both be provided as under bump metals (UBMs).

In another aspect of the disclosure, a method of fabricating a cryogenic package includes: providing at least one superconducting integrated circuit having first and second opposing surfaces. Each of the first and second surfaces of the superconducting integrated circuit has a first circuit including a plurality of electrical conductors disposed thereon. The superconducting integrated circuit also includes one or more superconducting micro bumps disposed on at least one UBM pad (e.g., an interconnect pad) which is disposed or otherwise provided on the first and second surfaces of the superconducting integrated circuit.

The method also includes: providing a superconducting module and/or a metal module (e.g., a conventional metal module) having first and second opposing surfaces. Each of the first and second surfaces of the superconducting module and/or the metal module has a second circuit including a plurality of electrical conductors disposed thereon. The superconducting module and/or the metal module also includes one or more superconducting micro bumps disposed on at least one UBM pad (e.g., an interconnect pad) which is disposed or otherwise provided on the first and second surfaces of the superconducting module and/or the metal module.

The method additionally includes: providing an interposer disposed substantially between the superconducting integrated circuit and the superconducting module and/or the metal module. The interposer includes one or more UBM pads disposed on first and second opposing surfaces of the interposer, which surfaces are disposed substantially between the superconducting integrated circuit and the superconducting module and/or the metal module.

The superconducting module has interconnect structures (e.g., micro bumps) disposed on the first surface of the superconducting module. The interconnect structures are bonded with the second surface of the interposer (e.g., during a first bonding process/cycle) to create an electrical and/or mechanical interconnect between the superconducting module and the interposer.

The superconducting integrated circuit also has interconnect structures (e.g., micro bumps) disposed on the second surface of the superconducting integrated circuit. The interconnect structures are bonded with the first surface of the interposer (e.g., during a second bonding process/cycle) to create an electrical and/or mechanical interconnect between the superconducting integrated circuit and the interposer.

The method may also include one or more of the following features individual or in combination with other features. At least a first reflow process and or underfill curing process after a first bonding process/cycles and before a second bonding process/cycle. At least a second reflow process and/or overmold process after the second bonding process/cycle. A lower temperature second reflow process than first reflow process. A process of removing a temporary mount from a first surface of the interposer after underfill curing, the process occurring before the second bonding process/cycle.

The method may include: a process of pre-applying a dry underfill material on the first surface of the superconducting module mount. The process may occur before the first bonding process/cycle. The cryogenic package fabricated using the method may include: at least one interconnect structure (e.g., microbump) having a diameter of about 15 micron or less which is less than about 20 microns tall (with "tall" referring to a distance between first and second opposing portions of the interconnect structure). The at least one interconnect structure may become less than about 8 micron tall after first and/or second bonding process/cycles. The cryogenic package fabricated using the method may include: at least one interconnect structure (e.g., a microbump) having a diameter which is greater than about 15 micron and less than about 35 micron. The at least one interconnect structure may be less than about 50 microns tall (with "tall" referring to a distance between first and second opposing portions of the interconnect structure). Additionally, the interconnect structure may become less than about 25 microns tall after first and/or second bonding processes/cycles.

The method may include: applying at least a dry and/or wet chemical treatments to the interconnect structure (e.g., micro bumps) before first and/or second bonding processes/cycles. The method may also include: a bonding process/cycle (e.g., a first and/or second bonding process/cycle) which has at least one the following characteristics or parameters: a temperature ranging from about room temperature to about 150 degree Celsius, 0.1 gram to 20 gram force per interconnect structure (e.g., a micro bump), at least 100 micro bumps per bonding process/cycle.

Coupling of the first surface of the superconducting module to the second surface of the interposer may include: deposition of single and/or multiple layers of an oxide material and etching a via through the oxide material to expose a UBM or pads (e.g., interconnect pads) which may be provided on the first surface of the superconducting module and the second surface of the interposer. The coupling may also include: depositing a micro bump material on the UBM or pads provided on the first surface of superconducting module and the second surface of the interposer. The coupling may additionally include: planarizing and chemical treating the second surface of the interposer. The coupling may further include: planarizing and chemical treating the first surface of superconducting module. The coupling may further include: coupling the second surface of the interposer to the first surface of the superconducting module to form one or more electrical connections between the first and second ones of the at least two structures (e.g., the interposer and superconducting integrated circuit) of the cryogenic package fabricated using the method.

In a further aspect of the disclosure, a method of fabricating a cryogenic package includes: providing at least one superconducting integrated circuit having first and second opposing surfaces. Each of the first and second surfaces of the superconducting integrated circuit has a first circuit including a plurality of electrical conductors disposed thereon. The superconducting integrated circuit also includes one or more UBM pads disposed on at least one of the first and second surfaces of the superconducting integrated circuit.

The method also includes: providing a superconducting module and/or a metal module (e.g., a conventional metal module) having first and second opposing surfaces. Each of the first and second surfaces of the superconducting module and/or the metal module has a second circuit including a plurality of electrical conductors disposed thereon. The superconducting module and/or the metal module also includes one or more superconducting interconnect structures (e.g., micro bumps) disposed on at least UBM pads which is disposed on at least one of the first and second surfaces of the superconducting module and/or the metal module.

The method additionally includes an interposer disposed substantially between the superconducting integrated circuit and the superconducting module and/or the metal module. The interposer includes one or more UBM pads disposed on the first and second surfaces. The interposer further includes one or more interconnect structures (e.g., micro bumps) disposed on the UBM pads.

The interposer has interconnect structures (e.g., micro bumps) provided on the first surface of the interposer which are bonded (e.g., during a first bonding process/cycle) with the second surface of the superconducting integrated circuit. Such creates an electrical and/or mechanical interconnect between the superconducting integrated circuit and the interposer.

The superconducting module has interconnect structures (e.g., micro bumps) provided on the first surface of the superconducting module which are bonded (e.g., during a second bonding process/cycle) with the second surface of interposer. Such creates an electrical and/or mechanical interconnect between the superconducting module and the interposer.

The method may also include one or more of the following features individual or in combination with other features. The cryogenic package fabricated using the method may include: at least one interconnect structure (e.g., micro bum) having a diameter which is about 15 micron or less and is less than about 20 microns tall (with "tall" referring to a distance between first and second opposing portions of the interconnect structure). The interconnect structure may become less than about 8 micron tall after first and/or second bonding processes/cycles.

The cryogenic package fabricated using the method may include: at least one interconnect structure (e.g., a micro bump) having a diameter which is more than about 15 micron and less than about 35 micron. The interconnect structure may be less than about 50 microns tall (with "tall" referring to a distance between first and second opposing portions of the interconnect structure). The interconnect structure may become less than 25 microns tall after first and/or second bonding processes/cycles.

The method may include: applying at least a dry and or wet chemical treatments to the interconnect structures (e.g., micro bumps) before first and/or second bonding processes/cycles. The method may also include: a bonding process/cycle (e.g., a first and/or second bonding process/cycle) which has at least one the following characteristics or parameters: a temperature ranging from about room temperature to about 150 degree Celsius, 0.1 gram to 20 gram force per interconnect structure (e.g., a micro bump), at least 100 micro bumps per bonding process/cycle.

BRIEF DESCRIPTION OF THE DRAWINGS

Features and advantages of the concepts, systems, circuits and techniques disclosed herein will be apparent from the following description of the embodiments taken in conjunction with the accompanying drawings in which:

FIG. 1 is a cross-sectional view of an aluminum junction;

FIG. 1A is a plan view of a Josephson junction disposed between a pair of high Q materials formed in a substrate;

FIG. 4D is a plan view of a building block of a passive or active superconducting circuit having an inductor having a plurality of Josephson junctions;

FIGS. 9-9D are block diagrams of example semiconductor structures as may be provided in an example method for fabricating a multi-layer semiconductor structure in accordance with an embodiment;

FIGS. 10-10D are block diagrams of example semiconductor structures as may be provided in an example method for fabricating a multi-layer semiconductor structure in accordance with another embodiment;

DETAILED DESCRIPTION

Figure 2:
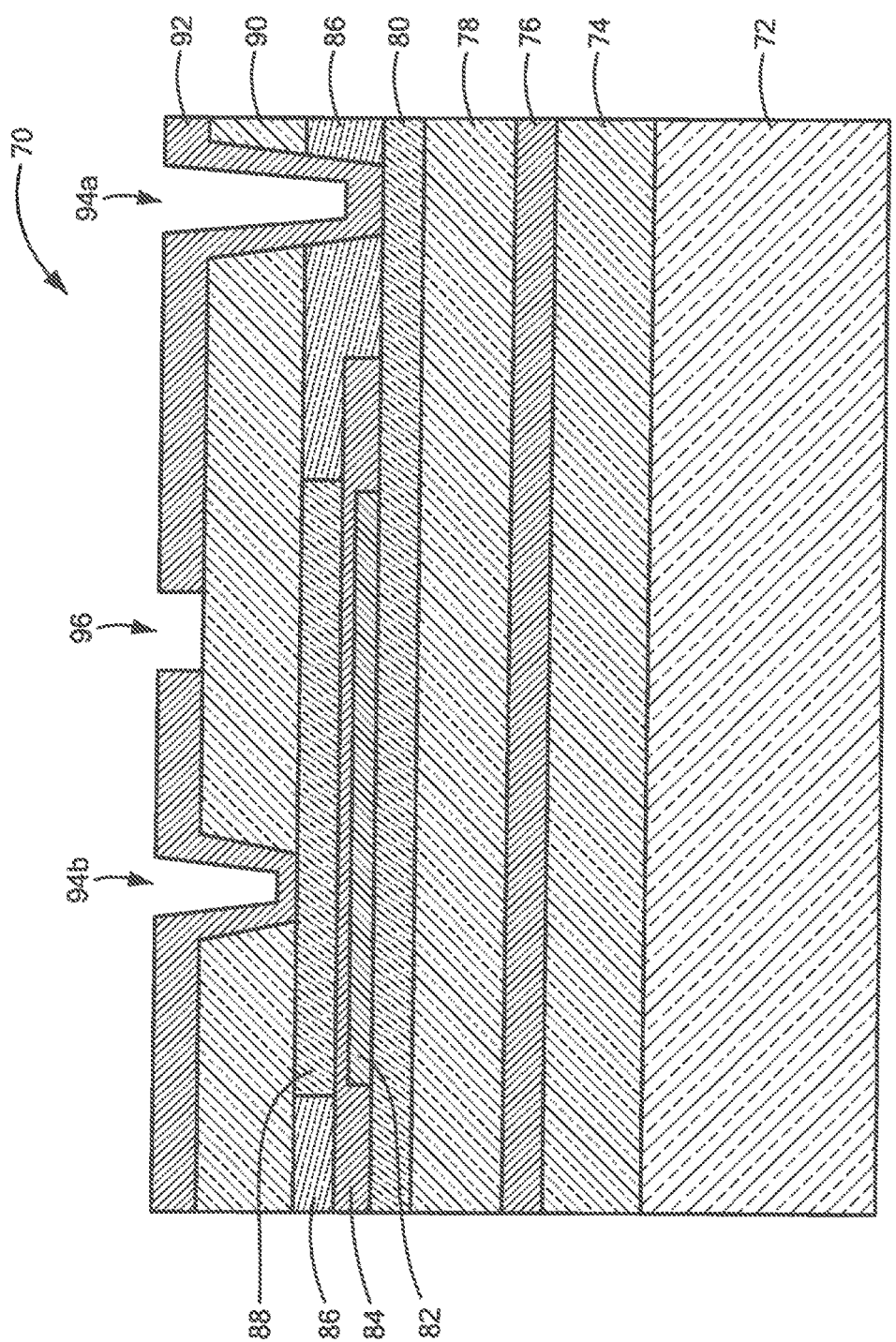
FIG. 2 is a cross-sectional view of a capacitor and a shunted nobium junction.

The features and other details of the concepts, systems, and techniques sought to be protected herein will now be more particularly described. It will be understood that any specific embodiments described herein are shown by way of illustration and not as limitations of the disclosure and the concepts described herein. Features of the subject matter described herein can be employed in various embodiments without departing from the scope of the concepts sought to be protected. Embodiments of the present disclosure and associated advantages may be best understood by referring to the drawings, where like numerals are used for like and corresponding parts throughout the various views. It should, of course, be appreciated that elements shown in the figures are not necessarily drawn to scale. For example, the dimensions of some elements may be exaggerated relative to other elements for clarity.

Definitions

For convenience, certain introductory concepts and terms used in the specification are collected here.

As used herein, a "high Q metal" or "high Q material" (or so-called high Q metals or "high Q materials") refers to materials in the 20-400 nm film form capable of producing a high quality factor and are defined as materials in a resonator and/or a superconducting resonator which produce a quality factor in the range of about a few thousands to several millions in the low power and/or single photon region. Illustrative materials include, but are not limited to: niobium (Nb), niobium nitride (NbN), titanium-niobium-nitride (TiNbN), titanium nitride (TiN), aluminum (Al), and rhenium (Re), diamond, graphine etc.

The phrase "quality factor" can be used to describe how long stored energy remains in a resonator. It should be appreciated that there is a difference between a total quality factor and an internal quality factor Qi. Internal quality factor Qi is an intrinsic characteristic of a resonator. A total or loaded quality factor QL, on the other hand, also depends upon other properties, including, but not limited to, coupling to an environment (i.e. an environment external to the resonator) and a feedline. A coupling quality factor (Qc) describes how strong (or closely) the resonator is coupled to the feedline.

As used herein, the term "resonator" refers to a device or system that exhibits resonance at some frequencies. A resonator may be described by two characteristics: (1) a resonance frequency; and (2) a quality factor. Superconducting resonators play a significant role in qubit design, interqubit coupling, quantum information storage, and quantum-state dispersive readout because of their low signal-to-noise ratio and low power dissipation. In addition, as part of the concepts sought to be protected herein, it has been recognized that because superconducting qubits may be fabricated using the same materials and processes as resonators described herein, the study of the loss mechanisms limiting the qualify factor Q in these resonators may prove to be a useful and relatively simple tool for understanding the fabrication-dependent limits to qubit coherence times. Superconducting resonator is provided as any type of microwave resonator, including distributed—e.g., a coplanar waveguide (CPW) resonator, stripline resonator, microstrip resonator, coplanar strip resonator, puck resonator, and related structures,—and lumped element resonators comprising lumped capacitive and inductive elements coupled in parallel and/or in series, the capacitor formed by patterning a conductive layer deposited on a surface of a substrate A bit is the most basic unit of classical logic and can occupy one of two discrete states, 0 or 1. A quantum bit, or 'qubit,' on the other hand, can be an arbitrary superposition of the eigenstates |0> and |1>. A quantum computer is comprised of logic gates that operate on an ensemble of quantum bits.

Where n classical bits can only exist in one of the 2n possible states, a quantum processor with n qubits can be placed in a complex superposition state of any weighted combinations of all 2n permutations, containing an exponentially larger state space than a conventional processor.

"Superconducting qubits" are manifested as (e.g. an integrated circuit) electronic circuits comprising lithographically defined Josephson junctions, inductors, capacitors, transmission lines and interconnects. When cooled to dilution refrigerator temperatures, these circuits behave as quantum mechanical "artificial atoms," exhibiting quantized states of electronic charge, magnetic flux, or junction phase depending on the design parameters of the constituent circuit elements. The Josephson junction behaves as a non-linear dissipationless inductor.

Superconducting qubits are engineered to have discrete and harmonic spectra—an "artificial atom" fabricated using standard lithographic techniques.

"Superconducting artificial atoms" are electronic circuits comprising lithographically defined Josephson tunnel junctions, inductors (L), capacitors (C), and interconnects. Conceptually, they begin as linear LC resonant circuits (i.e., simple harmonic oscillators), which are then made anharmonic to varying degrees by adding a nonlinear inductive element, the Josephson junction (JJ). When cooled to dilution refrigerator temperatures (~20 millikelvin), these superconducting circuits behave as quantum mechanical oscillators (e.g., "artificial atoms") exhibiting quantized states of electronic charge, magnetic flux, or junction phase depending on the design parameters of the constituent circuit elements.

Three fundamental superconducting qubit modalities are: charge, flux, and phase. Each includes one or more Josephson junctions. The qubit comprises the two-lowest states and is addressed at a unique frequency, $f_{01}$. Qubit modalities represented include charge, quantronium, flux, capacitively shunted flux, 2D transmon, fluxonium, and 3D transmon qubits.

The term "superconducting qubit" generally refers to the ground and first-excited state of a superconducting artificial atom. Due to the anharmonicity imparted by the Josephson junction, the ground and first-excited states may be uniquely addressed at a frequency, $f_{01}$, without significantly perturbing the higher-excited states of the artificial atom. These two-lowest states thereby form an effective two-level system (i.e., a pseudo-"spin-½" system), and it is this degree of freedom that is used as the qubit, a quantum bit of information. Qubit participates in quantum annealing cycle and settle into one of two possible final states (0,1). Qubit used real valued constant (weight) which influences qubit's tendency to collapse into two possible final states. A "superconducting device," as defined herein, includes at least one of a superconducting trace, a superconducting interconnect, a partially superconducting interconnect, a Josephson junction, a superconducting qubit and a superconducting resonator during operation.

The term "coupler" as used herein refers to a physical device that allows one qubit to influence another qubit. An Inductor and/or a Josephson junction can be a part of coupler. A coupler may be characterized by a real valued constant (strength) that indicates controls or influence exerted by one qubit on another.

As quantum mechanical objects, superconducting qubits can be coherently controlled, placed into quantum superposition states, exhibit quantum interference effects, and become entangled with one another. The time scale over which a superconducting qubit maintains this type of quantum mechanical behavior, and thereby remains viable for quantum information applications, is generally called the "coherence time." The rate at which the qubit loses coherence is related to its interactions with the uncontrolled degrees of freedom in its environment.

The term "interposer" as used herein, refers to and includes any structure capable of electrically interconnecting and/or magnetically and/or inductively and/or capacitively coupling arrays of superconducting conductors on two opposing circuitized substrates using extremely small superconductive and or partially superconductive elements such as micro-bumps, solder paste or conductive paste, as well as by using conductive and or superconductive thru-holes. Such an interposer, as defined herein, includes at least one dielectric layer (and may include many) and at least two external superconductive circuit layers (and possibly one or more internal superconductive circuit layers), with the layers each possibly including selective and or a density array of contact locations. Examples of dielectric materials include such materials as high resistive silicon, silicon oxide coated Si, silicon nitride coated Si, selective silicon oxide coated Silicon, selective silicon nitride coated Silicon, selective or entire low loss organic (e.g., BCB) coated Silicon and combination.

Examples of conductive and or superconductive thru-holes as defined herein include materials as niobium (Nb), niobium nitride (NbN), titanium-niobium-nitride (TiNbN), titanium nitride (TiN), aluminum (Al), rhenium (Re), tungsten, silicide, diamond or any other possible superconducting metal and or superconducting nitride and combination. In one example, conductive and or superconductive thru-holes as defined herein include at least single and or multilayer Titanium nitride where part of the Titanium nitride can be used as Silicon and titanium etch barrier. It is further possible to use titanium nitride single and or multilayer materials with multiple composition and or concentration gradient where at least one composition and or concentration is superconducting during device operation.

A "substrate," as defined herein, is used to describe a chip carrier for flip-chip and or wirebonding and or 3D circuits. The substrate can be an active and or a passive integrated circuit based carrier. Additionally, the substrate can be an active and or passive TSV and or MCM and or single chip module based chip carrier. The chip carrier can be Si based, organic based, ceramic based, Sapphire based or a combination thereof.

The term "superconducting multi-chip module (SMCM)" as used herein includes at least one dielectric layer (and may include many) and at least one superconductive circuit layers (and possibly one or more internal superconductive circuit layers) deposited on the base substrate (e.g. Si or high resistive Si) using thin film technology. It is further possible to include one superconductive via and or superconducting pad wherein the superconducting pad containing under bump metals. Examples of dielectric materials include such materials as silicon (Si), high resistive silicon, silicon oxide as dielectric on Si, silicon nitride as dielectric on Si, selective silicon oxide on Silicon, selective silicon nitride on Silicon, selective or entire low loss organic (e.g., BCB) coated Silicon and combination.

Examples of superconductive circuits, vias and pads as defined herein include materials as niobium (Nb), niobium nitride (NbN), titanium-niobium-nitride (TiNbN), titanium nitride (TiN), aluminum (Al), rhenium (Re), or any other possible superconducting metal and or superconducting nitride and combination. A substrate may have a Josephson junction and or an embedded Josephson junction. It is further possible to use integrated and or embedded capacitors, inductors, resistors. Patterned NbN can act as inductor. Capacitor may be planer, parallel plate, interdigitate and combinations thereof. Examples of materials from which resistors may be provided include, but are not limited to:

platinum, molybdenum, molybdenum nitride and combinations thereof. The substrate can further have dielectric bridges, crossovers, air bridges and combinations. The term "superconducting multi-chip module (SMCM)" may be used when at least part of the circuits are superconducting during operation and used superconducting and or normal via between superconducting circuits for interconnects.

Superconducting multi-chip module (SMCM) can have normal UBM conductor for heterogeneous integration as well as to protect the superconducting pad. We defined "superconducting multi-chip module (SMCM)" when at least part of the circuit is normal conductor and part of superconducting during operation. Superconducting multi-chip module (SMCM) can have active element such as various size Josephson junctions and passive elements such as inductors, resistors, transformers, and transmission lines. In one example, Superconducting multi-chip module (SMCM) is a niobium-based integrated-circuit fabrication process appropriate for integrating superconducting chips. It is based on four Nb metal layers separated by PECVD silicon oxide dielectric. It utilizes I-line (365 nm) photolithography and planarization with chemical-mechanical polishing (CMP) for feature sizes down to 0.8 micron. There are four superconducting Nb layer and used Ti—Pt—Au as under bump metal layer.

Superconducting vias are created between metal layers. In a typical process, vias are etched into PECVD $SiO_2$ dielectric and filled with niobium metal of the subsequent superconducting layer. Superconducting multi-chip module (SMCM) may be used to assemble multiple superconducting and or normal chips. Similarly, superconducting single-chip module (SSCM) may be used to assemble a single superconducting or normal chip. The term "superconducting module" or "superconducting substrate" includes both superconducting multi-chip module (SMCM) and superconducting single-chip module (SSCM). We use the term "normal module" or "normal substrate" which includes both multi-chip module (MCM) and single-chip module (SCM). Both superconducting and normal module able to attach superconducting and or normal conducting chips.

We defined "cryogenic electronic packaging" as integration and packaging of electronic components for cryogenic (77° K and below) applications. It is possible cryogenic electronic package can be used for room temperature electronics as well. For example interface electronics which needs to interface between cryo and room temperature electronics able to operate at both temperature zone. It also possible that cryogenic electronic package can be used for specific temperature operation (e.g., 4-10° K, below 100° mK). For example superconducting niobium electronics generally operates below 8° K and below, whereas superconducting Aluminum electronics generally operates below 500° m K.

The term "under bump metal (UBM) "or" under bump metallization (UBM)" as used herein refers to structures which include materials which provide a low resistance electrical connection to the superconducting pad. A UBM may adhere well both to the underlying superconducting pad and to the surrounding superconducting circuits passivation layer, hermetically sealing the superconducting circuits from the environment. In some cases, a UBM may provide a strong barrier to prevent the diffusion of other bump metals into the superconducting circuits.

A top layer of a UBM must be readily wettable by the bump metals, for solder reflow. In one embodiment a UBM uses multiple different metal layers, such as an adhesion layer, a diffusion barrier layer, a solderable layer, and an oxidation barrier layer. It is further possible that the UBM layers are compatible metals which in combination have low internal mechanical stresses. Example of materials from which a UBM may be provided include, but are not limited to: 20 nm Ti-50 nm Pt-150 nm Au, 10 nm Ti-50 nm Au, 5 nm Ti-5 nm Pt-5 nm Au-1000 nm Indium, 5 nm Ti-5 nm Pt-5 nm Au-1000 nm Sn, 50 nm Pt-100 nm Au, 5 nm Ti-500 nm In, 20 nm Ti-1000 nm In, Ni—Au, Ni—Pd—Au, Pd—Au, Ti—TiN, Ti—TiN—Ti—Au, Ti—TiN—Ti—In, Ti—TiN—Ti—Sn, Ti—Sn—In etc.

The term "superconducting interconnect" or "partially superconducting interconnect" as used herein refers to structures including at least one superconducting bump and at least one UBM to create electrical and or mechanical connection between two superconducting circuits. We defined "superconducting interconnect" when superconducting bump and superconducting UBM create superconducting interconnect between two superconducting circuits during operation. We also defined "superconducting interconnect" when superconducting bump and normal UBM conductor create superconducting interconnect between two superconducting circuits during operation. Here, a normal UBM conductor becomes superconducting due to proximity effect.

Example compositions of superconducting interconnects include: (10-400) nm Al-(3-20) nm Ti-(5-40) nm Au-(1-5) μm In-(5-40) nm Au-(5-20) nm Ti-(10-400) nm Al. In such examples, Al is used as a superconducting pad and Ti—Au or Ti—Au-thin (1000 nm) Indium can act as a UBM. It is possible for Au thickness in the interconnect part to be consumed by Indium and rest of the Au will superconducting based on proximity.

Additional example compositions of superconducting interconnects include: (10-400) nm Al-(3-20) nm Ti-(1-5) μm In-(5-20) nm Ti-(10-400) nm Al, (10-400) nm Al (1-5) μm In-(10-400) nm Al, (10-400) nm Al-(3-20) nm Ti-(5-40) nm Au-(1-5)μm In-(1-5)μm Sn-(5-40) nm Au-(5-20) nm Ti-(10-400) nm Al, and (10-400) nm Nb-(3-20) nm Ti-(5-40) nm Au-(1-5)μm In-(5-40) nm Au-(5-20) nm Ti-(10-400) nm Nb.

Further example compositions of superconducting interconnects include: (10-400) nm Nb-(3-20) nm Ti-(1-5)μm In-(5-20) nm Ti-(10-400) nm Al, (10-400) nm Nb-(1-5)μm In-(10-400) nm Nb, (10-400) nm Al-(3-20) nm Ti-(5-40) nm Au-(1-5)μm In-(1-5)μm Sn-(5-40) nm Au-(5-20) nm Ti-(10-400) nm Al, and (10-400) nm Al-(3-20) nm Ti-(5-200) nm TiN-(1-5)μm In-(5-200) nm TiN-(5-20) nm Ti-(10-400) nm Al, (10-400) nm Al-(3-20) nm Ti-(5-200) nm TiN-(5-40) nm Au-(1-5)μm In-(5-40 nm) Au-(5-200) nm TiN-(5-20) nm Ti-(10-400) nm Al. Additional example compositions of superconducting interconnects include: (10-400) nm Nb-(3-20) nm Ti-(5-200) nm TiN-(1-5)μm In-(5-200) nm TiN-(5-20) nm Ti-(10-400) nm Nb, (10-400) nm Nb-(3-20) nm Ti-(5-200) nm TiN-(5-40) nm Au-(1-5)μm In-(5-40 nm) Au-(5-200) nm TiN-(5-20) nm Ti-(10-400) nm Al, and combinations thereof.

A "partially superconducting interconnect" is defined herein to mean when a superconducting bump and a conventional UBM conductor create a conductor interconnect between two superconducting circuits during operation. Here, conventional UBM conductors dominate interconnect conductance although part of the interconnect is superconducting due to superconducting bump. In one example superconducting interconnect use as Al-UBM-Indium-UBM-Al or Nb-UBM-In-UBM-Nb. Examples of initial interconnect composition prior to bonding with second superconducting substrate include, but are not limited to: Ti(5 nm)-Au(20 nm)-8 um In, Ti(5 nm)-Au(100 nm)-8 um In, Ti(5 nm)-Au(50 nm)-8 um In, Ti(5 nm)/Pt(20 nm)/Au(20 nm)+8 um In, Ti(5 nm)/Pt(20 nm)/Au(20 nm)+8 um In, Ti(5 nm)/Pt(50 nm)/Au(100 nm)+8 um In, Ti(5 nm)/Pt(50 nm)/Au(150 nm)+8 um In, 8 um Indium-1 um tin, 4.5 um Indium-4.5 um tin, 6 um Silver bump with 2 um In, 5 nm Ti-6 um Ag-5 nm Ti-50 nm Pt-100 nm Au-2 um In, Al—In, Pb—In, Pb—Ti—In, Pb—Sn—In, Pb—Sn—In—Au(10 nm). Nb—Pb—Sn—In, Nb—Pb—In, Nb—Ti(5 nm)-Pb(8 um)-In(2-5 um), 48Sn-52In etc. In one example, a total interconnect resistance for an Al based superconducting substrate may be calculated as: interface resistance of Al-UBM+ interface resistance of (UBM-In)+ interface resistance of (In-UBM)+ interface resistance of UBM-Al.

In this example, it is assumed that an Al pad is used for both superconducting integrated circuits and or modules for creating superconducting and or partially superconducting interconnects, assuming UBM resistance negligible in the range of nano ohm and Indium, aluminum superconducting during device operation. R(Al-UBM): contact resistance and R(UBM-In):interface resistance between bump and UBM. If Indium is used as a material from which to provide a UBM, then a Total Resistance (TR) may be computed as TR=2R (Al-UBM) assuming Indium to indium mixing much better and indium is superconducting. In this case, a contact resistance [R(Al-UBM)] will be superconducting due to proximity. So, keeping same materials as UBM as well as bump has many benefits other than adding multiple materials.

A Josephson junction is defined as two superconductors allowed interacting through a so-called "weak link," where the "weak link" may be provided from a thin insulating barrier, a normal metal, or a narrow superconducting constriction—respectively referred to as an S-I-S, S-N-S, or S-C-S junction. A supercurrent flows/tunnels through this weak link, even in the absence of a voltage. The critical current of the junction is related to the superconducting gap of the electrode materials as well as the type and thickness of the insulating barrier. It is often characterized by a critical current density Jc and the area A of the junction such that Ic=Jc×A.

Josephson tunnel junctions are formed by two superconducting electrodes separated by a very thin (~1 nm) insulating barrier. In this configuration, the collective superconducting order of one electrode (parameterized by a phase $\varphi_i$) coherently connects with that of the other electrode ($\varphi_2$) via the elastic tunneling of Cooper pairs through the barrier. The resulting supercurrent, I, and junction voltage, V, are related to the superconducting phase difference, $\varphi=\varphi_1-\varphi_2$, across the junction A circuit quantum electrodynamics (circuit QED) may be used to address and measure a superconducting qubit. Circuit QED, superconducting qubits coupled to the electric field in a planar transmission line resonator. For cavity QED an atom in the cavity interacts with the trapped photons, and a measurement of the photons leaking out of the cavity allows one to probe the state of the atom.

In Circuit QED, the cavity is replaced by a λ/2 transmission line resonator that interacts with the outside world via two capacitors, Cin and Cout. A superconducting qubit sits at a voltage anti-node in the resonator, where the capacitance between the qubit and the resonator sets the interaction strength. Measurements may determine a maximum number of photons leaking out of the resonator (RFout) when the impinging signal (RFin) is on or near resonance with the resonator-qubit system.

Superconducting quantum interference device (SQUID) may be provided from a superconducting loop interrupted by two Josephson junctions. The net critical current of the SQUID can be tuned by threading a magnetic flux through the loop. SQUID is a tunable Josephson junction, and this feature is used to make "tunable" superconducting qubits, i.e., qubits with a parameter related to the junction Ic that is tunable by the magnetic field that threads the SQUID loop.

As used here, the term "chemically activated surface" is used to describe a surface which is minimally etched and/or damaged. The hydrophilicity or hydrophobicity of the surface may be changed with appropriate plasma and/or chemical treatment by changing or modifying surface chemistry.

As used herein, the term "circuitized substrate" is used to describe a semiconductor structure including at least one dielectric layer, the at least one dielectric layer having at least one surface on which at least one circuit is disposed. Examples of dielectric materials suitable for the at least one dielectric layer include low temperature co-fired ceramic (LTCC), ceramic (alumina), fiberglass-reinforced or non-reinforced epoxy resins (sometimes referred to simply as FR4 material, meaning its Flame Retardant rating), polytetrafluoroethylene (Teflon), polyimides, polyamides, cyanate resins, photoimagable materials, and other like materials, or combinations thereof. Examples of electrically conductive materials suitable for the at least one circuit include copper and copper alloy. If the dielectric layer is provided from a photoimagable material, it is photoimaged or photopatterned, and developed to reveal the desired circuit pattern, including the desired opening(s) as defined herein, if required. The dielectric layer may be curtain coated or screen applied, or it may be supplied as a dry film or in other sheet form.

As used herein, the term "conductive fusible metal" is used to describe a metal including one or more of tin-lead, bismuth-tin, bismuth-tin-iron, tin, indium, tin-indium, indium-gold, tin-indium-gold, tin-silver, tin-gold, indium, tin-silver-zinc, tin-silver-zinc-copper, tin-bismuth-silver, tin-copper, tin-copper-silver, tin-indium-silver, tin-antimony, tin-zinc, tin-zinc-indium, copper-based solders, and alloys thereof. The metals may change forms (e.g., from a solid to a liquid) during a bonding or during post bonding annealing or reflow process.

As used herein, the term "conductive structure" is used to describe an interconnect structure for electrically coupling one or more interconnect pads, electrical connections, components, devices, modules, and semiconductor structures and devices. The conductive structure may include at least one of a micro via having a diameter which is between about one micrometer (μm) and about one-hundred fifty μm's and a sub-micron via having a diameter of less than about one μm.

As used herein, the term "via first" may be used to describe a micro via and/or a submicro via used to make at least one electrical connection between a first device layer and second device layer in a semiconductor structure including at least two device layers. Additionally, as described here, the term "via" first may also be used to describe a micro via and/or a submicro via passing through a dielectric material or layer (in some embodiments, only the dielectric material or layer) to make at least one electrical connection between a first device layer and a second device layer in a semiconductor structure including at least two device layers. For a via first process, the first device layer and the second device layer are completed separately. As one example, a partial via material is added on first and/or second opposing surfaces (i.e., top and/or bottom surfaces) of the first second device layers and subsequent bonding and/or post bonding process create a via first between the first and second device layers.

The via first may be filled with at least one metal or alloy having a high Coefficient of Thermal Expansion (CTE) to produce a rigid, robust, and conductive via first joint between the at least two device layers during the composite bonding process. High temperatures and/or high pressures may be applied and used to bond the two device layers and provide a three-dimensional (3D) interconnection (i.e., interconnect) among the device layers. The high CTE metal or alloy are expanded at relatively high temperatures and interdiffuse with each other to produce the 3D interconnect. Alternatively, the via first may be filled with a low temperature fusible metal which melts and interdiffuse during bonding or post bonding processes.

As used herein, the term "via last" is used to describe a micro via and/or a submicro via used to make at least one electrical connection between a first device layer and a second device layer in a semiconductor structure including at least two device layers. Fabrication of the first device layer is completed first, and the second device layer is deposited over the first device layer. The second device layer is completed with via last process. A pad layer which includes one or more interconnect pads may be added after via last process. In one embodiment, via last is filled. Additionally, in one embodiment, the via last can be unfilled or partially filled. Via last may pass through the device layers (e.g., second device layers) and, in some embodiments, one or more isolation layers or materials. A titanium (Ti) material having a thickness of about ten nanometers (nm) and, a metal organic chemical vapor deposition (MOCVD) Titanium Nitride (TiN) liner having a thickness of about five nm, and tungsten plugs may be used for via lasts. A MOCVD or chemical vapor deposition (CVD) $TiN_X$, with X less than or equal to 1, is preferred for better conformal coating.

As used herein, the term "through silicon via" (TSV) is used to describe a vertical interconnect which passes substantially through one or more of a silicon wafer, a silicon die, a silicon interposer, silicon active circuits, silicon passive circuits, or other silicon circuits, components or layers. TSVs can be fabricated by different methods and approaches. In Silicon (Si) via-first approaches, for example, TSVs are fabricated prior to fabrication of active devices (i.e. bipolar or MOSFET devices) to which the TSVs may be coupled. The approach includes patterning the TSVs, lining the TSVs with a high temperature dielectric (thermal oxide or chemical vapor deposition), filling the TSVs with doped polysilicon and using chemical mechanical polishing (CMP) techniques to remove excess polysilicon from one or more surfaces of the TSVs. Si via-first approaches allow for the use of high temperature processes to insulate and fill the TSVs.

In Si via-middle approaches, TSVs are fabricated after forming the active devices to which the TSVs may be coupled, but before back end of line (BEOL) stack fabrication. The approach includes patterning the TSVs after a contact process, lining the TSVs with a low temperature dielectric deposition, and then filling the TSVs with single/multiple barrier metals. Typically the TSVs are filled with Copper (Cu) and/or W. For TSVs filled with Cu, a Cu seed layer is disposed on top of a barrier layer and a subsequent Cu electroplating fills the TSVs. The TSVs are then planarized using CMP techniques. For W, chemical vapor depositing (CVD) processes are used to fill the TSVs, and CMP techniques are used to remove excess polysilicon from one or more surfaces of the TSV. W is preferred for filling high aspect ratio TSVs (e.g., TSVs with aspect ratio of height-to-width>10:1). In general, Cu is used to fill low aspect ratio TSVs (e.g., TSVs with aspect ratio <10:1). Si via-middle process are useful for fabricating TSVs with a small via pitch, TSVs having minimal blockage of wiring channels, and TSVs having a low via resistance, for example.

In front side Si via-last approaches, TSVs are fabricated at the end of the BEOL processing of the wafer. Si via-last approaches are similar to Si via middle approaches, but Si via-last approaches use low temperature dielectric depositions (<400 C) compared to higher temperature dielectric compositions (<600 C) in Si via middle approaches. Front side Si via-last approaches may be suitable for their coarse TSV feature size, which simplifies the process of integrating TSVs into semiconductor structures. The front side Si via-last approaches may also useful for wafer-to-wafer bonding. In such approaches, TSVs can be formed at the end of the wafer-to-wafer bonding process, connecting multiple layers in the multi-layer (e.g., three-dimensional (3D)) stack of wafers or semiconductor structures.

Front side Si via-last approaches may use TSV etch as well as the entire BEOL dielectric stack. Backside Si via-last approaches also use wafer to wafer (or semiconductor structure to semiconductor structure) stacking. The wafers can be bonded together using oxide bonding or polymer adhesive bonding, either front-to-front or front-to-back. The wafers can be thinned by etching and or polishing. Additionally, a TSV may be formed in the wafers by etching a via down to bond pads on a top wafer and a bottom wafer. The process includes patterning the TSVs after the contact process, lining the TSVs with a low temperature dielectric deposition, and then filling the TSVs with a single/multiple barrier metal (e.g., Cu and/or W). The TSVs are then planarized through a subsequent CMP process.

A number of inorganic and organic dielectric materials having a thickness in a range of about one hundred nanometers (nm) to about one thousand nm can be used to insulate the TSVs. TSV dielectrics may be required to have good step coverage (at least 50% through the depth of the trench), good thickness uniformity (<3% variation across the wafer), high deposition rate (>100 nm/min), low stress (<200 MPa), low leakage current (<1 nA/cm2), and high breakdown voltage (>5 MV/cm).

Plasma-enhanced chemical vapor deposition (PECVD) of SiO2 or SiN, or sub-atmospheric chemical vapor depositions (SACVD) of SiO2, are some examples of insulator deposition. The most commonly used conductors to fill TSVs are doped polysilicon (180 lohm-cm), tungsten (5.6 lohm-cm), or copper (1.7 lohm-cm). W deposited by CVD has a good fill of the TSV and can be integrated with the contacts to which the TSVs are to be coupled. A TiN liner is required to ensure that the WF6 precursor does not attack the Si substrate in the TSV. A disadvantage of W compared to Cu is that it has a high intrinsic stress (1400 MPa for W, 20 MPa for Cu). TSV can be superconducting during qubit operation. A superconducting TSV comprises a Titanium Nitride (TiN) and or poly Si and or Al and or high Q metal. TSV can be provided as a combination of titanium-titanium nitride-tungsten and/or titanium-titanium nitride-high Q materials-tungsten and or titanium-titanium nitride-high Q materials and or titanium-high Q materials-tungsten and or high Q materials-tungsten and or high Q materials, etc.

Reactive-ion-etching (RIE) may be used to create high aspect ratio TSVs and deep trench structures in the Si (i.e., for capacitors or for isolation) in which the TSVs are provided. In one embodiment, a TSV RIE Bosch process may be used to fabricate the TSVs, with process alternating between deposition and etching steps to fabricate deep vias. SF6 isotropic etching of Si may not be suitable for forming TSVs (which require a highly anisotropic etch). Fluorocarbon chemistry (e.g., C4F8) may be used for anisotropic etching achieved through the deposition of a chemically inert passivation on the sidewall of the TSVs.

Chemical mechanical polishing (CMP) may be used for planarization of metal filled vias (e.g., micro vias), for example. Additionally, a metal contact (i.e. pad) in an upper device layer (e.g., the second device layer) may be an annulus with an about a one point five micrometer (µm) opening that also functions as a self-aligned mask (e.g., hard mask) during the plasma etch of the oxide beneath it to reach a corresponding metal contact in a lower device layer (e.g., the first device layer). In order to fully dispose and electrically the via, the size of the metal contacts, and thus the pitch of the vertical interconnect, is made proportional to about twice the wafer-wafer misalignment of the wafers including the first and second device layers.

Referring now to FIGS. 1 and 1A in which like elements are provided having like reference numbers throughout the several views, a semiconductor structure 65 comprises a substrate 66 having a high Q metal 67 disposed over portions of a first surface thereof. Substrate 66 may be provided as a hydrogen and/or fluoride and/or nitride terminated substrate. Alternatively, substrate 66 may be provided having a native oxide layer. Substrate 66 may also be provided as a silicon ($S_i$) substrate having a high resistivity characteristic or as a high purity $S_i$ substrate or as an oxide coated silicon substrate. Substrate 66 may also be provided as a sapphire substrate. Preferred substrates are annealed, re-crystallized, and smooth (around 5 angstrom substrate roughness) so as to help to produce high quality film on the substrate surface. A layer of aluminum 66 is disposed over the first substrate surface and over the high Q metal portions 67. An aluminum junction 68 is formed using aluminum oxide (Al Ox; x=0.1-1.5).

Thus, the structure of FIGS. 1, 1A may be used as a building block or as a portion of a building block of a passive or active superconducting circuit. A Josephson junction 64 which may be the same as or similar to Josephson junctions 64a-64c described above in conjunction with FIG. 3C, is formed between the two regions of high Q material 67 (e.g. TiN) coupled by a superconducting trace 69. Prior to depositing superconducting trace 69, ion milling was used to clean exposed contact points on the 67 to ensure superconducting contact with the 69. It is further possible that the contact resistance between region 67 and superconducting trace 69 becomes superconducting during operation due to proximity. As will be described below in conjunction with FIGS. 4-4F variants of such a circuit structure may also be used.

Referring now to FIG. 2, a super conducting IC 70 comprises a substrate 72 having an oxide layer 74 formed or otherwise disposed thereover. A high Q metal layer 76 is disposed over the oxide layer. A second oxide layer 78 is disposed over the high-Q metal layer 76. A niobium layer 80 is disposed over the second oxide layer 78.

An aluminum layer 82 is disposed over niobium or portions of niobium layer 80 and an aluminum oxide layer (AlOx) 84 is formed or otherwise disposed over aluminum layer 82 and portions of niobium layer 80.

A second niobium layer 88 is disposed over the AlOx (x=0.1-1.5) layer 84 so as to form a nobium junction. An anodized niobium oxide layer (NbOx) 86 is disposed over a AlOx layer 84 and portions of the niobium layer 80 so as to protect the nobium junction. A third oxide layer 90 disposed over the $NbO_x$ layer 86 and second nobium layer 88. A conductor 92 is disposed using either an additive technique (e.g. sputtering) or a subtractive technique (e.g. etching) and one or more conductive vias 94a, 94b may be formed or otherwise provided in the structure 70.

Openings 96 may also be formed or otherwise provided in conductive layer 92 (e.g. via an etching technique or via a masking and lift off technique). Conductive via 94a is formed or otherwise provided to contact the first niobium layer 80 while conductive via 94b is formed or otherwise provided to contact the second niobium layer. In one example, at least one of conductive via (94a, 94b) and/or conductive pad (92) and/or superconducting trace (76) include at least titanium nitride and or other high Q material.

A stack comprising layers of Nb/Al-AlOx-Nb can be used as a Josephson junction. Such a junction stack can be grown immediately after removal of native oxide from a bottom niobium electrode of the stack. A clean junction interface is desirable for realizing a robust and repeatable high-critical current junction. For this reason, it is sometimes preferable to first mill the sample to ensure that the surface is clean of native oxide inside the junction via. Next, a thin layer of aluminum is grown (about 8 nm) at low power. A thin aluminum layer won't uniformly cover the niobium, while a thick aluminum layer runs the risk of shorting out the junction by covering the via-step. Next, oxygen is introduced into the chamber to form the tunnel barrier. Initially, the chamber is seeded with a 1 mTorr oxygen flow for two minutes. The gate valve is then closed, allowing the oxygen pressure to rise to the target value. The sample is held in the oxygen atmosphere for 10 minutes, after which the oxygen is pumped out. A 4-12 nm cap of aluminum is deposited, directly followed by 100-200 nm nm of niobium.

The junction oxidation is the most variable part of a superconducting low-inductance undulatory galvanometer (SLUG) fabrication process. The critical current of the junctions is set, at least in part, by the oxidation exposure, which is the product of the oxygen partial pressure and the time. The critical current density (JC, critical current per junction area) scales inversely with the square root of exposure. It is possible that Nb-junction (Nb/Al-AlOx-Nb) may be fabricated on a silicon substrate with a 500 nm layer of thermal $SiO_2$. In one example, Josephson junctions are defined using 193 and or 248 nm optical lithography (stepper, 5× reduction) and subtractive dry etching of the Nb/Al-AlOx/Nb trilayer where AlOx dielectric layer sandwiched between a bottom superconductor material layer (Nb/Al) and a top superconductor material layer (Nb). It is further possible to use a thermal hardening process on the Josephson junction trilayer to control diffusion of the dielectric layer into the bottom superconductor material layer and the top superconductor material layer, and etching openings in the Josephson junction trilayer to form one or more Josephson junction qubits.

In one embodiment, an AlOx dielectric layer may have etchant constituent predominately at the junction edge. Anodization of the lower Nb layer forms a thin NbOx protective layer around the junction. The inter-layer dielectric is a low-temperature PECVD silicon oxide deposit to embed the entire junction. The electrical connections between the lower and upper Nb wiring layers are formed using superconducting vias. Parallel-plate capacitors are formed implicitly where the upper and lower metallization layers overlap due to the intermediate PECVD and NbOx layers. An additional high-capacitance structure can be formed by creating a via from the upper metallization layer to the anodization layer. Electrical contact is made to the chip through titanium/platinum/gold bond pads. Anodizing Nb—Al—AlO$_x$ will result in Nb—NbO$_x$—AlO$_x$—NbO$_x$.

It is possible to have NbO$_x$ presence in AlO$_x$ (x=0.1-1.5) layer and similarly it is also possible to present AlO$_x$ in the NbO$_x$ layer. Addition of oxide on anodized Nb—Al—AlO$_x$ layer will produce NbO$_x$—AlO$_x$—NbO$_x$—SiO$_x$. It is also possible to present Nb$_y$Si$_{(1-y)}$O$_x$ between NbO$_x$ and SiO$_x$ layer. Anodized produce porous niobium oxide and addition of PECVD oxide creates intermixing at the niobium oxide and PECVD oxide interface.

In yet another aspect of the concepts described herein, a method is provided of forming Josephson junction qubits. The method comprises depositing a first superconductor material layer (Nb—Al) over a substrate, forming a dielectric layer over the first superconductor material layer (Nb—Al—AlO$_x$), and depositing a second superconductor material layer (Nb) over the dielectric layer. The first superconductor material layer, the dielectric layer and the second superconductor material layer form a Josephson junction trilayer. It is further possible to use Al layer instead of Nb. The method further comprises annealing the Josephson junction trilayer in an inert environment at a temperature between about 150° C. to about 400° C. for a time period between about 10 minute to about 120 minutes to control diffusion of the dielectric layer into the first superconductor material layer and the second superconductor material layer. It is possible to use multiple etching. First etching will etch top superconductor and stop at oxide layer. Second etching step will etch oxide and bottom superconducting layer and thus etching Josephson junction trilayer of entire substrate form one or more Josephson junction qubits.

It further possible that embedded Josephson junction qubits are arranged on a superconducting substrate and each qubits comprise a Josephson junction trilayer where a superconductor base layer of Josephson junction position on top of ground and large superconducting plane separated by thick (40 nm-400 nm) oxide dielectric. It is further possible to use one or more embedded Josephson junctions where a Josephson junction is substantially sandwiched between a bottom superconductor material layer and a top superconductor material layer and the Josephson junction is separated from top and bottom superconducting layer by oxide dielectric. In some embodiments, at least one superconducting layer comprises of consists of titanium nitride.

Figure 3:
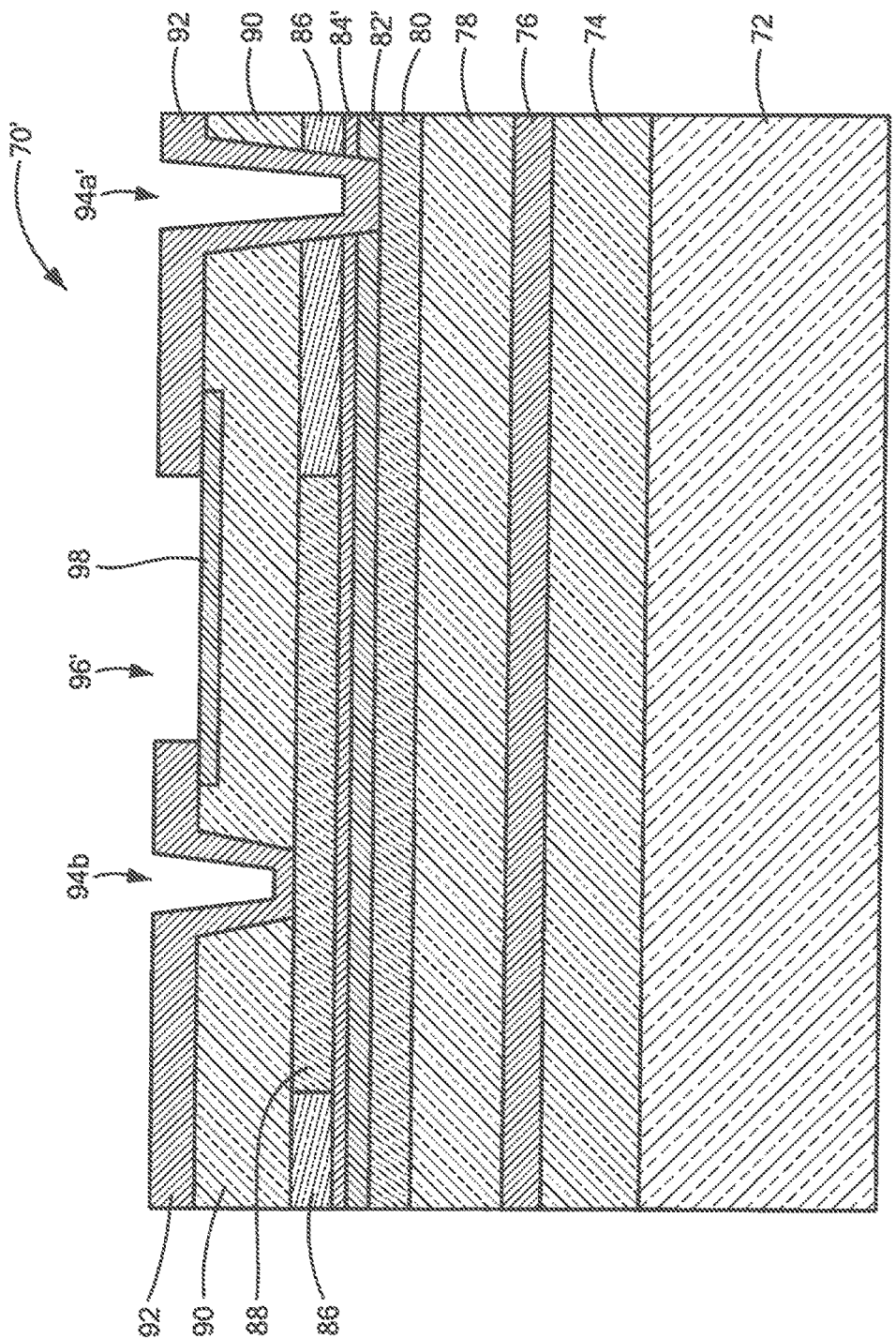
FIG. 3 is a cross-section view of a capacitor and a resistively shunted nobium junction.

Referring now to FIG. 3 in which like elements of FIG. 2 are provided having like reference designations, a superconducting IC 70' includes an aluminum layer 82' disposed over an entire portion of niobium layer 80 deposited on top of niobium layer 82 and an aluminum oxide layer 84' is disposed over an entire portion of aluminum layer 82'. The second niobium layer 88 are disposed over the AlOx layer 82' and selectively etched. Anodization of niobium layer 80 in presence of Al layer 80 and the AlOx layer 82' produce anodized niobium oxide layer 86. The PECVD oxide layer 90 is disposed over the NiOx and Nb layers 86, 88. In another example, anodization of niobium layer 80 and cross section of niobium layer 88 in presence of Al layer 80 and the AlOx layer 82' produce niobium oxide layer 86 which covers entire bottom niobium layer 80 and cross sectional area of top niobium layer 88.

In this illustrative embodiment, a conductive via 94a' is formed or otherwise provided through oxide layer 90, NbOx layer 86', AlOx layer 84', Al layer 82' and contacts Nb contacts AlOx layer 88 as in FIG. 2.

In open region 96' a resistor 98 is formed or otherwise provided between the two conductive vias 94a', 94b. The resistor can be embedded in the oxide and connected with pad 92 by a superconducting micro-via. The via and micro-via can be filled, partially filled with single and or multilayer superconducting materials. In one example, a Nb/Al-AlO$_x$/Nb tri-layer utilizes 248-nm and 193-nm photolithography and planarization with chemical-mechanical polishing (CMP) for wiring-layer feature sizes down to 200 nm and Josephson junction diameters down to 250 nm.

The process uses Nb superconducting layer, Pt or Mo based resistance layers and Nb and or TiN and or high Q metal based superconducting interconnects between all metal and resistor layers. Interconnects are etched and vias filled with the niobium metal and or titanium nitride and or high Q metal of the subsequent superconducting layer. The process uses superconducting circuits with a single and or multiple Josephson junction layer. Metal wiring layers are separated by dielectric, and vias are used to interconnect layers to form circuits. A separate resistive layer is deposited and patterned for shunt resistors. Chemical mechanical planarization (CMP) is employed at various steps in the process to maintain yield and uniformity. Superconducting integrated circuit requires under bump metal pad for flip chip bonding with SMCM. These pads are composed of 20 nm of Ti (adhesion layer), 50 nm of Pt (barrier layer) and 150 nm of Au.

It should be noted that like elements of FIGS. 2, 3 and 4-4F are provided having like reference numerals throughout the several views.

Figure 4:
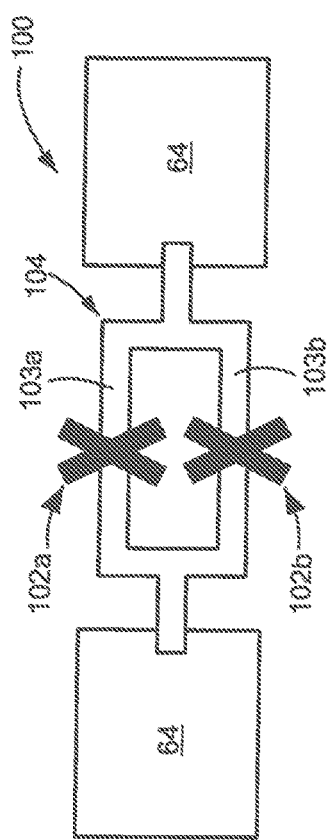
FIG. 4 is a plan view of a building block of a passive or active superconducting circuit.

Turning now to FIG. 4, a circuit 100 which corresponds to a building block or part of a building block of a passive or active superconducting circuit includes a pair of Josephson junctions 102a, 102b disposed in separate legs 103a, 103b of superconducting traces 104 coupled between two regions 64 of high Q material (e.g. TiN). In one example, Josephson junctions 102a, 102b and superconducting traces 104, 103a, 103b are patterned using single photolithography process. In another example, 64 made with titanium nitride and superconducting traces 104, 103a, 103b use sputtered and or evaporated and or MBE aluminum. It is further possible, all the superconducting traces 64, 104, 103a, 103b use sputtered and or evaporated and or MBE aluminum.

Figure 4A:
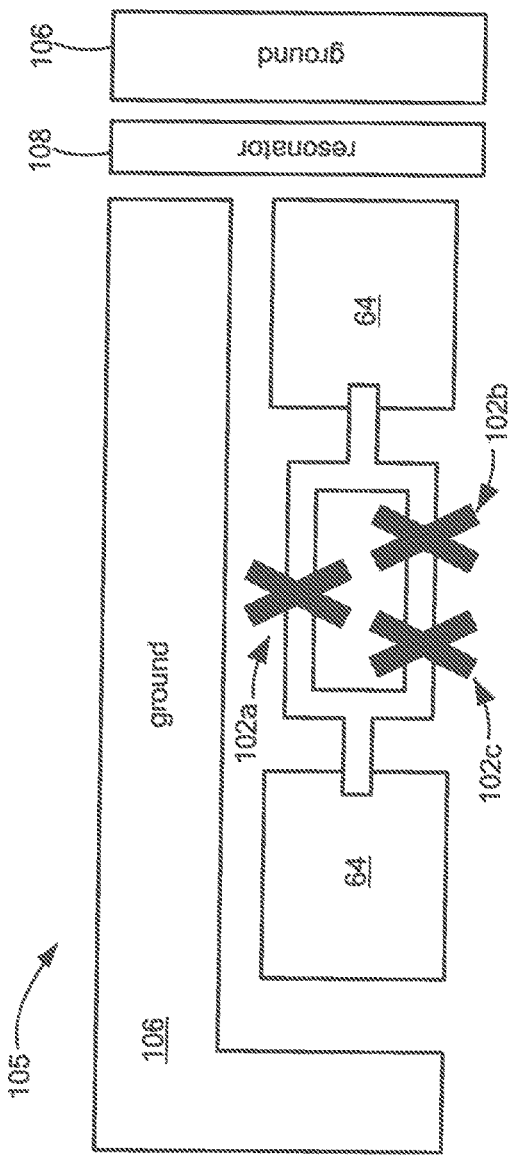
FIG. 4A is a plan view of a building block of a passive or active superconducting circuit having a resonator.

Referring now to FIG. 4A, a plurality of Josephson junctions 102b, 102c are disposed in a leg 103b which is provided by the superconducting traces 104. A ground plane 106 is disposed about the Josephson junctions 102a-102c and a resonator 108 is formed or otherwise provided at one end of the structure 105 proximate one of the high Q metal regions 64. In one example, resonator 108, ground plane 106 and capacitor 64 are patterned using single photolithography process. In another example, 64/106,108 are made with titanium nitride and superconducting traces 104, 103a, 103b use sputtered and or evaporated and or MBE aluminum. It is further possible, all the superconducting traces 64, 106, 108,104, 103a, 103b use sputtered and or evaporated and or MBE aluminum.

Figure 4B:
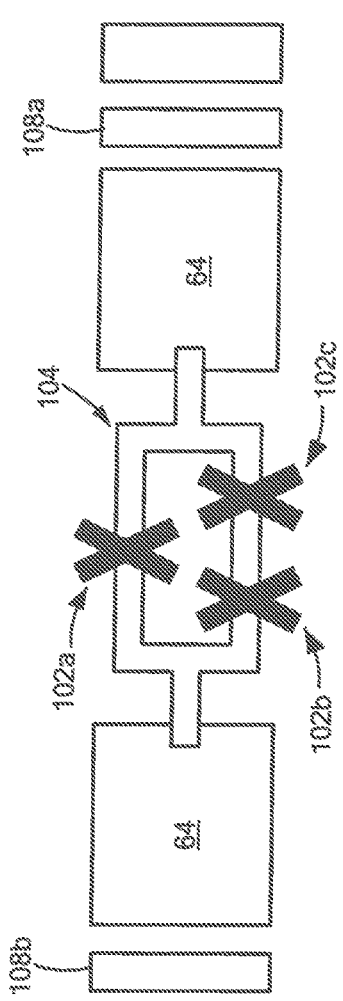
FIG. 4B is a plan view of a building block of a passive or active superconducting circuit having a resonator and a pair of ground planes.

Referring now to FIG. 4B, resonators 108a, 108b are formed or otherwise provided at each end of structure 105'.

Figure 4C:
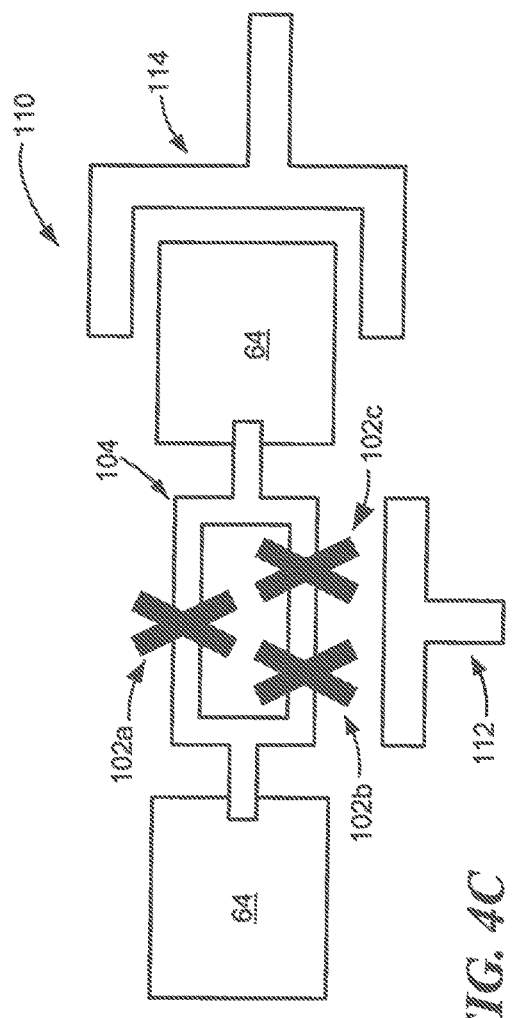
FIG. 4C is a plan view of a building block of a passive or active superconducting circuit having a pair of bias lines.

Referring now to FIG. 4C, a structure 110 corresponding to a building block or part of a building block of a passive or active superconducting circuit includes bias lines 112, 114. The bias lines 112, 114 may be provided as "on chip" or "off chip" bias lines. Using superconducting lines can reduce, and ideally eliminate, resistance and associated heat generation during circuit operation, thus improving qubit chip characteristics.

Referring now to FIG. 4D, a structure 116 which may, for example, correspond to a building block or part of a building block of a passive or active superconducting circuit includes an inductive element 108 coupled between respective ends of paths 120a, 120b formed or otherwise provided from a high Q metal (e.g. TiN). Paths 120a, 120b extend between high Q metal regions 64 and inductive element 118 to provide a superconducting circuit having an inductive characteristic. In one example, inductive element 108 can use separate superconducting material (e.g. Niobium nitride) and a separate photolithographic process may be used to pattern the inductive element.

Figure 4E:
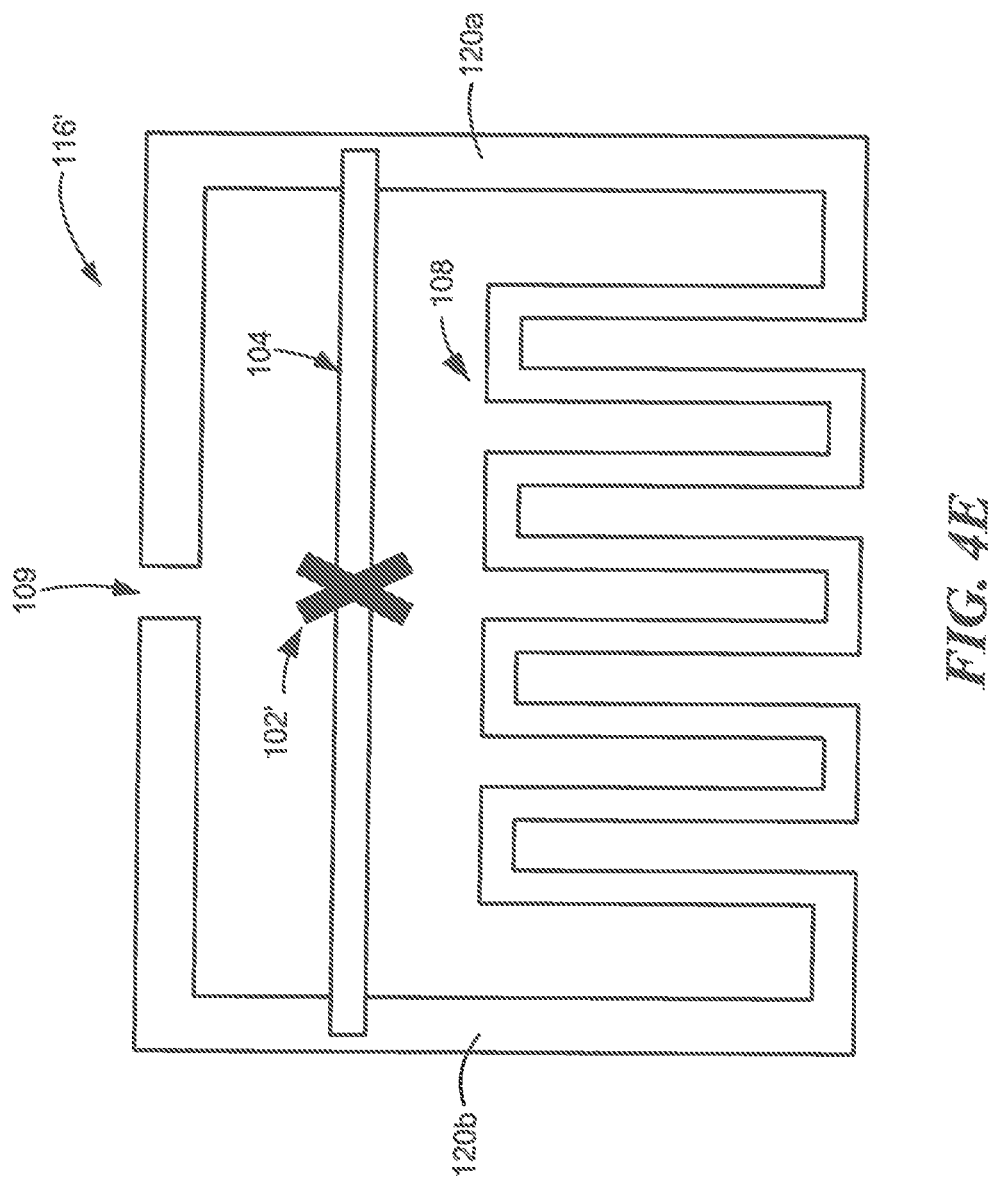
FIG. 4E is a plan view of a building block of a passive or active superconducting circuit having an inductor and a single Josephson junction.

Referring now to FIG. 4E a structure 116' which may, for example, correspond to a building block or a portion of a building block of a passive or active superconducting circuit includes an inductive element 108 and a capacitive element 109 each having first and second terminals coupled to respective ends of signal paths 120a, 120b. A single Josephson junction 102 is coupled between signal paths 120a, 120b provided from a high Q metal. Thus, a superconducting structure having capacitive and inductive characteristics is provided.

Figure 4F:
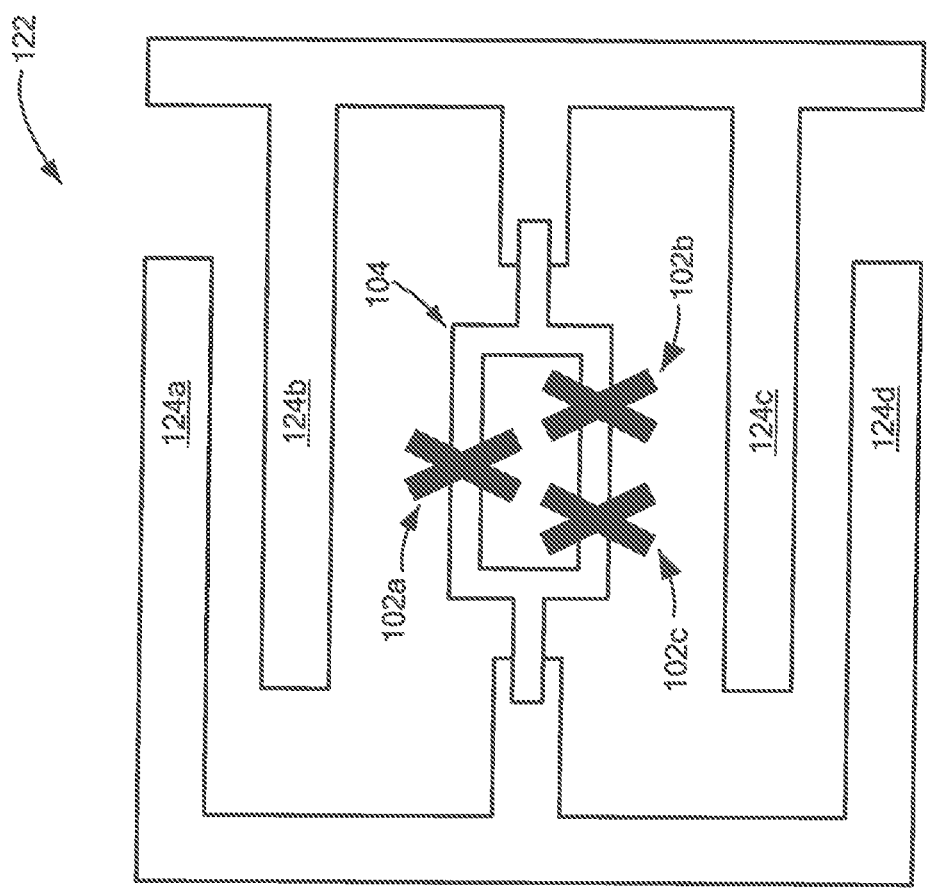
FIG. 4F is a plan view of a building block of a passive or active superconducting circuit having an inter digital capacitor.

Referring now to FIG. 4F, a structure 122 which may, for example, correspond to a building block of a passive or active superconducting circuit includes a plurality of inter digitated paths 124a-124d provided from a high Q metal material. First ones 124a, 124c of paths (or fingers) 124a-124d project from a first base structure 126 and second ones of paths 124b, 124d project from a second base structure 126b. The capacitance of the inter digital capacitor structure depends at least in part upon the finger base width, finger lengths, finger widths and number of fingers. FIG. 4-4F corresponds to various building blocks or parts of a building block of a passive or active superconducting circuit combination. In one example, at least portion of FIG. 4-4F describe part of circuit for superconducting qubit coupled to a parallel or series LC oscillator, JJ coupled to parallel or series LC oscillator, Capacitively coupled qubits, Qubit coupled to electromagnetic resonator, Superconducting qubit coupled to coplanar waveguide resonator where the resonator is capacitively coupled to RF transmission lines, qubit is coupled via a capacitance etc. In another example, at least portion of FIG. 4-4F describe part of circuit for the amplifier to perform high-fidelity qubit readout.

Referring now to FIGS. 5-12C, example semiconductor and or superconductor structures and interconnect structures for assembly of semiconductor structures including superconducting integrated circuits (ICs) are shown. The superconducting ICs (e.g., low loss superconducting ICs) may, for example, include one or more superconducting resonator and or qubit and or coupler devices (also sometimes individually or collectively referred to herein as "devices"). The superconducting resonator devices may be the same as or similar to superconducting resonator devices described above in conjunction with FIGS. 1-4F.

Figure 5:
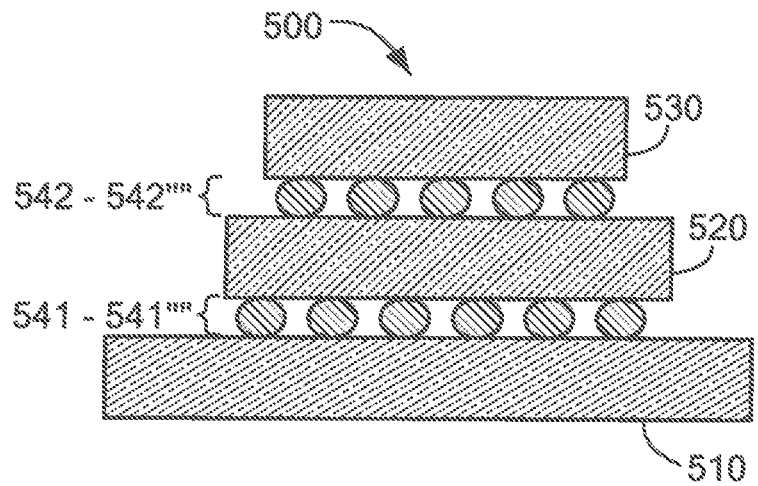
FIGS. 5-5A are block diagrams of example multi-layer semiconductor structures fabricated using interconnect structures according to the disclosure.

Referring to FIG. 5, an example multi-layer semiconductor structure 500 according to the disclosure includes a first semiconductor structure 510, a second semiconductor structure 520 and a third semiconductor structure 530. Each of the semiconductor structures (e.g., 510) has first and second opposing surfaces and may include a plurality of electrical connections extending between the first and second surfaces.

Semiconductor structure 500 is fabricated using chip-scale bonding techniques in which the semiconductor structures are individually coupled together. In particular, the second semiconductor structure 520 (e.g., a through silicon via (TSV) substrate) is electrically and mechanically coupled to the first semiconductor structure 510 though interconnect structures 541, 541', 541", 541"', 541"", 541""'. Interconnect structures 541, 541', 541", 541"', 541"", 541""' are disposed between the second surface of first semiconductor structure 510 and the first surface of second semiconductor structure 520. Additionally, interconnect structures 541, 541', 541", 541"', 541"", 541""' may electrically couple one or more electrical connections in first semiconductor structure 510 to one or more electrical connections in second semiconductor structure 520.

Third semiconductor structure 530 (e.g., a superconducting integrated circuit (IC)) is electrically and mechanically coupled to the second semiconductor structure 520 though interconnect structures 542, 542', 542", 542"', 542"". Interconnect structures 542, 542', 542", 542"', 542"" are disposed between the second surface of second semiconductor structure 520 and the first surface of third semiconductor structure 530. Additionally, interconnect structures 542, 542', 542", 542"', 542"" may electrically couple one or more electrical connections in second semiconductor structure 520 to one or more electrical connections in third semiconductor structure 530.

Interconnect structures 542, 542', 542", 542"', 542"", which are provided from one or more superconducting or partially superconducting materials, enable the assembly of a multi-layer semiconductor structure (here, 500) including at least one superconducting IC (here, 530).

In one embodiment, first semiconductor structure 510, second semiconductor structure 520 and third semiconductor structure 530 includes one or more of the structures, or part of the structures, described above in connection with FIGS. 4-4F. Additionally, in one embodiment, first semiconductor structure 510, second semiconductor structure 520 and third semiconductor structure 530 includes one or more of the Josephson junctions described above in connection with FIGS. 1-3.

Further, in one embodiment, at least one of first semiconductor structure 510, second semiconductor structure 520, third semiconductor structure 530 includes a qubit. In one illustrative embodiment, qubit loops and Josephson junctions of the qubit are formed using double-angle evaporation of aluminum through Dolan-style bridges. Free-standing bridges of the qubit are realized using a bilayer mask comprising a germanium hard mask on top of a sacrificial MMA/MAA layer [MicroChem methyl methacrylate (MMA (8.5)/MAA EL9)]. The qubit loops and junctions are patterned using electron-beam lithography (Vistec EBPG5200) and ZEP520A resist (ZEON-REX Electronic Chemicals). This pattern is transferred into a Germanium (Ge) layer using a CF4 plasma, and the underlying MMA/MAA resist is under-etched using an oxygen plasma to create free-standing bridges. Prior to the aluminum evaporation, ion milling is used to clean exposed contact points on the MBE aluminum and or titanium nitride to ensure superconducting contact with the evaporated aluminum.

In one embodiment, the qubit loops are formed on top of resonator surface. The qubit loops and junctions may be realized with two separate angle-evaporated aluminum layers (formed between the two aluminum evaporation steps). Additionally, static oxidation conditions may be used to prepare junctions having an appropriate critical current density. In one embodiment, the qubit loops are provided as relatively large Al—$AlO_x$—Al junctions having characteristics similar to that of a superconducting wire during device operation. It is further possible that at least part of the qubit loops can have a junction oxide sandwiched between Al metal layers. The oxide can be partially and or substantially fully separate the Al metal layers. It is possible to use Poly methyl methacrylate and or acrylate based resist and or Poly butene-1-sulphone based resist instead of ZEP. It is further possible to use an epoxy copolymer of glycidyl methacrylate and an ethyl acrylate based negative resist and or a three component (e.g., a base polymer, an acid generator, and a crosslinking agent) based negative resist instead of ZEP.

It is further possible that first semiconductor structure 510 and or second semiconductor structure 520 and or third semiconductor structure 530 includes a Nb-junction (Nb/Al-AlOx-Nb) which may be fabricated on a silicon substrate with a 500 nm layer of thermal $SiO_2$. In one example, Josephson junctions are defined using about 193 and or about 248 nm optical lithography (stepper, 5× reduction) and subtractive dry etching of the Nb/Al-AlOx/Nb trilayer where AlOx dielectric layer is sandwiched between a bottom superconductor material layer (Nb/Al) and a top superconductor material layer (Nb). It is further possible to use a thermal hardening process on the Josephson junction trilayer to control diffusion of the dielectric layer into the bottom superconductor material layer and the top superconductor material layer, and etching openings in the Josephson junction trilayer to form one or more Josephson junction qubits.

In one embodiment, an AlOx dielectric layer may have an etchant constituent predominately at the junction edge. Anodization of the lower Nb layer may form a thin NbOx protective layer around the junction. The inter-layer dielectric may be a low-temperature PECVD silicon oxide deposit to embed the entire junction. Additionally, the electrical connections between the lower and upper Nb wiring layers may be formed using superconducting vias. Parallel-plate capacitors may be formed implicitly where the upper and lower metallization layers overlap due to the intermediate PECVD and NbOx layers. An additional high-capacitance structure can be formed by creating a via from the upper metallization layer to the anodization layer.

Further, electrical contacts may be made to the chip (or IC or semiconductor structure) through titanium/platinum/gold bond pads. Anodizing Nb—Al—$AlO_x$ will result in Nb—$NbO_x$—$AlO_x$—$NbO_x$. It is possible to have $NbO_x$ presence in $AlO_x$ (x=0.1-1.5) layer and similarly it is also possible to present $AlO_x$ in the $NbO_x$ layer. Addition of oxide on anodized Nb—Al—$AlO_x$ layer will produce $NbO_x$—$AlO_x$—$NbO_x$—$SiO_x$. It is also possible to present $Nb_y Si_{(1-y)}O_x$ between $NbO_x$ and $SiO_x$ layer. The anodization process produces porous niobium oxide and the addition of a PECVD oxide creates intermixing at the niobium oxide and PECVD oxide interface.

It is further possible that first semiconductor structure 510 and or second semiconductor structure 520 and or third semiconductor structure 530 includes Superconducting resonators and or parts of Superconducting resonators.

In one embodiment, first semiconductor structure 510 is a Superconducting multi-chip module (SMCM) fabricated on an approximately 8-inch silicon wafer. The process used to fabricate the SMCM may be a niobium-based integrated-circuit fabrication process appropriate for integrating superconducting chips. In particular, in one embodiment, the process is based on four Niobium (Nb) metal layers of interconnects separated by PECVD silicon oxide dielectric. In such embodiment, the process utilizes I-line (365 nm) photolithography and planarization with chemical-mechanical polishing (CMP) for feature sizes down to about 0.8 micron. In another embodiment, the SMCM has four superconducting Nb metal layers and an under bump metal (UBM) layer including a Ti—Pt—Au material composition. Superconducting vias are created between metal layers. In a typical process, vias are etched into a PECVD $SiO_2$ dielectric and filled with an Nb metal of the subsequent superconducting layer. Indium bumps are evaporated substantially directly on top of the UBM using a liftoff process. The SMCM may include integrated and or embedded resistors and or capacitors and inductors. Additionally, the SMCM can further include at least one Josephson junction and or shunted Josephson junction.

Additional aspects of the concepts, systems, circuits and techniques sought to be protected herein, with particular emphasis on the interconnect structures (e.g., 542), are described in conjunction with the figures below.

Figure 5A:
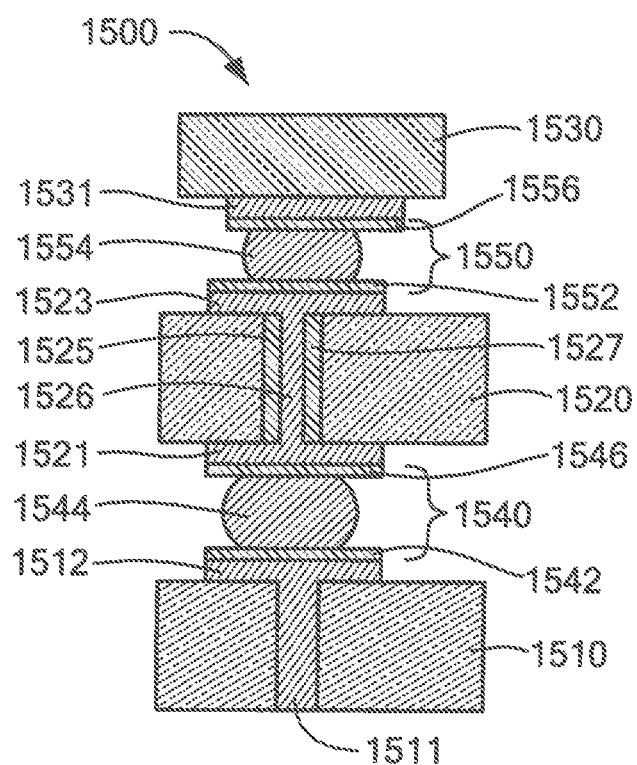

Referring to FIG. 5A, an example multi-layer semiconductor structure 1500 according to the disclosure includes a first semiconductor structure 1510, a second semiconductor structure 1520 and a third semiconductor structure 1530. Multi-layer semiconductor structure 1500 also includes a first interconnect structure 1540 (e.g., a superconducting or partially superconducting interconnect) for electrically and mechanically coupling the second semiconductor structure 1520 to the first semiconductor structure 1510. Multi-layer semiconductor structure 1500 additionally includes a second interconnect structure 1550 (e.g., a superconducting or partially superconducting interconnect) for electrically and mechanically coupling the third semiconductor structure 1530 to the second semiconductor structure 1520.

First semiconductor structure 1510 (e.g., a superconducting and or a conventional multi-chip module (MCM)) has first and second opposing surfaces and includes interconnect pad 1512 (e.g., a Niobium (Nb) pad) which also has first and second opposing surfaces. The first surface of interconnect pad 1512 is disposed over or beneath a select portion of the second surface of first semiconductor structure 1510. First semiconductor structure 1510 additionally includes a conducting and or superconducting through silicon via (TSV) structure 1511 which is disposed in a cavity formed between the first surface of interconnect pad 1512 and the first surface of first semiconductor structure 1510. TSV structure 1511 is electrically coupled to the first surface of interconnect pad 1512.

Second semiconductor structure 1520 (e.g., a TSV substrate) has first and second opposing surfaces and includes interconnect pads 1521, 1523 (e.g., Aluminum (Al) or Niobium (Nb) pads) which also have first and second opposing surfaces. The first surface of interconnect pad 1521 is disposed over or beneath a select portion of the first surface of second semiconductor structure 1520. Additionally, the first surface of interconnect pad 1523 is disposed over or beneath select portions of the second surface of second semiconductor structure 1520.

Second semiconductor structure 1520 also includes a first pad interconnect 1526 which extends from a first select portion of the first surface of interconnect pad 1521 to a first select portion of interconnect pad 1523, and second pad interconnect 1527 which extends from a second select portion of the first surface of interconnect pad 1521 to a second select portion of interconnect pad 1523. Second semiconductor structure 1520 additionally includes a conducting and or superconducting TSV structure 1525 which is disposed in a cavity formed between the first and second pad interconnects 1526, 1527. TSV structure 1525 is electrically coupled to the first surfaces of each of interconnect pads 1521, 1521.

In one example embodiment, the superconducting TSV structure 1525 is provided in second semiconductor structure 1520 (i.e., between first and second surfaces of the second semiconductor structure 1520) and is electrically coupled between semiconductor structures 1530, 1510 using superconducting and or conventional interconnects (e.g., 1550 and 1540). The superconducting TSV structure 1525 comprises a low stress Titanium Nitride (TiN) superconducting or non-superconducting layer. In one embodiment, the superconducting TSV layer may comprise single and/or multiple superconducting materials or multiple layers of single superconducting materials. It is further possible that at least one material and/or at least one composition of materials is superconducting. It is further possible that a non-superconducting layer may include conventional and superconducting materials. It is also possible that the superconducting layer may include a superconducting and/or a non-superconducting titanium nitride composition.

Additionally, the superconducting TSV layer can be provided as a combination of titanium-titanium nitride-tungsten and/or titanium-titanium nitride-high Q materials-tungsten and or titanium-titanium nitride-high Q materials and or titanium-high Q materials-tungsten and or high Q materials-tungsten and or high Q materials, etc. In another embodiment, the superconducting TSV layer may include single and/or multiple superconducting materials or multiple layers of high Q materials where materials exist as single individual material phase and or composition or react with each other create a new lattice and or modify lattice parameters.

Third semiconductor structure 1530 (e.g., a superconducting IC) has first and second opposing surfaces and includes interconnect pad 1531 which also has first and second opposing surfaces. The first surface of interconnect pad 1531 is disposed over or beneath a select portion of the first surface of third semiconductor structure 1530. Additionally, the first surface of interconnect pad 1531 may be electrically coupled to one or more electrical connections or components of the third semiconductor structure 1530.

In the illustrated embodiment, first semiconductor structure 1510 is coupled to second semiconductor structure 1520 via interconnect structure 1540. Additionally, second semiconductor structure 1520 is coupled to third semiconductor structure 1530 via interconnect structure 1550.

Interconnect structures 1540, 1550 each have first and second opposing surfaces and include a plurality of interconnect sections (here, three sections). Interconnect structures 1540, 1550 may also include one or more superconducting or partially superconducting materials. Example materials and material compositions include: (40-400) nm Al-(5-20) nm Ti-(10-50) nm Pt-(40-200) nm Au-(1-5)μm In-(40-400) nm Au-(10-50) nm Pt-(5-20) nm Ti-(40-400) nm Al, (40-400) nm Al-(5-20) nm Ti-(10-50) nm Pt-(40-200) nm Au-(1-3)μm In-(1-3)μm Sn-(40-400) nm Au-(10-50) nm Pt-(5-20) nm Ti-(40-400) nm Al, (40-400) nm Al-(5-20) nm Ti-(100-1000) nm Sn-(1-5)μm In-(100-1000) nm Sn-(5-20) nm Ti-(40-400) nm Al.

The first surface of interconnect structure 1540 is coupled to the second surface of interconnect pad 1512 of first semiconductor structure 1510. Additionally, the second surface of interconnect structure 1540 is coupled to the second surface of interconnect pad 1521 of second semiconductor structure 1520. Interconnect structure 1540 includes a first section 1542 (e.g., a pillar) having first and second opposing surfaces, with the first surface corresponding to the first surface of interconnect structure 1540. Interconnect structure 1540 also includes a second section 1544 (e.g., a solder ball, sphere, or micro-bump) having first and second opposing portions, with the first portion disposed over the second surface of first section 1542. Interconnect structure 1540 further includes a third section 1546 (e.g., a pillar) having first and second opposing surfaces, with the first surface disposed over the second portion of second section 1544. The second surface of interconnect structure 1540 corresponds to the second surface of interconnect structure 1540.

In one embodiment, before coupling or bonding of interconnect structure 1540 to semiconductor structures 1510 and 1520, first section 1542 and third section 1546 of interconnect structure 1540 each have a substantially larger surface area than second section 1544. Additionally, in one embodiment, first section 1542 and third section 1546 are via or conductive structures coupled to interconnect pads 1512 and 1521, respectively.

Referring now to second interconnect structure 1550, the first surface of interconnect structure 1550 is coupled to the second surface of interconnect pad 1523 of second semiconductor structure 1520. Additionally, the second surface of interconnect structure 1550 is coupled to the second surface of interconnect pad 1531 of third semiconductor structure 1530.

Interconnect structure 1550 includes a first section 1552 (e.g., a pillar) having first and second opposing surfaces, with the first surface corresponding to the first surface of interconnect structure 1550. Interconnect structure 1550 also includes a second section 1554 (e.g., a solder ball, sphere, or micro-bump) having first and second opposing portions, with the first portion disposed over the second surface of first section 1552. Interconnect structure 1540 further includes a third section 1546 (e.g., a pillar) having first and second opposing surfaces, with the first surface disposed over the second portion of second section 1554. The second surface of interconnect structure 1550 corresponds to the second surface of interconnect structure 1550.

Semiconductor structures 1510, 1520, 1530 may be coupled together through a coupling (i.e., bonding) process to form multi-layer semiconductor structure 1500. In particular, during the coupling process, interconnect structure 1540 may melt and form an electrical connection between interconnect pads 1512, 1521 of first semiconductor structure 1510 and second semiconductor structure 1520, respectively. Additionally, during the coupling process, interconnect structure 1550 may melt and form an electrical connection between interconnect pads 1522, 1531 of second semiconductor structure 1520 and third semiconductor structure 1530, respectively.

In one embodiment, at least one of interconnect structures 1540 and 1550 is a superconducting and or partial superconducting and or conventional interconnect. Additionally, in one embodiment, at least one of interconnect structures 1540 and 1550 includes an under bump metal (UBM) and or superconducting bump and or a conventional bump. Further, in one embodiment, at least one of interconnect structures 1540 and 1550 includes a superconducting UBM-superconducting bump-superconducting UBM structure and or a conventional UBM-superconducting bump-conventional UBM structure and or a superconducting UBM-conventional bump-superconducting UBM structure, or a combination thereof.

In one embodiment, at least one of first semiconductor structure 510, second semiconductor structure 520 and third semiconductor structure 530 includes one or more superconducting resonators and or superconducting couplers and or superconducting qubits. In another embodiment, at least one of first semiconductor structure 510, second semiconductor structure 520 and third semiconductor structure 530 includes one or more parts of superconducting resonators and or parts of superconducting couplers and or parts of superconducting qubits.

In another embodiment, first semiconductor structure 510 includes one or more portions of superconducting resonators and or portions of superconducting couplers and or portions of superconducting qubits. Additionally, in such embodiment, second semiconductor structure 520 includes remaining portions of the superconducting resonators and or remaining portions of the superconducting couplers and or remaining portions of the superconducting qubits. The first and second semiconductor structures 510, 520 can use single or multiple superconducting interconnects and or partially superconducting interconnects to electrically couple them (i.e., the semiconductor structures) together and complete (or substantially complete) the resonator and or coupler and qubit structure.

Similarly, third semiconductor structure 530 may include one or more portions of superconducting resonators and or portions of superconducting couplers and or portions of superconducting qubits. Additionally, second semiconductor structure 520 may include remaining portions of the superconducting resonators and or remaining portions of the superconducting couplers and or remaining portions of the superconducting qubits. The second and third semiconductor structures 520, 530 can use single or multiple superconducting interconnects and or partially superconducting interconnects to electrically couple them (i.e., the semiconductor structures) together and complete (or substantially complete) the resonator and or coupler and qubit structure.

It is further possible that first surface of second semiconductor structure 520 includes one or more portions of superconducting resonators and or portions of superconducting couplers and or portions of superconducting qubits. Additionally, and a second surface of second semiconductor structure 520 may include remaining portions of the superconducting resonators and or remaining portions of the superconducting couplers and or remaining portions of the superconducting qubits. The first and second semiconductor structure 510, 520 can use single or multiple superconducting TSVs and or partially superconducting TSVs to electrically couple them (i.e., the semiconductor structure) together and complete (or substantially complete) the resonator and or coupler and qubit structure.

In one embodiment, at least one of first semiconductor structure 510, second semiconductor structure 520 and third semiconductor structure 530 includes one or more superconducting resonators and or superconducting couplers and or superconducting qubits and or capacitors and or inductors. The resonators, couplers, qubits, capacitors and inductors may be electrically and or inductively and capacitively coupled with each other.

Additionally, in one embodiment, third semiconductor structure 530 includes a center conductor of a superconducting resonator, second semiconductor structure 520 includes one or more superconducting resonators, and the semiconductor structure 530, 520 are capacitively coupled with each other during resonator operation.

Further, in one embodiment, the size and shape of at least one of the above-described interconnect pads (e.g., 1521) and interconnect structures (e.g., 1540) is selected to achieve a desired pitch (e.g., a pitch requirement of semiconductor structure 1510 or semiconductor structure 1520).

Additional aspects of interconnect structures according to the disclosure are described in connection with FIGS. 5B and 5C, for example.

Figure 5B:
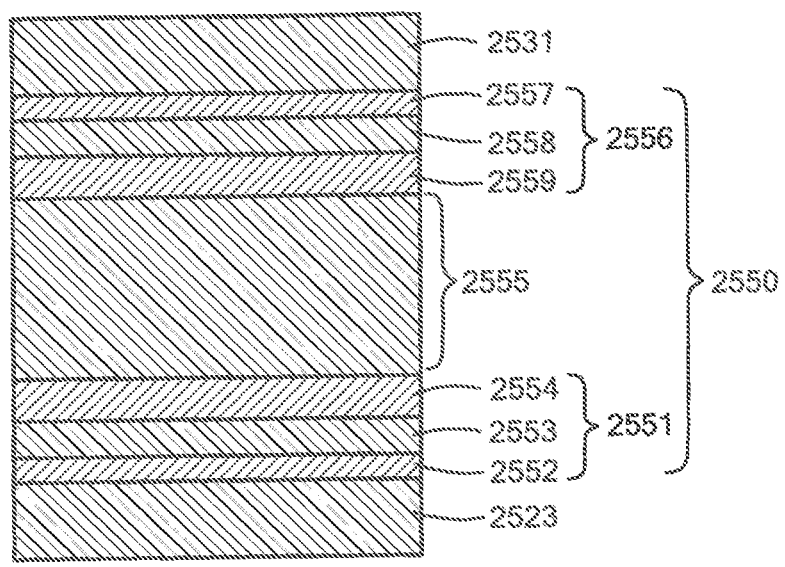
FIGS. 5B and 5C show cross-sections of example interconnect structures according to the disclosure.

Referring to FIG. 5B, cross-sections of example interconnect pads 2523, 2531 and an example interconnect structure 2550 are shown. The interconnect pads 2523, 2531 may be provided as part of or coupled to semiconductor structures (e.g., semiconductor structures 1520, 1530, FIG. 1) are shown. Additionally, interconnect structure 2550 (e.g., a superconducting or partially superconducting interconnect structure) may be used to electrically and mechanically couple the interconnect pads 2523, 2531 together and also couple the semiconductor structures to which the interconnect pads 2523, 2531 may be coupled.

Referring in closer detail to FIG. 5B, interconnect pads 2523, 2531 each have first and second opposing surfaces and are provided from one or more electrically conductive materials (e.g., Al or Nb). In the illustrated embodiment, a first surface of interconnect pad 2523 may be disposed over or beneath a select portion or surface of a respective semiconductor structure (e.g., 1520, shown in FIG. 5A). Additionally, a second surface of interconnect pad 2531 may be disposed over or beneath a select portion or surface of another respective semiconductor structure (e.g., 1530, shown in FIG. 5A). Interconnect pads 2523, 2531 may be each coupled to one or more electrical connections or components (i.e., circuitry) of the semiconductor structures.

Interconnect structure 2550, which is shown as coupled to interconnect pads 2523, 2531 in the illustrated embodiment, has a first surface coupled to interconnect pad 2523 and a second, opposing surface coupled to interconnect pad 2531. The interconnect structure 2550 also includes a plurality of sections (here, three sections 2551, 2555, 2556). Selected ones of the sections (here, sections 2551 and 2556) include a plurality of layers (e.g., metal or alloy layers, as will be discussed).

In the example embodiment shown, a first one of the sections (also sometimes referred to herein as a "first section") 2551, which may be the same as or similar to first section 1552 of conductive structure 1550 of FIG. 5A, has first and second opposing surfaces. The first section 2551 also includes a first conductive layer 2552, a second conductive layer 2553 and a third conductive layer 2554. The first conductive layer 2552 has first and second opposing surfaces, with the first surface of corresponding to the first surface of the first section 2551. Additionally, the second conductive layer 2553 has first and second opposing surfaces, with the first surface disposed over the second surface of the first conductive layer 2552. Further, the third conductive layer 2554 has first and second opposing surfaces, with the first surface disposed over the second surface of the second conductive layer 2553 and the second surface corresponds to the second surface of the first section 2551. The first surface of the first section 2551 corresponds to the first surface of interconnect structure 2550 in the illustrated embodiment.

The first conductive layer 2552 is provided from one or more first electrically conductive materials (e.g., Titanium (Ti)). Additionally, the second conductive layer 2553 is provided from one or more second electrically conductive materials (e.g., Platinum (Pt)). Further, the third conductive layer 2554 is provided from one or more third electrically conductive materials (e.g., Gold (Au)).

In one embodiment, the first, second and third electrically conductive materials each include a different, respective metal or alloy material or combination of materials (i.e., first section 2551 has a multiple melt composition). As one example, the first conductive material may include a material (e.g., Ti, Pb) having a first melting point, the second conductive material may include a material (e.g., Pt, Sn) having a second melting point, and the third conductive material may include a material (e.g., Au, In) having a third melting point. It is possible that interfaces of the conductive materials react with each other during a bonding and or a post bonding process.

A second one of the sections (also sometimes referred to herein as a "second section") 2555, which may be the same as or similar to second section 1554 of conductive structure 1550 of FIG. 5A, has first and second opposing portions. The first portion of second section 2555 is disposed over the second surface of first section 2551. The second section 2555 includes one or more fourth electrically conductive materials (e.g., Indium). Additionally, the second section 2555 may be provided as a solder ball, sphere, pillar, or micro-bump.

A third one of the sections (also sometimes referred to herein as a "third section") 2556, which may be the same as or similar to third section 1556 of conductive structure 1550 of FIG. 5A and first section 2551, has first and second opposing surfaces. The third section 2556 also includes a first layer 2557, a second layer 2558 and a third layer 2559. The first layer 2557, which may be the same as or similar to first layer 2552 of first section 2551, has a first surface disposed over the second surface of second section 2555 and a second opposing surface. Additionally, the second layer 2558, which may be the same as or similar to second layer 2553 of first section 2551, has a first surface disposed over the second surface of first layer 2557 and a second opposing surface. Further, the third layer 2559, which may be the same as or similar to third layer 2554 of first section 2551, has a first surface disposed over the second surface of second layer 2558 and a second opposing surface. The first surface of the first layer 2557 corresponds to the first surface of third section 2556 and the second surface of third layer 2559 corresponds to the second surface of third section 2556. The second surface of the third section 2556 corresponds to the second surface of the interconnect structure 2550 in the illustrated embodiment.

Interconnect pad 2523 and interconnect pad 2531 may be coupled together via interconnect structure 2550 through a coupling process. During the coupling process, the interconnect structure 2550 may, for example, melt and or soften and or deform and form an electrical connection (e.g., a "low" resistance electrical connection) between interconnect pad 2523 and interconnect pad 2531. In particular, during the coupling process, a plurality of melt interfaces (i.e., melt surfaces) may form between first and second sections 2551, 2555 of interconnect structure 2550 and interconnect pad 2523 to produce an electrical connection between interconnect structure 2550 and interconnect pad 2523. Additionally, during the coupling process, a plurality of melt interfaces may form between second and third sections 2555, 2556 of interconnect structure 2550 and interconnect pad 2531 to produce an electrical connection between interconnect structure 2550 and interconnect pad 2531.

In one embodiment, the melt interfaces form due to the interconnect structure sections, and portions thereof, melting at plurality of different temperatures. For example, layers 2552, 2553, 2554 of first section 2551 and the second section 2555 may each melt at respective, different temperatures during the coupling process due to the layers and sections including materials having different melting points. Such multi-melt interface may, for example, provide for a more robust electrical connection than conventional electrical connections. Additionally, such multi-melt interface may provide for the ability to decouple and recouple the interconnect structure 2550 to interconnect pad 2523 if rework is required during assembly of a multi-layer semiconductor structure including interconnect structure 2550 and interconnect pad 2523. In some embodiments, layer 2559 may react with second section 2555 and layer 2554 may react with second section 2555 at the interface and create a lower melt interface than the individual metal (s) and or alloys of layer 2559, second section 2555, and layer 2554. Such may provide for a more robust interconnect at lower bonding temperature(s) than individual element melt temperature(s).

While first section 2551 and third section 2556 of interconnect structure 2550 are shown and described as having a same number of layers in the illustrated embodiment (e.g., in which these sections act as under bump metals (UBMs)), it should be appreciated that first section 2551 and third section 2556 may include a different number of layers in some embodiments.

Additionally, while certain layers (e.g., 2552) of first section 2551 are shown and described as being substantially the same as certain layers (e.g., 2557) of third section 2556 in the illustrated embodiment, it should be appreciated that these layers of the first section 2551 may have one or more different characteristics (e.g., dimensions, materials, etc.) from the layers of the third section 2556 in some embodiments. Third section 2556 can, for example, act as an under bump metal with many different possible thickness as needed.

It should be appreciated that interconnect structure 2550 may be considered a superconducting interconnect structure or a partially superconducting interconnect structure based upon the materials from which the first, second and third sections 2551, 2555, 2556 are provided. First section 2551 and third section 2556 can, for example, be Aluminum (Al) pads with Ti (2552, 2557), Pb (2553, 2558), Sn (2554, 2559). Additionally, second section 2555 can include Indium (In). In another embodiment first section 2551, layer 2559 and second section 2555 each include In. In another embodiment, first section 2551 and layer 2559 each include Sn and second section 2555 includes In or Pb.

Figure 5C:
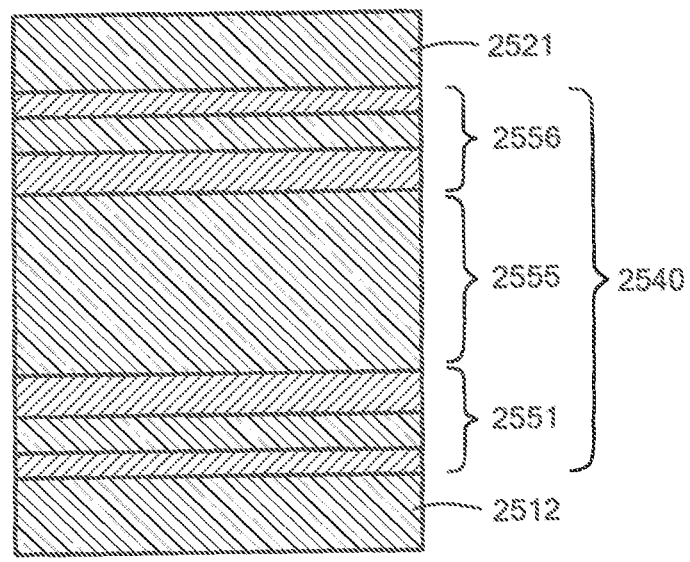

Referring now to FIG. 5C, in which like elements of FIG. 5B are shown having like reference designations, cross-sections of example interconnect pads 2512, 2521 similar to interconnect pads 2523, 2531 of FIG. 5B are shown. A cross-section of an example interconnect structure 2540 (e.g., a superconducting or partially superconducting interconnect structure) similar to interconnect structure 2550 of FIG. 5B is also shown. Interconnect structure 3550 has first and second opposing surfaces and includes a first section 2551, a second section 2555 and a third section 2556. The first surface of interconnect structure 2520 is coupled to a corresponding surface (i.e., a second surface) of interconnect pad 2512. Additionally, the second surface of interconnect structure 2540 is coupled to a corresponding surface (i.e., a second surface) of interconnect pad 2521.

Those of ordinary skill in the art will understand how to select the size, shape and electrically conductive materials of interconnect structures 2550 and 2540 for a particular application (e.g., based on pitch and assembly risk sites). For example, interconnect pad 2512 of interconnect structure 2540 may be a Niobium (Nb) pad and interconnect pad 2521 of interconnect structure 2540 may be an Aluminum (Al) pad. Additionally, interconnect pads 2523, 2531 of interconnect structure 2550 may each be Al pads.

FIGS. 5-5C illustrate a novel scalable cryogenic 3D integration approach for developing quantum computing architecture. Computer circuits typically contain processors, USB controller, power management circuits, RF devices etc. It is generally very difficult to make a computer that fits within the cryogenic chamber because of the large number of individual chips and associated hardware required to build high performance computing. The approach illustrated and described above gives the ability to design computing circuitry to fit the cryogenic space, rather than adjusting the cryogenic space to fit the computer circuits.

Additionally, the approach may minimize the use of physical space and increased functionality of circuits fabricated using these approaches. For example, the approach may be used to remove many components to save space, increase integration density, and maximize superconducting path and other considerations, while still having all the functional components to be considered a computer.

As will become further apparent from discussion below, the approach offers many advantages. For example, structure 500 (may illustrate an individual interposer chip (520) and qubit chip (530) bonded with superconducting MCM (510) to complete the structure 500. The bonding scheme for making structure 500 is described further below in connections with FIGS. 9-9D or FIGS. 10-10D or FIG. 12-12C. This approach allows for independent fabrication of each functional layer (Qubit, interposer, MCM). Additionally, the TSV interposer provides for electrical isolation and increased connectivity complexity.

This approach further allows for testing of each qubit chip, interposer chip and superconducting MCM before and after final assembly to the PCB. Such may provide for only "known good SMCM" to be used in the final assembly. It is possible to replace individual superconducting SMCMs. The technique is particularly well suited to high-end products where components, dies, and packaging are expensive and repair or rework is economically viable. Part of the package, if necessary, can be replaced or repaired, or even upgraded without compromising overall electrical performance. Thus, this approach will be economical for quantum computing, since a damaged, non-factional part of the package can be selectively removed and replaced.

Figure 6:
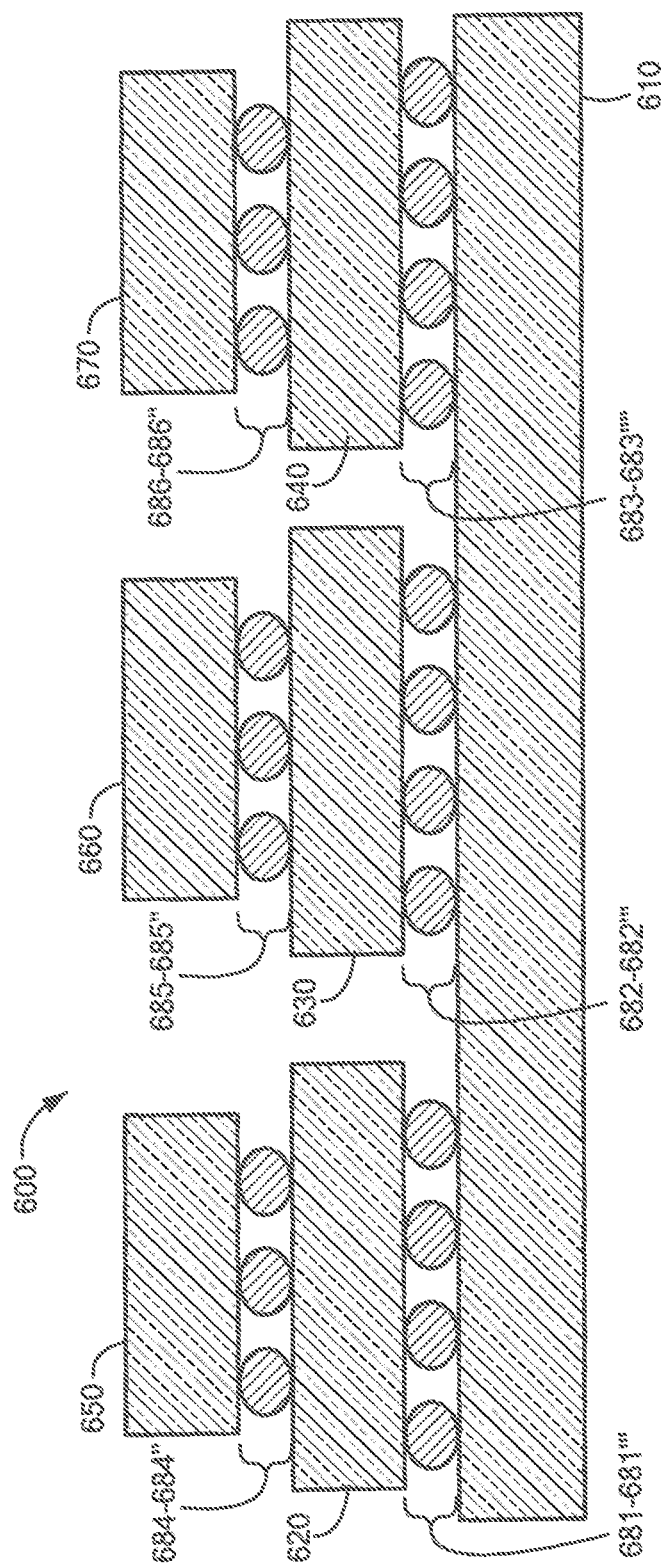
FIGS. 6-8A are block diagrams of example multi-layer semiconductor structures fabricated using interconnect structures according to the disclosure.

Referring now to FIG. 6, an example multi-layer semiconductor structure 600 as may be fabricated using interconnect structures according to the concepts, systems, circuits, and techniques sought to be protected herein is shown. Semiconductor structure 600 includes a first semiconductor structure 610, a second semiconductor structure 620, a third semiconductor structure 630 and a fourth semiconductor structure 640. Semiconductor structure 600 also includes a fifth semiconductor structure 650, a sixth semiconductor structure 660 and a seventh semiconductor structure 670. Each of the semiconductor structures (e.g., 610) has first and second opposing surfaces and may include a plurality of electrical connections extending between the first and second surfaces Semiconductor structure 600 is fabricated using wafer-scale bonding techniques in which semiconductor structures 620, 630, 640 (e.g., TSV substrates) are selectively coupled to semiconductor structure 610 (e.g., an MCM). In particular, in the illustrated embodiment, second semiconductor structure 620 is electrically and mechanically coupled to a first portion of a second surface of first semiconductor structure 610 through interconnect structures 681, 681', 681", 681'''. Additionally, third semiconductor structure 630 is electrically and mechanically coupled to a second portion of the second surface of first semiconductor structure 610 through interconnect structures 682, 682', 682", 682'''. Further, fourth semiconductor structure 640 is electrically and mechanically coupled to a third portion of the second surface of first semiconductor structure 610 through interconnect structures 683, 683', 683", 683'''.

The interconnect structures (e.g., 681) used for coupling semiconductor structures 620, 630, 640 to semiconductor structure 610 may be conventional interconnect structures in embodiments in which semiconductor structures 620, 630, 640 are conventional semiconductor structures (i.e., non-superconducting semiconductor structures). Additionally, the interconnect structures (e.g., 681) may be superconducting or partially superconducting interconnect structures according to the disclosure in embodiments in which the semiconductor structures 620, 630, 640 are superconducting semiconductor structures or integrated circuits.

Semiconductor structure 600 is also fabricated using wafer-scale bonding techniques in which semiconductor structures 650, 660, 670 (e.g., superconducting ICs) are selectively coupled to semiconductor structures 620, 620, 640 in the illustrated embodiment. In particular, fifth semiconductor structure 650 is electrically and mechanically coupled to second semiconductor structure 620 through interconnect structures 684, 684', 684". Sixth semiconductor structure 660 is electrically and mechanically coupled to third semiconductor structure 630 through interconnect structures 685, 685', 685". Seventh semiconductor structure 670 is electrically and mechanically coupled to fourth semiconductor structure 640 through interconnect structures 686, 686', 686".

The interconnect structures (e.g., 684) may be superconducting or partially superconducting interconnect structures according to the disclosure in embodiments in which the semiconductor structures 650, 660, 670 are superconducting semiconductor structures or integrated circuits. Additionally, the interconnect structures may form a ball grid array (BGA) type package or another type package on respective semiconductor structures to which the interconnect structures are coupled.

In one embodiment, the semiconductor structures 610, 620, 630, 640, 650, 660, 670 each have an associated semiconductor package pitch, and the interconnect structures each have one or more characteristics (e.g., dimensions) selected in accordance with the package pitch, as will be further discussed in connections with FIGS. 7-8A below.

In one aspect of the disclosure, there are two (or more) possible bonding schemes in FIG. 6. One option is where all TSV structures (620, 630, 640) are bonded first with MCM 610 and substantially all the qubit chips (650, 660, 670) are bonded at the end with TSV structures to electrically couple with each other. Additionally, a second option is where substantially all TSV structures (620, 630, 640) are bonded first with substantially all the qubit chips (650, 660, 670) and the TSV-Qubit bonded structure bonded at the end with MCM 610 structures to electrically couple with each other. In one example, Qubit chip 650 and qubit chip 660 electrically couple with each other through MCM 610. The electrical path for electrical coupling will be Qubit 650-interconnect-TSV 620-interconnect-MCM 610-interconnect-TSV 630-interconnect-qubit 660. It is further possible to use superconducting (Al) and or normal metal (Au) wirebonding between TSV 620 and TSV 630 and as a result an electrical path between qubit 650 and 660 will be reduced to Qubit 650-interconnect-TSV 620-TSV 630-interconnect-qubit 660.

Figure 6A:
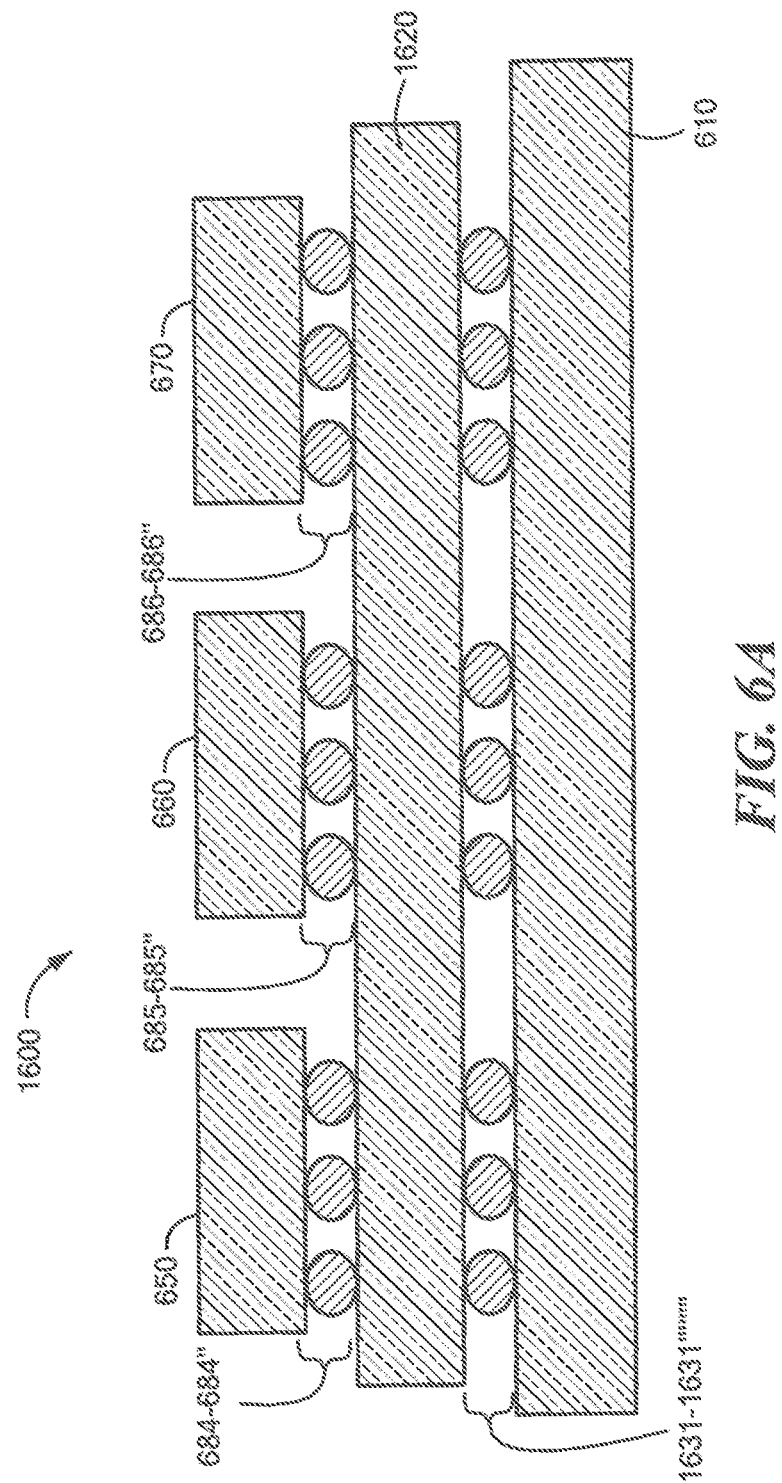

Referring now to FIG. 6A, in which like elements of FIG. 6 are provided having like reference designations, another example multi-layer semiconductor structure 1600 includes first semiconductor structure 610 and a second semiconductor structure 1620. Semiconductor structure 1600 also includes semiconductor structure 650 (here, a third semiconductor structure 650), semiconductor structure 660 (here, a fourth semiconductor structure 660) and semiconductor structure 670 (here, a fifth semiconductor structure 670).

Semiconductor structure 1600 is fabricated using wafer-scale bonding techniques similar to those which were described above in connection with semiconductor structure 600 of FIG. 6 in which semiconductor structures are selectively coupled to each other. In particular, in semiconductor structure 1600, second semiconductor structure 1620 (e.g., a TSV substrate) is electrically and mechanically coupled to a second surface of first semiconductor structure 610 through interconnect structures 1631, 1631', 1631", 1631''', 1631'''', 1631''''', 1631'''''', 1631''''''', 1631''''''''. Additionally, third semiconductor structure 650 is electrically and mechanically coupled to a first portion of a second surface of second semiconductor structure 1620 through interconnect structures 684, 684', 684".

Fourth semiconductor structure 660 is electrically and mechanically coupled to a second portion of the second surface of second semiconductor structure 1620 through interconnect structures 685, 685', 685". Additionally, fifth semiconductor structure 670 is electrically and mechanically coupled to a third portion of the second surface of second semiconductor structure 1620 through interconnect structures 686, 686', 686".

In one embodiment, the TSV structures (1620) are bonded (e.g., using wafer level bonding) first with MCM 610 and remaining ones of the qubit chips (650, 660, 670) are bonded at the end with TSV structure to electrically couple with each other. In one example, Qubit chip 650 and qubit chip 660 electrically and or capacitively and or inductively couple with each other through TSV 1620. The electrical path for electrical coupling will be Qubit 650-interconnect-TSV 1620-interconnect-qubit 660. In one example, Qubit chip 650 consists of resonator 1 and qubit chip 660 consists of resonator 2, TSV 1620 consists of feedline of superconducting resonators and resonator 1 and resonator 2 capacitively coupled to the feedline of TSV 1620.

Figure 6B:
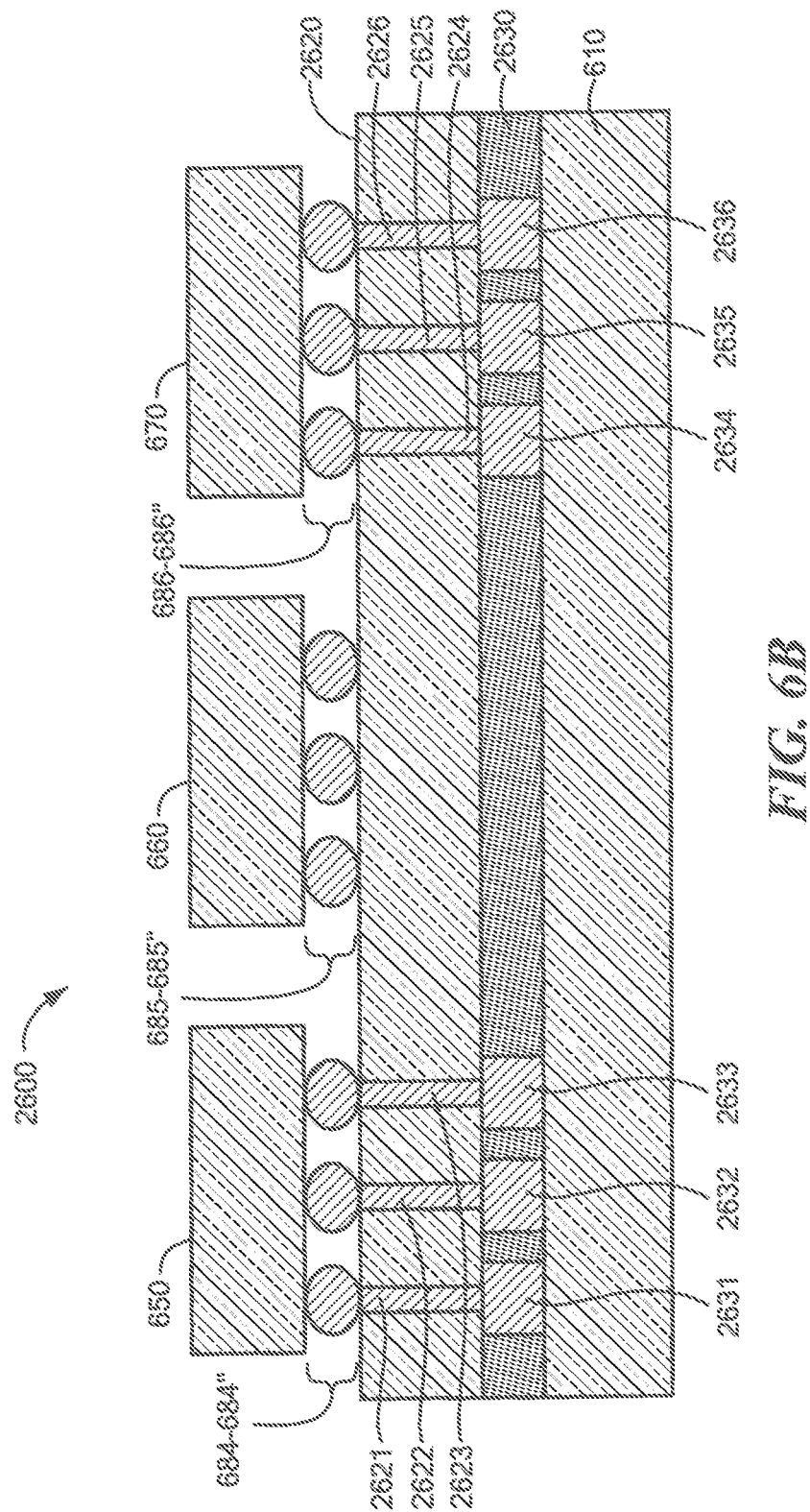

Referring now to FIG. 6B, another example multi-layer semiconductor structure 2600 includes first semiconductor structure 610 and a second semiconductor structure 2620. Semiconductor structure 2600 also includes third semiconductor structure 650, fourth semiconductor structure 660 and fifth semiconductor structure 670. The semiconductor structure 2600 also includes a via joining layer 2630 (e.g., an oxide bonding layer) disposed between and coupled to a second surface of first semiconductor structure 610 and to a first surface of second semiconductor structure 2620.

The via joining layer 2630 has first and second opposing surfaces and includes a plurality of conductive structures (here, six conductive structures 2631, 2632, 2633, 2634, 2635, 2636) extending between select portions of the first and second surfaces. The conductive structures (e.g., TSVs) are provided from one or more electrically conductive materials (e.g., copper, gold or aluminum) and are electrically coupled to one or more electrical connections (or vias structures) in first semiconductor structure 610 and second semiconductor structure 2620. The via joining layer 2630 also includes an oxide bonding material 2637 disposed between select portions of the first and second surfaces of the via joining layer 2630.

Second semiconductor structure 2620 (e.g., a TSV substrate) has first and second opposing surfaces and includes a plurality of via structures (here, six via structures 2621, 2622, 2623, 2624, 2625, 2626) extending between select portions of the first and second surfaces. The via structures 2621, 2622, 2623, 2624, 2625, 2626 may be electrically coupled to one or more electrical connections in second semiconductor structure 2620. Additionally, the via structures 2621, 2622, 2623, 2624, 2625, 2626 may be electrically coupled to one or more of conductive structures 2631, 2632, 2633, 2634, 2635, 2636 in via joining layer 2630. In one example embodiment, the conductive structures 2631, 2632, 2633, 2634, 2635, 2636 have a diameter of about 1-2 µm and are prepared using a 3D-Via lithography process. The 3D-Via lithography process includes an oxide etch using CF4 plasma, dry and/or wet resist strip, resist clean using Aleg-380, IMP+CVD Ti/TiN liner deposition, CVD W and or Ni and or low temperature melt metal and or alloy fill and CMP planarization and chemical activation for bonding.

Third semiconductor structure 650 is electrically and mechanically coupled to a first portion of a second surface of second semiconductor structure 2620 through interconnect structures 684, 684', 684". Additionally, fourth semiconductor structure 660 is electrically and mechanically coupled to a second portion of the second surface of second semiconductor structure 2620 through interconnect structures 685, 685', 685". Further, fifth semiconductor structure 670 is electrically and mechanically coupled to a third portion of the second surface of second semiconductor structure 2620 through interconnect structures 686, 686', 686".

In the illustrated embodiment, interconnect structures 684, 684', 684" are further coupled to via structures 2621, 2622, 2623 in second semiconductor structure 2620. Additionally, interconnect structures 686, 686', 686" are further coupled to via structures 2624, 2625, 2626 in second semiconductor structure 2620. Interconnect structures 684, 684', 684", 685, 685', 685", 686, 686', 686" may each be provided as superconducting or partially superconducting interconnect structures according to the disclosure.

In one embodiment, TSV structures 2621, 2622, 2623, 2624, 2625, 2626 and/or conductive structures 2631, 2632, 2633, 2634, 2635, 2636 are each filled with multiple metal and/or alloy layers. At least one of the multiple metal and/or alloy layers may have a low temperature melt composition and/or conductive fusible metal which melts and flows to eliminate any possible electrical open within the TSV and or via structures. The low temperature melt metal and/or alloy layer may react with at least another metal within the TSV and or via structures to create a high melt composition. It is possible to create a high melt composition with a melt temperature which can be higher than operational and/or processing temperatures. It is further possible that the low temperature melt composition melts and reacts with at least another metal composition within the TSV and/or via structures to create a high melt composition having a higher coefficient of thermal expansion (CTE) than individual metal compositions.

It is further possible to use multiple metals or alloy layers having a low temperature melt composition within the TSV and or via structures which melts and reacts with at least another metal and/or alloy within the TSV structures to create multiple high melt composition. It is further possible to create a melt gradient. It is also possible to use a multiple metal or alloy layer having a low temperature melt composition within the TSV and or via structures which melts and reacts with at least another metal/and or alloy within the TSV structures to create multiple high melt composition and residual low melt metal which helps to heal any defects in the TSV and or via structures which arise during operation and/or processing.

Low Nitrogen percentages in a Ta/TaN barrier layer and/or high bias power conditions during PVD seed layer depositions in the TSV structures may help to grow more Cu seed with more Cu (111) than Cu (200) orientation. Cu (111) favored Cu electroplating to fill the TSV and or via structures. Alternate seed layers for filling the TSV and or via structures include CVD-Cu, CVD-W, sputtered TiW/Cu, CVD-tungsten (W) and sputtered TiW/Cu. It is also possible to use single and multiple Cu seed layers, plated Cu and low melt metals and/or alloy layers within the TSV and or via structures where low melt metals and/or alloys will melt flow to the TSV and or via structures and repair opens (if any) within the TSV and or via structures. Low melt metals and/or alloys (e.g. Sn) react with Cu and or au and or Ag to create at least one high melt solid solution. It is further possible that at least part of the remaining metals in the TSV and or via structures are unreacted and can act as healing agent. It is further possible that at least part of the Cu plated layer can be replace by another metal such as Ag, Au, and/or Ni.

It is also possible to use single and or multiple low temperature melt layers which melt and form a multiple high melt composition. It is further possible to use low temperature melt metals and/or alloys (e.g., tin and Indium) which react with each other and create a lower melt (e.g., 48 weight % tin and 52 weight % tin indium) composition. It is further possible that a lower melt composition exposed to further heat-treatment will react with each other as well as other metal present in the TSV and or via structures to create a higher melt composition than that of individual metals (e.g., tin and indium). It is further possible to create a composition gradient as well as melt temperature gradient. It is further possible to create multi metal layer TSV and or via structures with at least one low temperature melt composition which melt and flow to repair any defects which may be present in the TSV and or via structures.

Additionally, in some embodiments, one or more of the TSV and or via structures can be filled with a nanoparticle conductive paste. The TSV and or via structures can be filled with a nanoparticle conductive paste through a process in which the TSV structures are filled with the paste at around 60 C under vacuum. At around 60 C the paste will have a lower viscosity than at room temperature. Low viscosity paste under vacuum will fill the TSV and or via structures by capillary action. This process can be used multiple times to do complete the fill. After the fill, the paste will be cured and through a subsequent CMP process the cured paste will be removed from one or more surfaces of the TSV and or via structures. It is also possible to do TSV and or via before final curing and to final cure the paste after the CMP. This process also favors to add a thin insulating layer around a wall of the TSV and or via structures which will insulate/passivate a side wall of the TSV and or via structures and provide z-direction electrical connection after curing.

Further, in some embodiments, one or more of the TSV and or via structures can be filled with a metal based nanoparticle which has a particle size less or equal to one micron, preferably less or equal to between about two hundred nm and about five hundred nm. The metal based nanoparticle can be a pure metal particle (e.g., Au, Ag, Cu), a low temperature melt metal and or alloy (e.g., In), a low temperature melt metal and/or alloy coated metal or a combination thereof. It is possible to have single and multiple metal seed based TSV and or via structure filled with a conductive paste. Conductive paste filling may, for example, improve electrical conductivity of the TSV and or via structures. It is further possible to use nanoparticle slurry instead of paste to fill the TSV and or via structures.

Figure 6C:
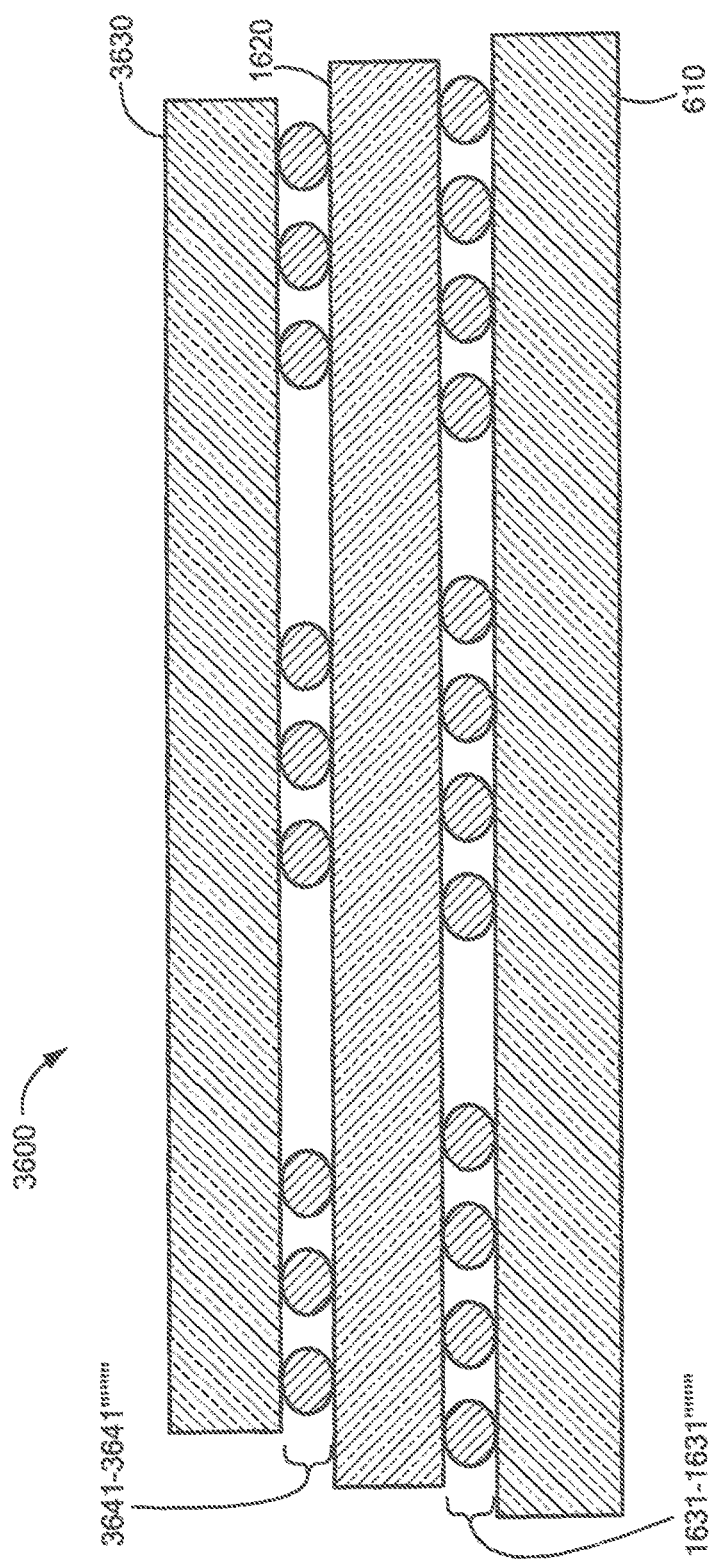

Referring now to FIG. 6C, a further example semiconductor structure 3600 includes first semiconductor structure 610, semiconductor structure 1620 (here, a second semiconductor structure 1620) and a third semiconductor structure 3630.

Second semiconductor structure 1620 is electrically and mechanically coupled to first semiconductor structure 610 through interconnect structures 1631, 1631', 1631", 1631''', 1631'''', 1631''''', 1631'''''', 1631''''''', 1631'''''''' Additionally, third semiconductor structure 3630 (e.g., a superconducting IC) is electrically and mechanically coupled to second semiconductor structure 1620 through interconnect structures 3641, 3641', 3641", 3641''', 3641'''', 3641''''', 3641'''''', 3641''''''', 3641''''''''. Interconnect structures 3641, 3641', 3641", 3641''', 3641'''', 3641''''', 3641'''''', 3641''''''', 3641'''''''' may each be provided as superconducting or partially superconducting interconnect structures according to the disclosure.

In one embodiment, FIG. 6C represents wafer level bonding of a Qubit chip (e.g., third semiconductor structure 3630). Here, third semiconductor structure 3630 is large and capable of including substantially all possible structures including qubit and or resonators and or couplers and or capacitors and inductors. Similarly, second semiconductor structure 1620 (e.g., an interposer) and first semiconductor structure 610 (e.g., an MCM) are large and capable of including substantially all possible structures including qubit and or resonators and or couplers and or capacitors and inductors. Structure 3600 can have electrical and or capacitive and or inductive coupling between any layers/chips. Here, second semiconductor structure 1620 is bonded (e.g., using wafer level bonding) first with first semiconductor structure 610 (e.g., an MCM) and third semiconductor structure 3630 (e.g., a qubit chip) is bonded at the end with second semiconductor structure 1620 to electrically and or inductively and or capacitively and or mechanically couple with each other.

Figure 6D:
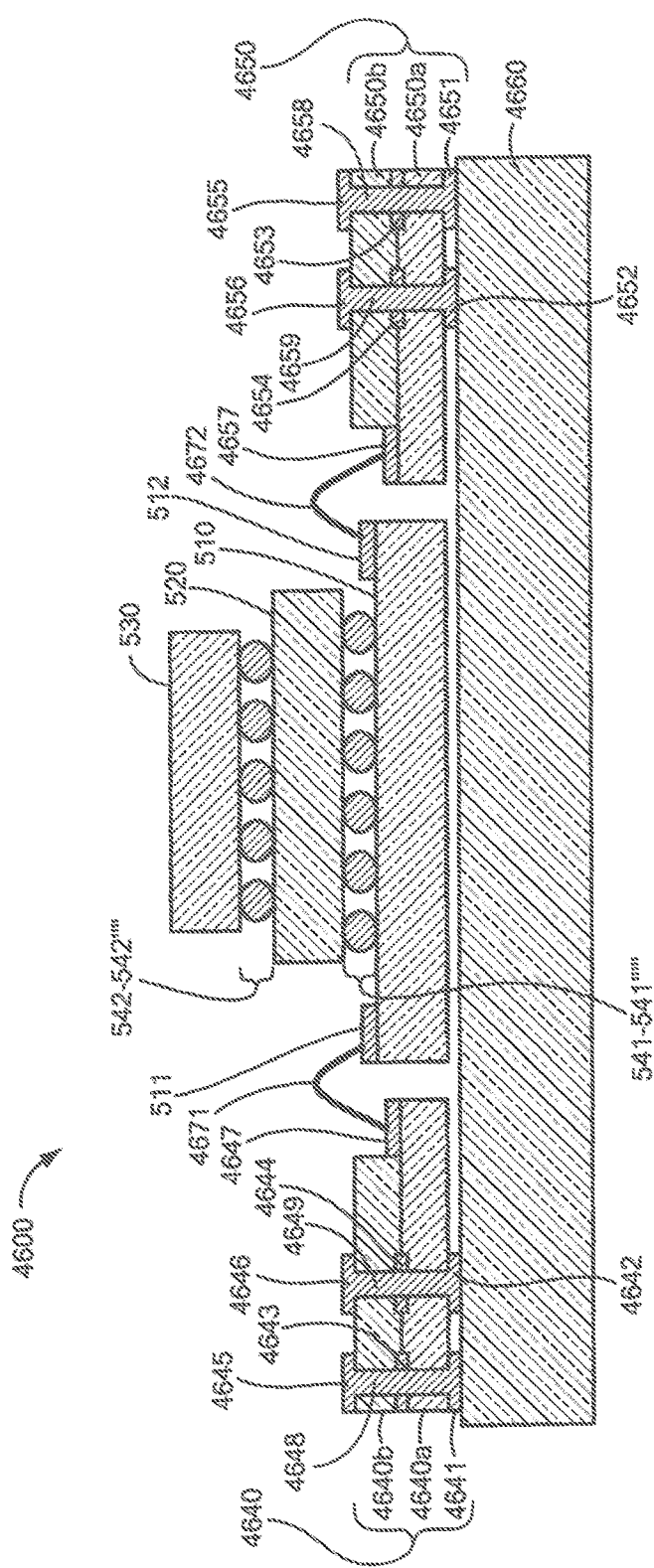

Referring now to FIG. 6D, in which like elements of FIG. 5 are shown having like reference designations, another example multi-layer semiconductor structure 4600 is shown. Semiconductor structure 4600 illustrates an example semiconductor structure for chip-scale and/or wafer-scale bonding. Semiconductor structure 4600 includes first semiconductor structure 510, second semiconductor structure 520 and third semiconductor structure 530 (collectively, multi-layer semiconductor structure 500). Semiconductor structure 4600 also includes a fourth semiconductor structure 4640 (missing in fig), a fifth semiconductor structure 4650 (missing in fig) and a heat dissipation structure 4660.

Fourth semiconductor structure 4640 (e.g., a printed circuit board (PCB) or substrate) has first and second opposing surfaces and includes a first semiconductor portion 4640a and a second semiconductor portion 4640b. Fourth semiconductor structure 4640 also includes a plurality of interconnect pads (here, seven interconnect pads 4641, 4642, 4643, 4644, 4645, 4646, 4647) and a plurality of conductive structures (here, two conductive structures 4648, 4649). Interconnect pads 4641, 4642 each have a first surface disposed over or beneath select portions of the first surface of first semiconductor structure 4640. Additionally, interconnect pads 4643, 4644 each have first and second surfaces disposed between first semiconductor portion 4640a and second semiconductor portion 4640b. Further, interconnect pads 4645, 4646, 4647 each have a first surface disposed over or beneath select portions of the second surface of first semiconductor structure 4640.

Conductive structure 4648 is electrically coupled to interconnect pads 4641, 4643, 4645. Additionally, conductive structure 4649 is electrically coupled to interconnect pads 4642, 4644, 4646. Further, a wire bonding structure 4671 forms an electrical connection between semiconductor structure 4640 and semiconductor structure 510. In particular, wire bonding structure 4671 has a first portion coupled to interconnect pad 4647 of semiconductor structure 4640 and a second opposing portion coupled to interconnect pad 511 of semiconductor structure 510. Interconnect pad 511 is disposed over or beneath the second surface of semiconductor structure 510 and may be electrically coupled to one or more electrical connections in semiconductor structure 510.

Fifth semiconductor structure 4650 (e.g., a printed circuit board (PCB) or substrate), similar to fourth semiconductor structure 4640, has first and second opposing surfaces and includes a first semiconductor portion 4650a and a second semiconductor portion 4650b. Fifth semiconductor structure 4650 also includes a plurality of interconnect pads (here, seven interconnect pads 4651, 4652, 4653, 4654, 4655, 4656, 4657) and a plurality of conductive structures (here, two conductive structures 4658, 4659). Interconnect pads 4651, 4652 each have a first surface disposed over or beneath select portions of the first surface of first semiconductor structure 4650. Additionally, interconnect pads 4653, 4654 each have first and second surfaces disposed between first semiconductor portion 4650a and second semiconductor portion 4650b. Further, interconnect pads 4655, 4656, 4657 each have a first surface disposed over or beneath select portions of the second surface of first semiconductor structure 4650.

Conductive structure 4658 is electrically coupled to interconnect pads 4651, 4653, 4655. Additionally, conductive structure 4649 is electrically coupled to interconnect pads 4652, 4654, 4656. Further, a wire bonding structure 4672 forms an electrical connection between semiconductor structure 4650 and semiconductor structure 510. In particular, wire bonding structure 4672 has a first portion coupled to interconnect pad 4657 of semiconductor structure 4650 and a second opposing portion coupled to interconnect pad 512 of semiconductor structure 510. Interconnect pad 512 is disposed over or beneath the second surface of semiconductor structure 510 and may be electrically coupled to one or more electrical connections in semiconductor structure 510.

Heat dissipation structure 4660 (e.g., a heat sink device or cold plate) has first and second opposing surfaces, with the second surface of heat dissipation structure 4660 disposed beneath and thermally coupled to semiconductor structures 510, 4640 and 4650. In particular, in the illustrated embodiment, the second surface of heat dissipation structure 4660 is substantially directly coupled to the first surface of semiconductor structure 510. Additionally, the second surface of heat dissipation structure 4660 is thermally coupled to semiconductor structure 4640 through interconnect pads 4641, 4642 of semiconductor structure 4640. Further, the second surface of heat dissipation structure 4660 is thermally coupled to semiconductor structure 4650 through interconnect pads 4651, 4652 of semiconductor structure 4650.

In one embodiment, the second surface of heat dissipation structure 4660 is further thermally coupled to semiconductor structures 510, 4640 and 4650 through a thermally conductive adhesive (e.g., Nickel, Gold). The thermally conductive adhesive may, for example, be disposed between the second surface of heat dissipation structure 4660 and corresponding portions (or surfaces) of semiconductor structures 510, 4640 and 4650. Such thermally conductive adhesive may provide for increased heat dissipation between semiconductor structures 510, 4640, 4650 and the heat dissipation structure 4660.

In one example embodiment, semiconductor structures 4640 and 4650 can use low loss materials such as Rogers 6202. Additionally, in one embodiment, semiconductor structures 4640 and 4650 can use two separate board stack on top of other in such a way that pads from bottom board exposed for wirebonding. In some cases, it is possible to glue two boards together. In one example, B-stages acrylic adhesive is used as substantially no flow adhesives to glue two boards together. Again no flow adhesive will help to protect exposed wirebonding pad area. It is further possible to create through via, via metallization and pad metallization after gluing two (or more) boards together.

In another example embodiment, semiconductor structures 4640 and 4650 can be an organic and or ceramic based superconducting substrate made with Aluminum (Al) and or Al coated trace and or a Tin (Sn) coated and or Titanium (Ti)/Titanium Nitride (TiN) and or a lead (Pb) coated trace and via filled with indium (In) and or Sn—Pb eutectic and or Sn—In eutectic or combinations thereof.

Figure 7:
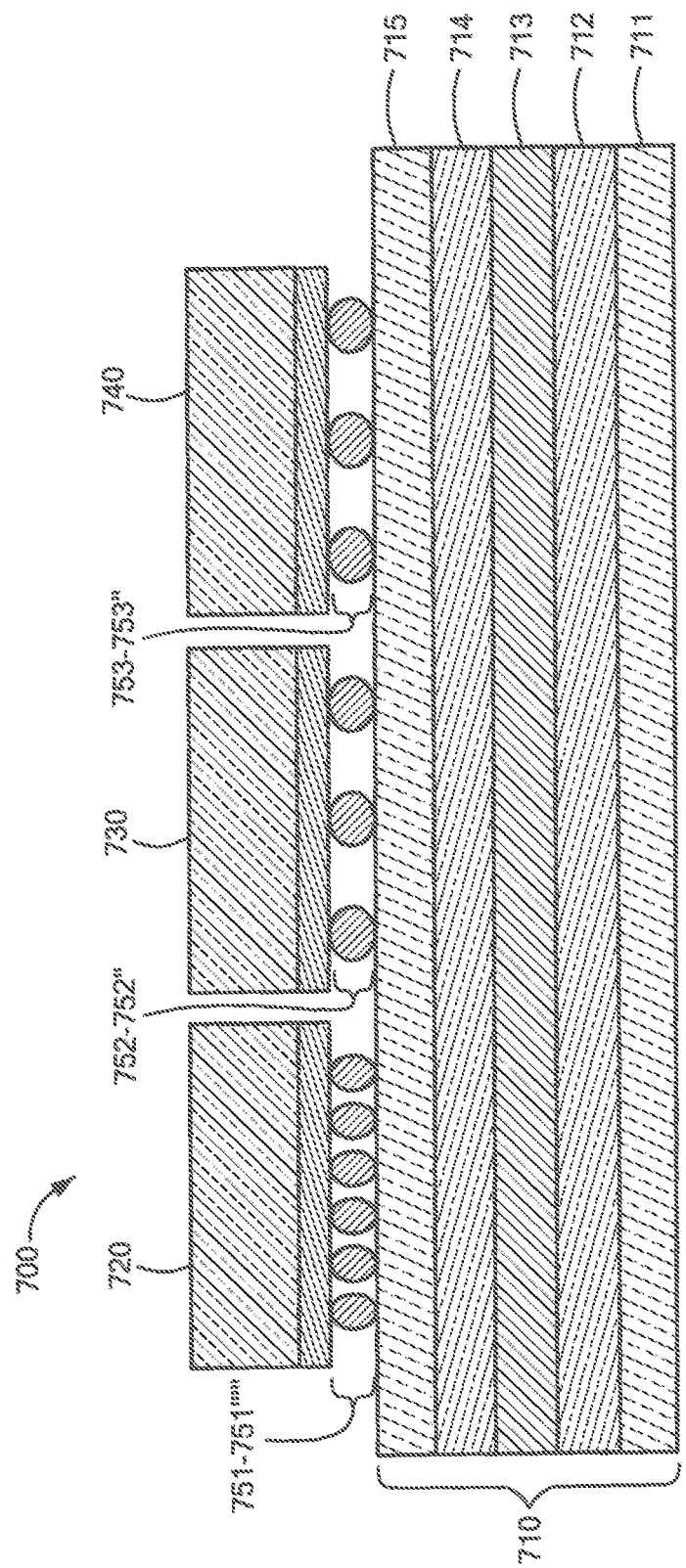

Referring now to FIG. 7, an example multi-layer semiconductor structure 700 which illustrates assembly capabilities of multi-layer semiconductor structures including semiconductor structures of various sizes, shapes, types (e.g., superconducting and non-superconducting) and semiconductor package pitches (also referred to herein as "package pitches") is shown. Semiconductor structure 700 includes a first semiconductor structure 710, a second semiconductor structure 720, a third semiconductor structure 730 and a fourth semiconductor structure 740. Semiconductor structures 720, 730 and 740 are each provided on a same package level (i.e., a same bonding layer) of the multi-layer semiconductor structure 700, as will be discussed.

First semiconductor structure 710 (e.g., a superconducting PCB) has first and second opposing surfaces and includes a plurality of layers (here, five layers) in the illustrated embodiment. In particular, a first layer 711 (e.g., a first signal routing layer) has first and second opposing surfaces, with the first surface corresponding to the first surface of first semiconductor structure 710. Additionally, a second layer 712 (e.g., a first ground plane layer) has first and second opposing surfaces, with the first surface disposed over the second surface of first layer 711. A third layer 713 (e.g., a strip line routing layer) has first and second opposing surfaces, with the first surface disposed over the second surface of second layer 712. Additionally, a fourth layer 714 (e.g., a second ground plane layer) has first and second opposing surfaces, with the first surface disposed over the second surface of third layer 713. Further, a fifth layer 715 (e.g., a second ground plane layer) has first and second opposing surfaces, with the first surface disposed over the second surface of fourth layer 714 and the second surface corresponding to the second surface of first semiconductor structure 710.

Second semiconductor structure 720 (e.g., a radio frequency (RF) IC) has first and second opposing surfaces and is electrically coupled to the first semiconductor structure 710 though first interconnect structures 751, 751', 751" 751''', 751'''', 751'''''(e.g., microbumps). Second semiconductor structure 720 (e.g., a non-superconducting semiconductor structure) has a second package pitch, and the interconnect structures 751, 751', 751", 751''', 751'''', 751''''' each have one or more characteristics (e.g., dimensions) selected in accordance with the second package pitch. The interconnect structures 751, 751', 751", 751''', 751'''', 751''''' may be conventional interconnect structures (e.g., ball grid array (BGA) solder balls, controlled collapse chip connection (C4) bumps, Cu pillars, solder coated Cu micro pillars, and the like) or superconducting and/or partially superconducting interconnect structures according to the disclosure. Additionally, the interconnect structures 751, 751', 751", 751''', 751'''', 751''''' may additionally or alternatively be a very low resistance interconnect to reduce, or substantially minimize, heating effects.

Third semiconductor structure 730 (e.g., a superconducting IC) has first and second opposing surfaces and is electrically coupled to the first semiconductor structure 110 though second interconnect structures 752, 752', 752". Third semiconductor structure 730 has a third package pitch, and the interconnect structures 752, 752', 752" each have one or more characteristics selected in accordance with the third package pitch. Interconnect structures 752, 752', 752" are superconducting and/or partially superconducting interconnect structures according to the disclosure in embodiments in which the third semiconductor structure 730 is a superconducting IC.

Fourth semiconductor structure 740 (e.g., an amplifier circuit) has first and second opposing surfaces and is electrically coupled to the first semiconductor structure 110 though third interconnect structures 753, 753', 753". Fourth semiconductor structure 730 has a fourth package pitch, and the interconnect structures 753, 753', 753" each have one or more characteristics selected in accordance with the fourth package pitch. The interconnect structures 753, 753', 753" may be conventional interconnect structures or superconducting and/or partially superconducting interconnect structures according to the disclosure depending upon whether semiconductor structure 740 is a superconducting or a non-superconducting semiconductor structure.

In accordance with the concepts, systems, circuits, and techniques sought to be protected herein, by fabricating the multi-layer semiconductor structure 700 using a combination of interconnect structures (e.g., 751, 752, 753), the semiconductor structure 700 is provided having a number of semiconductor structures (e.g., 720, 730, 740) with various sizes, shapes and package pitches in a same layer of the semiconductor structure 700.

More particularly, FIG. 7 illustrates interconnect structures (e.g., microbumps) capable of combining a multi-die SOC (e.g., a multi-die SOC including semiconductor structures 720, 730, 740) and a superconducting PCB (e.g., semiconductor structure 710) into a single package (e.g., a single package of semiconductor structure 700). It is possible to use microbump technology having single microbumps (e.g., 751) for a finer pitch structure. Additionally, it is possible to use a multiple microbump array (e.g., 751-751"") for a larger pitch structure to provide for a semiconductor device (e.g., 100) which is capable of maintaining a finer pitch structure as well as a larger pitch structure in a same packaging layer.

Figure 8:
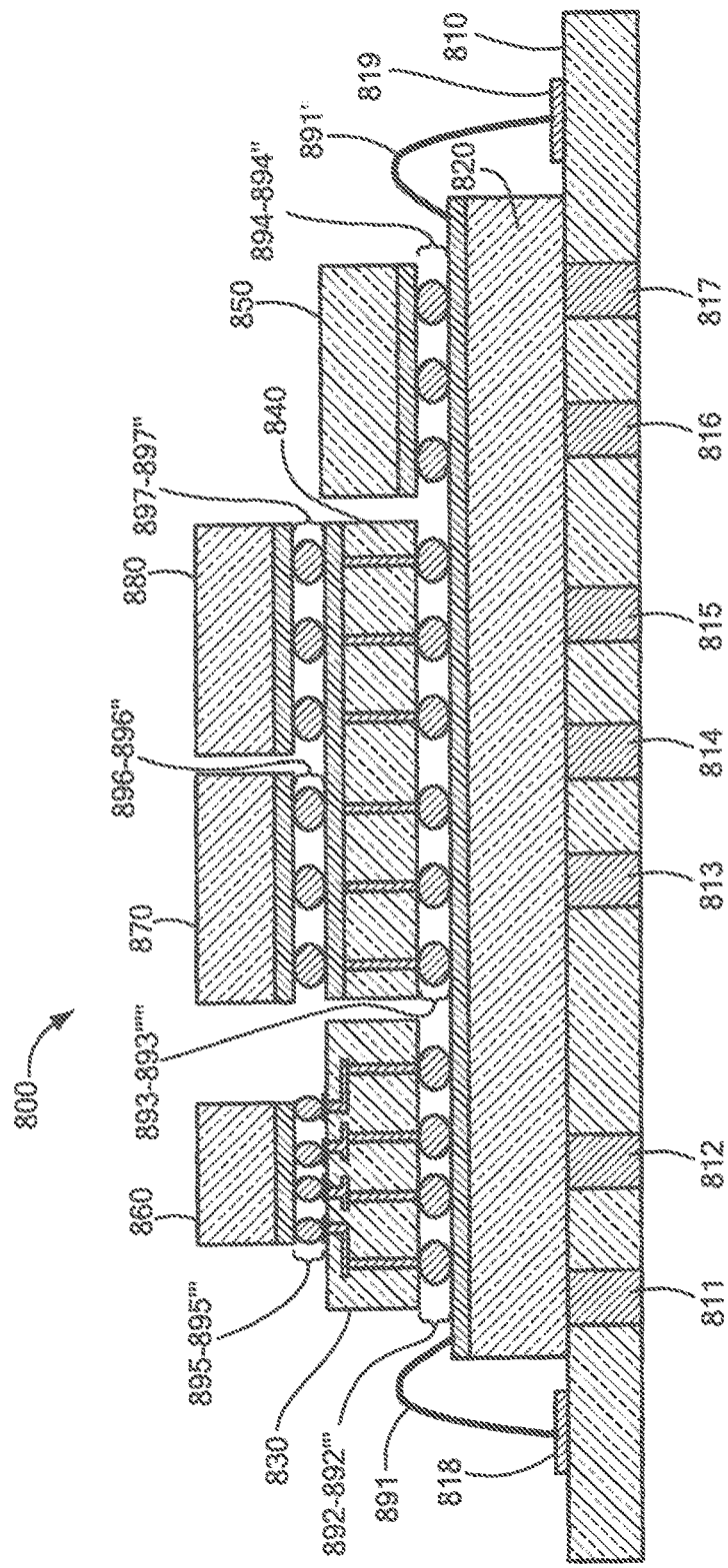
Figure 8A:
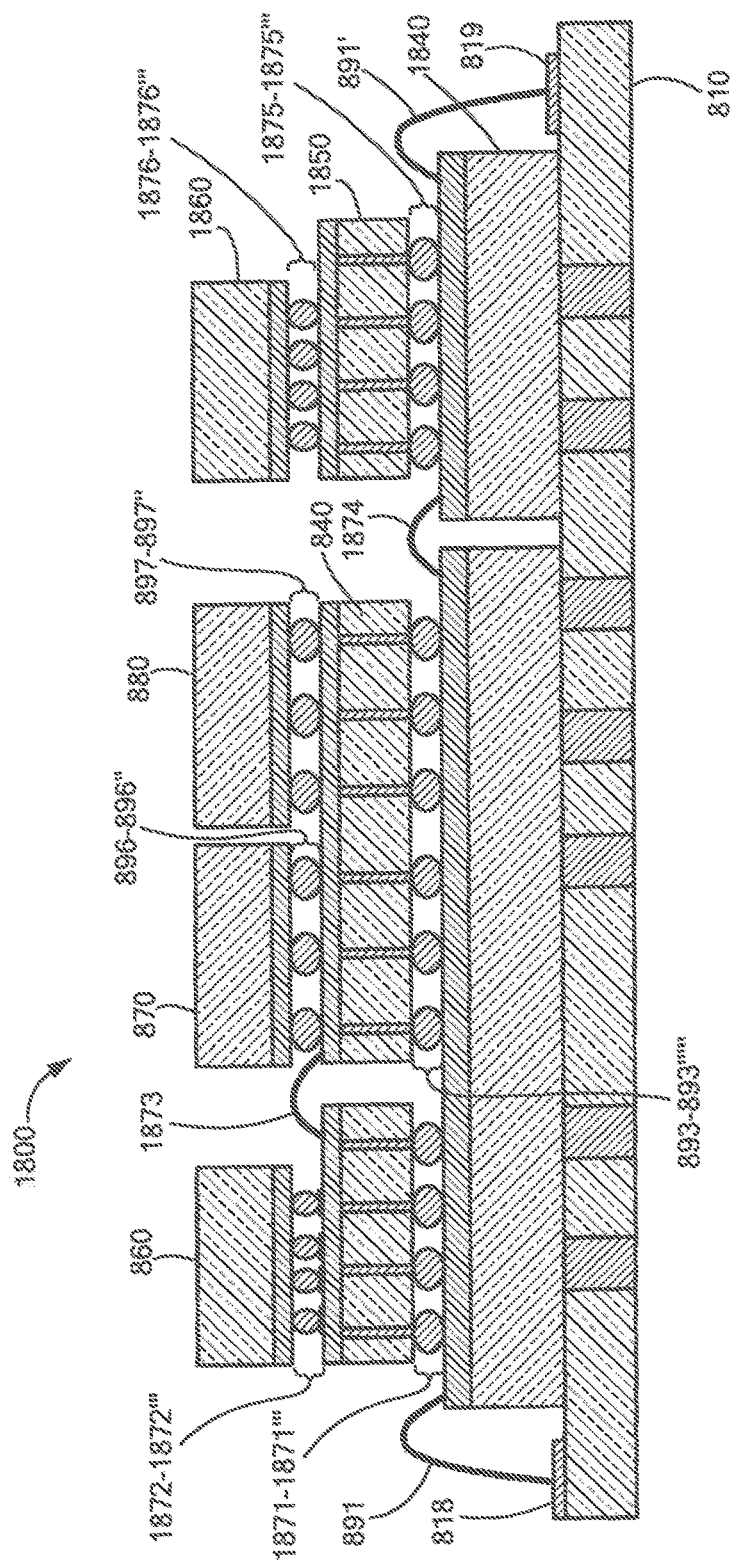

In one embodiment, the interconnect structures described above in conjunction with FIG. 7 (e.g., 751, 752, 753), and the interconnect structures described in conjunction with the FIGS. 8 and 8A (e.g., 892, shown in FIG. 8), may be provided as multi-die SoC interconnects. In one embodiment, the multi-die SoC interconnects each include a microbump and an under bump metallurgy (UBM) where the microbump is capable of reacting with at least part of the UBM at an interface to create a higher temperature melt interface. The interface may, for example, melt at a higher temperature than at least one of the components of the microbump and/or the UBM. It is also possible to create a concentration gradient at the interface which melts at a higher temperature than the microbump and/or UBM. In one embodiment, the microbump and the UBM grow together on a nano-grain low surface energy surface. Such may allow for the creation of a same diameter microbump and UBM (e.g., to maintain a high density, finer pitch). An interconnect pad to which the microbump and/or the UMB are coupled to or provided as part of may be fabricated to have a low surface energy, non wettable surface. Additionally, side walls of the interconnects (e.g., 751) may contain nano, sub-micro and micro grain/particle structures to prevent melt flow by reacting/diffusing with the low melt phase. In one embodiment, the interconnects are surrounded by a polymer matrix capable of reducing as well increasing viscosity at or below curing temperature until final curing.

Referring now to FIG. 8, another example multi-layer semiconductor structure 800 which illustrates assembly capabilities of multi-layer semiconductor structures including semiconductor structures of various sizes, shapes, types and package pitches on a same package level is shown. Semiconductor structure 800 includes a first semiconductor structure 810, a second semiconductor structure 820, a third semiconductor structure 830 and a fourth semiconductor structure 840. Semiconductor structure 800 also includes a fifth semiconductor structure 850, a sixth semiconductor structure 860, a seventh semiconductor structure 870 and an eighth semiconductor structure 880.

First semiconductor structure 810 (e.g., an organic and/or ceramic and/or glass substrate) has first and second opposing surfaces and includes a plurality of via structures (e.g., thermal vias) 811, 812, 813, 814, 815, 816, 817 extending between select portions of the first and second surfaces. The via structures may be filled, plated through hole vias, or cap plated, filled plated through hole vias, for example. First semiconductor structure 810 also includes a plurality of interconnect pads (here, two interconnect pads 818, 819), each of the interconnect pads 818, 819 having first and second opposing surfaces. A first surface of interconnect pad 818 is disposed over or beneath a first select portion of the second surface of first semiconductor structure 810 and may be electrically coupled to one or more first electrical connections in first semiconductor structure 810. Additionally, a first surface of interconnect pad 819 is disposed over or beneath a second select portion of the second surface of first semiconductor structure 810 and may be electrically coupled to one or more second electrical connections in first semiconductor structure 810.

Second semiconductor structure 820 (e.g., an MCM) has first and second opposing surfaces and is electrically coupled to one or more electrical connections in first semiconductor structure 810 through a plurality of wire bonding structures (here, wire bonding structures 891, 891'). Additionally, second semiconductor structure 820 may be coupled to second selected electrical connections in first semiconductor structure 810 through an array of microbumps (not shown). In particular, a first portion of wire bonding structure 891 is coupled to electrical connections on a second surface of second semiconductor structure 820, and a second opposing portion of wire bonding structure 891 is coupled to a second surface of interconnect pad 818 of first semiconductor 810. Additionally, a first portion of wire bonding structure 891' is coupled to electrical connections on a second surface of second semiconductor structure 820, and a second opposing portion of wire bonding structure 891' is coupled to a second surface of interconnect pad 819 of first semiconductor 810.

Further, an array of microbumps may be disposed between the second surface of the first semiconductor structure 810 and the first surface of second semiconductor structure 820 for electrically coupling the second semiconductor structure 820 to the one or more electrical connections (e.g., via structure 811) in the first semiconductor structure 810. In other words, the array of microbumps may substantially directly couple the second surface of the first semiconductor structure 810 to the first surface of second semiconductor structure 820 for electrically coupling the second semiconductor structure 820 to the electrical connections (e.g., 811) in the first semiconductor structure 810.

Third semiconductor structure 830 (e.g., an interposer) has first and second opposing surfaces and includes a plurality of electrical connections (e.g., vias or conductive paths) extending between select portions of the first and second surfaces. In one embodiment, the electrical connections are provided as through silicon via (TSV) structures. Third semiconductor structure 830 is electrically coupled to second semiconductor structure 820 through interconnect structures 892, 892', 892", 892'". Third semiconductor structure 830 may have a third package pitch, and one or more characteristics (e.g., dimensions) of the interconnect structures 892, 892', 892", 892'" may be selected based upon the third package pitch.

Fourth semiconductor structure 840 (e.g., an interposer) has first and second opposing surfaces and includes a plurality of electrical connections extending between select portions of the first and second surfaces. Fourth semiconductor structure 840 is electrically coupled to second semiconductor structure 820 through interconnect structures 893, 893', 893", 893'", 893"", 893""'. Fourth semiconductor structure 840 may have a fourth package pitch, and one or more characteristics of the interconnect structures 893, 893', 893", 893'", 893"", 893""' may be selected based upon the fourth package pitch.

Fifth semiconductor structure 850 (e.g., a single flux quantum (SFQ) chip) has first and second opposing surfaces and is electrically coupled to second semiconductor structure 820 through interconnect structures 894, 894', 894". Fifth semiconductor structure 850 may have a fifth package pitch, and one or more characteristics of the interconnect structures 894, 894', 894" may be selected based upon the fifth package pitch.

Sixth semiconductor structure 860 (e.g., a complementary metal-oxide-semiconductor (CMOS) structure) has first and second opposing surfaces and is electrically coupled to third semiconductor structure 830 through interconnect structures 895, 895', 895", 895'". Sixth semiconductor structure 860 may have a sixth package pitch, and one or more characteristics of the interconnect structures 895, 895', 895", 895'" may be selected based upon the sixth package pitch. In one embodiment, the sixth package is substantially less than the third package pitch associated with third semiconductor structure 830. It follows that the interconnect structures 895, 895', 895", 895'" used to electrically couple the sixth semiconductor structure 860 to the third semiconductor structure 860 may have dimensions which are smaller than that of the interconnect structures 892, 892', 892", 892"" used to electrically couple the third semiconductor structure 830 to the second semiconductor structure 820.

Seventh semiconductor structure 870 (e.g., a superconducting IC) has first and second opposing surfaces and is electrically coupled to a first portion of fourth semiconductor structure 840 through interconnect structures 896, 896', 896". Seventh semiconductor structure 870 may have a seventh package pitch, and one or more characteristics of the interconnect structures 896, 896', 896" may be selected based upon the seventh package pitch.

Eighth semiconductor structure 880 (e.g., a superconducting IC) has first and second opposing surfaces and is electrically coupled to a second portion of fourth semiconductor structure 840 through interconnect structures 897, 897', 897". Eighth semiconductor structure 880 may have an eighth package pitch, and one or more characteristics of the interconnect structures 897, 897', 897" may be selected based upon the eighth package pitch. At least one of the seventh and eighth semiconductor structures 870, 880 is electrically coupled to selected ones of the electrical connections (e.g., TSVs) in fourth semiconductor structure 840 to provide electrical isolation and increased connectivity complexity For example, semiconductor structure 820 (e.g., an MCM) may have lossy materials that might impact qubit performance and semiconductor structure 840. Keeping qubit chips (870, 880) away from MCM 820 may, for example, provide sufficient isolation. In one example, electrical connections through TSVs of 840 are used for biasing qubits.

In particular, at least one of the seventh and eighth semiconductor structures 870, 880 may be electrically coupled to the electrical connections in fourth semiconductor structure 840 through one or more first interconnect structures (e.g., 896). Additionally, the electrical connections in the fourth semiconductor structure 840 may be electrically coupled to the second semiconductor structure 820 through one or more second interconnect structures (e.g., 893).

Similar to FIG. 7, FIG. 8 illustrates interconnect structures (e.g., microbumps) capable of combining a plurality of multi-die SOCs (here, a first multi-die SOC including semiconductor structures 830, 860, and a second multi-die SOC including semiconductor structures 840, 870, 880) and a plurality of other semiconductor structures (here, semiconductor structures 810, 820) into a single package (e.g., a single package of semiconductor structure 800). Semiconductor structure 800 includes semiconductor structures having a variety of package pitches (e.g., third, fourth and fifth package pitches), as discussed above. It is possible to use microbump technology having single microbumps (e.g., 892) for a finer pitch structure. Additionally, it is possible to use a multiple microbump array (e.g., 892-892'") for a larger pitch structure to provide for a multi-layer semiconductor structure (e.g., 800) which is capable of maintaining a finer pitch structure as well as a larger pitch structure in a same packaging layer.

Referring now to FIG. 8A, in which like elements of FIG. 8 are provided having like reference designations, another example multi-layer semiconductor structure 1800 is provided in the form of a multi-die superconducting IC package. Semiconductor structure 800 includes first semiconductor structure 810, a second semiconductor structure 1810, a third semiconductor structure 1820 and semiconductor structure 840 (here, a fourth semiconductor structure 840). Semiconductor structure 1800 also includes a fifth semiconductor structure 1830, semiconductor structure 870 (here, a sixth semiconductor structure 870) and semiconductor structure 880 (here, a seventh semiconductor structure 880). Semiconductor structure 1800 further includes an eighth semiconductor structure 1840, a ninth semiconductor structure 1850 and a tenth semiconductor structure 1860.

In the illustrated embodiment, semiconductor structures 1820, 1830 take the form of a first multi-die SOC. Additionally, semiconductor structures 840, 870, 880 take the form of a second multi-die SOC and semiconductor structures 1850, 1860 take the form of a third multi-die SOC. In the first multi-die SOC, semiconductor structure 1830 (e.g., a superconducting IC) is electrically coupled to semiconductor structure 1820 through interconnect structures 1872, 1872', 1872", 1872'". Additionally, in the second multi-die SOC, semiconductor structure 870 is electrically coupled to semiconductor structure 840 through interconnect structures 896, 896', 896" and semiconductor structure 880 is electrically coupled to semiconductor structure 840 through interconnect structures 897, 897', 897". Further, in the third multi-die SOC, semiconductor structure 1860 (e.g., a superconducting IC) is electrically coupled to semiconductor structure 1850 through interconnect structures 1876, 1876', 1876", 1876'".

First multi-die SOC is electrically coupled to semiconductor structure 1810 (e.g., an MCM) through interconnect structures 1871, 1871', 1871", 1871'". Additionally, the second multi-die SOC is electrically coupled to semiconductor structure 1810 through interconnect structures 893, 893', 893", 893'", 893"", 893""'. The second multi-die SOC is also electrically coupled to the first multi-die SOC through a superconducting wire bond 1873.

Third multi-die SOC is electrically coupled to semiconductor structure 1840 (e.g., an MCM) through interconnect structures 1875, 1875', 1875", 1875'". Additionally, the semiconductor structure 1840 is electrically coupled to semiconductor structure 1810 through a superconducting wire bond 1874. In one aspect of the disclosure, with the superconducting wire bond 1874, it is possible to increase MCM size without affecting MCM yield.

Semiconductor structure 1810 is electrically coupled to semiconductor structure 810 through a wire bond 891 and, optionally, through an array of microbumps which are disposed between a first surface of semiconductor structure 1810 and a second surface of semiconductor structure 810. Additionally, semiconductor structure 1840 is electrically coupled to semiconductor structure 810 through a wire bond 891' and, optionally, through an array of microbumps which are disposed between a first surface of semiconductor structure 1840 and a second surface of semiconductor structure 810.

Each of the semiconductor structures (e.g., 1820) has an associated package pitch and the interconnect structures (e.g., 1871) used to couple the semiconductor structures together may have one or more characteristics associated with the package pitches. It follows that semiconductor structure 1800 may be provided having semiconductor structures with a plurality of package pitches.

Superconducting wirebonding may, for example, help to create electrical coupling between Qubit 860 to qubit 870. For example, qubit 860 may have to go through MCM 1810 to electrically couple to Qubit 870 without superconducting wirebonding. However, with superconducting wirebonding, qubit 860 can electrically couple to qubit 870 through interposer 840. Superconducting wirebonding is critical for large scale integration. It is possible to assemble individual chip stack and used superconducting wirebonding to increase superconducting path and connectivity.

In order to accommodate large number of superconducting chips or semiconductor structures, a large scale integration approach (such as that shown in FIGS. 8 and 8A) was developed to enable circuit functionalities and complexities required for quantum computing. An example advantage of microbump technology is the ability to attach multiple, multilayer, superconducting chip having different sizes on a large superconducting MCM.

For example, large SMCM and microbump technology generally favor convergence of chip carrier and board and also eliminate multi-level assembly to provide unique miniaturized solutions for next generation complex cryogenic qubit packaging for possible quantum computing. Large passive superconducting substrates horizontally connect multiple superconducting chips, with IC scale electrical routing between the chips. Superconducting substrate are used to route power and signal from the multilayer superconducting substrate to the chips through microbumps. The superconducting MCM used wirebonding to attach to the circuit card and the circuit card attached to the control electronics.

Cryogenic qubit package miniaturization integrates designs including Component Footprint Reduction, Active and Passive Components, I/O Miniaturization, high Density superconducting MCM Technologies, IC Assembly Capabilities etc. Our advanced cryogenic packaging solution is useful to achieve significant reductions in size and weight. The design feature enabling the most significant size and weight reduction is component footprint reduction. Superconducting active components are available in bare die flip-chip format which provides the most leverage for size and weight reduction. Superconducting MCM and TSV is available in wirebond attach format. Superconducting wirebonding between high density superconducting MCM and or TSV substrate may reduce electrical path for electrical coupling between superconducting chips, such as those shown in FIG. 8A.

Passive discrete components can be manipulated for miniaturization. A bill of materials review can identify surface mount capacitors, resistors, inductors, etc. where package size reduction and enhanced electrical performance is possible by replacing surface passive components with internally embedded components. Connectors are classified as I/O components can occupy significant volume and mass to an assembly. Replace pin-in-hole connectors with a low-profile surface mount connectors is a common miniaturization technique for cryogenic qubit packaging.

Referring now to FIGS. 9-9D, example semiconductor structures as may be provided in an example method for fabricating a multi-layer semiconductor structure (e.g., 900, shown in FIG. 9D) in accordance with the concepts, systems, circuits and techniques sought to be protected herein are shown. While FIGS. 9-9D are illustrated to comprise a sequence of processes, the example method is not limited to performing the illustrated processes in the sequence shown.

Referring now to FIG. 9, an example semiconductor structure 910 as may be provided in an example multi-layer semiconductor structure (e.g., semiconductor structure 900, as will be discussed) including a superconducting integrated circuit (e.g., semiconductor structure 950, as will be discussed) is shown. Semiconductor structure 910 (e.g., an MCM) has first and second opposing surfaces and an associated first package pitch. A plurality of interconnect structures (here, interconnect structures 921, 921', 921", 921'", 921"", 921""') are disposed over the second surface of semiconductor structure 910 for coupling the semiconductor structure 910 to one or more other semiconductor structures.

Each of the interconnect structures 921, 921', 921", 921'", 921"", 921""' may be electrically coupled to one or more electrical connections in semiconductor structure 910. Additionally, each of the interconnect structures 921, 921', 921", 921'", 921"", 921""' may have one or more characteristics (e.g., dimensions) selected based upon the first package pitch or a package pitch associated with the semiconductor structure(s) to which the semiconductor structure 910 may be coupled. First semiconductor structure 910 shown in FIG. 9 may be referred to as a so-called "bumped semiconductor structure" due to the first semiconductor structure 910 being "bump" bonded to interconnect structures 921, 921', 921", 921'" 921"" 921""'.

Referring to FIG. 9A, in which like elements of FIG. 9 are shown having like reference designations, semiconductor structure 910 (here, a first semiconductor structure 910) is electrically coupled to a second semiconductor structure 930 (e.g., a TSV substrate) through the interconnect structures

921, 921', 921", 921'", 921"", 921""'. In particular, the interconnect structures 921, 921', 921", 921'", 921"", 921""' are disposed between the second surface of first semiconductor structure 910 and a first surface of second semiconductor structure 930 and may electrically couple one or more electrical connections in the first semiconductor structure 910 to one or more electrical connections in the second semiconductor structure 930.

Second semiconductor structure 930 may have a second package pitch and the interconnect structures 921, 921', 921", 921'", 921"", 921""' may have one or more characteristics selected based on the first package pitch and/or the second package pitch. In one embodiment, second semiconductor structure 930 is electrically coupled to the first semiconductor structure 910 through a flip chip process (e.g., for system level integration). Additionally, in one embodiment, it is possible to use a temporary bonding and debonding process for electrically coupling (or bonding) second semiconductor structure 930 to the first semiconductor structure 910. In one example, interconnect structures 921, 921', 921", 921'", 921"", 921""' "bump" semiconductor structure 930 and 910 with a UBM and a wet-chemical and or dry (e.g. plasma) cleaning treatment is used prior to flip-chip bump bonding to create the structure shown in FIG. 9B. It should, of course, be appreciated that a variety of interconnect structures 921, 921', 921", 921'", 921"", 921""' (e.g., microbumps) may be used for bump bonding.

Referring to FIG. 9B, an optional "underfill" material 940 (e.g., an electrically-insulating material such as anisotropic conductive paste (ACP)) is disposed between the second surface of the first semiconductor structure 910 and the first surface of the second semiconductor structure 930. In one embodiment, the underfill material 940 may be dispensed around at a temperature of about sixty degrees Celsius (C.). Viscosity of the underfill material 940 will be very low at the temperature of about sixty degrees C., resulting in capillary action to fill gaps between surfaces of the first and second semiconductor structures 910, 930. In one embodiment, the underfill material 940 protects the interconnect structures 921, 921', 921", 921'", 921"", 921""' during Indium (In) lithography in embodiments in which the interconnect structures 921, 921', 921", 921'", 921"", 921""' include In. The underfill material 940 may also protect the interconnect structures 921, 921', 921", 921'", 921"", 921""' in embodiments in which the first semiconductor structure 910 and/or the second semiconductor structure 930 are bonded to another semiconductor structure, as shown in FIG. 9C, for example. In one example, the underfill material 940 is pre applied or post applied using a cryogenically stable underfill.

Referring to FIG. 9C, a third semiconductor 950 (e.g., a superconducting IC) which may be coupled to the semiconductor structures shown in FIG. 9B is shown. Third semiconductor structure 950 has first and second opposing surfaces and an associated third package pitch. A plurality of interconnect structures (here, interconnect structures 961, 961', 961", 961'", 961"") are disposed over the first surface of third semiconductor structure 950 for coupling the third semiconductor structure 950 to one or more other semiconductor structures (e.g., 930, as will be discussed).

Each of the interconnect structures 961, 961', 961", 961'", 961"" (e.g., superconducting or partially superconducting interconnects) may be electrically coupled to one or more electrical connections in third semiconductor structure 950. Additionally, each of the interconnect structures 961, 961', 961", 961'", 961"" may have one or more characteristics (e.g., dimensions) selected based upon the third package pitch or a package pitch associated with the semiconductor structure(s) to which the semiconductor structure 950 may be coupled. Third semiconductor structure 950 shown in FIG. 9C may be referred to as a so-called "bumped Qubit" or "bumped superconducting IC" due to the third semiconductor structure 950 being "bump" bonded to interconnect structures 961, 961', 961", 961'", 961"".

Referring to FIG. 9D, in which like elements of FIGS. 9B and 9C are shown having like reference designations, third semiconductor structure 950 is electrically coupled to second semiconductor structure 930 (e.g., an industry standard TSV chip) to form a multi-layer semiconductor structure 900 including semiconductor structures 910, 930, 950. In particular, third semiconductor structure 950 is electrically coupled (e.g., bump bonded) to second semiconductor structure 930 in a single bonding cycle through interconnect structures 961, 961', 961", 961'", 961"". Interconnect structures 961, 961', 961", 961'", 961"" are disposed between the second surface of second semiconductor structure 930 and the first surface of third semiconductor structure 950 and may electrically couple one or more electrical connections in the third semiconductor structure 950 to one or more electrical connections in the second semiconductor structure 930. In one embodiment, third semiconductor structure 950 is electrically coupled to the second semiconductor structure 930 through a flip chip process.

In one aspect of the disclosure, FIGS. 9-9D illustrate an example method of fabricating a cryogenic package. The cryogenic package may, for example, include a superconducting integrated circuit having first and second opposing surfaces. Each of the first and second opposing surfaces may have a first circuit including a plurality of electrical conductors disposed thereon. Additionally, the superconducting integrated circuit may include one or more superconducting micro bumps disposed on at least one UBM pad (e.g., interconnect pads) which is disposed on the first and second surfaces of the superconducting integrated circuit.

The cryogenic package may also include a superconducting module and/or a metal module (e.g., a conventional metal module) having first and second opposing surfaces. Each of the first and second surfaces of the superconducting module and/or the metal module may have a second circuit including a plurality of electrical conductors disposed thereon. The superconducting module and/or the metal module may also include one or more superconducting micro bumps disposed on at least one UBM pads (e.g., interconnect pads) which is disposed on the first and second surfaces of the superconducting module and/or the metal module.

The cryogenic package may additionally include an interposer disposed substantially between the superconducting integrated circuit and the superconducting module and/or the metal module. The interposer may include one or more UBM pads (e.g., interconnect pads) disposed on the first and second surfaces of the interposer.

The superconducting module may having micro bumps disposed on the first surface of the superconducting module and bonded with at least one of the first with the second surfaces of the interposer to create an electrical and/or mechanical interconnect between the superconducting module and the interposer. Additionally, the superconducting integrated circuits may having micro bumps disposed on second surfaces of the superconducting integrated circuits and bonded with at least one of the first and second surfaces of the interposer to create an electrical and/or mechanical interconnect between the superconducting integrated circuits and the interposer.

The method of fabricating the cryogenic package may further include: at least a first reflow process and/or an underfill curing process after first micro bump bonding and before second micro bump bonding. It is further possible that at least a second reflow process and/or an overmold process is performed after second micro bump bonding. Additionally, it is possible to use a lower temperature second reflow process instead of (or in addition to) the first reflow process. It is further possible for the method to include a process of removing of temporary mount from the first surface of the interposer after underfill curing and before second micro bump bonding to create the structure shown in FIG. 9D.

The "bumped" semiconductor structure 910 (e.g., an MCM) shown in FIG. 9, can have a dry underfill material pre-applied on the first surface of superconducting module mount before first micro bump bonding to create the structure shown in FIG. 9B.

In one example, semiconductor structure 910 shown in FIG. 9 has at least a 15 micron or less diameter micro bump (e.g., 921, 921") which is less than about 20 microns tall (with "tall" referring to a distance between first and second opposing portions of the micro bump). The micro bump may become less than about 8 micron tall after the first and/or second bonding processes/cycles to produce the structure shown in FIG. 9B and/or FIG. 9D, for example.

In another example, semiconductor structure 910 shown in FIG. 9 has at least one more than 15 micron or less than 35 micron diameter micro bump (e.g., 921, 921") which is less than about 50 microns tall. The micro bump may become less than about 25 micron tall after the first and/or second bonding processes/cycles to produce the structure shown in FIG. 9B and/or in FIG. 9D. In one embodiment, a dry and/or wet chemical treatment can be applied to the micro bumps (and/or the semiconductor structure 910) before the first and/or second bonding processes/cycles. Examples characteristics (or parameters) of a micro bump bonding process/cycle include: temperature ranges from about room temperature to about 150 degree Celsius with 0.1 gram to 20 gram force per micro bump, and there being at least 100 micro bumps per bonding process/cycle. Such may be suitable for creating the structures shown in FIG. 9B and/or FIG. 9D.

Referring now to FIGS. 10-10D, in which like elements of FIGS. 9-9D are shown having like reference designations, example semiconductor structures as may be provided in another example method for fabricating multi-layer semiconductor structure 900 is shown. Similar to FIGS. 9-9D, while FIGS. 10-10D are illustrated to comprise a sequence of processes, the example method is not limited to performing the illustrated processes in the sequence shown.

Referring now to FIG. 10, an example semiconductor structure 910 as may be provided in an example multi-layer semiconductor structure (e.g., semiconductor structure 900) including a superconducting integrated circuit (e.g., semiconductor structure 950) is shown. Semiconductor structure 910 has first and second opposing surfaces and an associated first package pitch. Additionally, a plurality of interconnect structures (here, interconnect structures 921, 921', 921", 921''', 921'''', 921''''') are disposed over the second surface of semiconductor structure 910 for coupling the semiconductor structure 910 to one or more other semiconductor structures.

Referring to FIG. 10A, in which like elements of FIG. 10 are shown having like reference designations, semiconductor structure 910 (here, a first semiconductor structure 910) is electrically coupled to a second semiconductor structure 930 through the interconnect structures 921, 921', 921", 921''', 921'''', 921'''''. Referring also to FIG. 10B, an optional "underfill" material 940 is disposed between the second surface of the first semiconductor structure 910 and the first surface of the second semiconductor structure 930.

Referring to FIG. 100, a plurality of interconnect structures (here, interconnect structures 961, 961', 961", 961''', 961'''') are disposed over the second surface of second semiconductor structure 930 for coupling the second semiconductor structure 930 to one or more other semiconductor structures (e.g., semiconductor structure 950, as will be discussed). Each of the interconnect structures 961, 961', 961", 961''', 961'''' may be electrically coupled to one or more electrical connections in second semiconductor structure 930. Additionally, each of the interconnect structures 961, 961', 961", 961''', 961'''' may have one or more characteristics (e.g., dimensions) selected based upon the second package pitch of second semiconductor structure 930.

Additionally or alternatively, the interconnect structures 961, 961', 961", 961''', 961'''' may have one or more characteristics selected based upon a package pitch associated with the semiconductor structure(s) to which the second semiconductor structure 930 may be coupled. Second semiconductor structure 930 shown in FIG. 100 may be referred to as a so-called "bumped semiconductor structure" due to the second semiconductor structure 930 being "bump" bonded to interconnect structures 961, 961', 961", 961''', 961''''.

Referring to FIG. 10D, third semiconductor structure 950 (here, an "un-bumped Qubit" or "un-bumped superconducting IC") is electrically coupled to second semiconductor structure 930 to form multi-layer semiconductor structure 900. In particular, third semiconductor structure 950 is electrically coupled (e.g., bump bonded) to second semiconductor structure 930 in a single bonding cycle by coupling the first surface of third semiconductor structure 950 to interconnect structures 961, 961', 961", 961''', 961''''. Interconnect structures 961, 961', 961", 961''', 961'''' are disposed between the second surface of second semiconductor structure 930 and the first surface of third semiconductor structure 950 and may electrically couple one or more electrical connections in the third semiconductor structure 950 to one or more electrical connections in the second semiconductor structure 930. In one embodiment, third semiconductor structure 950 is electrically coupled to the second semiconductor structure 930 through a flip chip process.

In one embodiment, the bonding approach used to fabricate the semiconductor structures shown in FIGS. 9-9D is preferable over the bonding approach used to fabricate the semiconductor structure shown in FIGS. 10-10D. In the bonding approach used to fabricate the semiconductor structures shown in FIGS. 10-10D, bumps are created on the TSV after bonding which can be very difficult in some embodiments. The bonding approach used to fabricate the semiconductor structures shown in FIGS. 9-9D may also be preferable over the bonding approach used to fabricate the semiconductor structures shown in FIGS. 12-12C, as will be discussed further below.

The bonding approach used to fabricate the semiconductor structures shown in FIGS. 9-9D can, for example, handle industry standard thin (e.g., about 100 um) TSV chip. It is possible to use temporary bonding and debonding for TSV chip and Qubit will experience one bonding cycle. However, the Qubit may experience additional bumping processes.

The bonding approach used to fabricate the semiconductor structures shown in FIGS. 10-10D can handle industry standard thin (100 um) TSV chip. It is possible to use temporary bonding and deboning or TSV chip and Qubit will experience one bonding cycle. However, the bonded TSV chip will require additional bumping processes/cycles.

Figure 12:
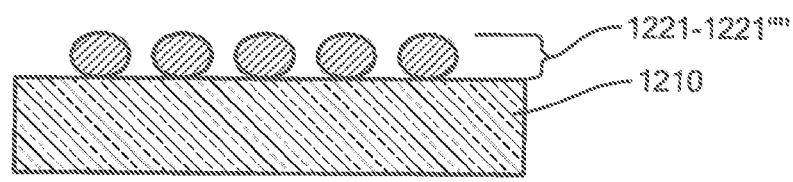
FIGS. 12-12C are block diagrams of example semiconductor structures as may be provided in an example method for fabricating a multi-layer semiconductor structure in accordance with an embodiment.
Figure 12A:
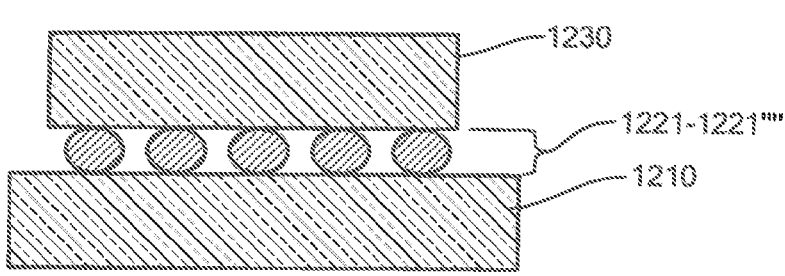
Figure 12B:
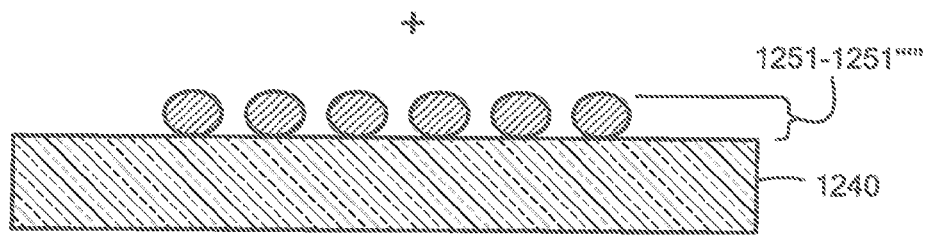
Figure 12C:
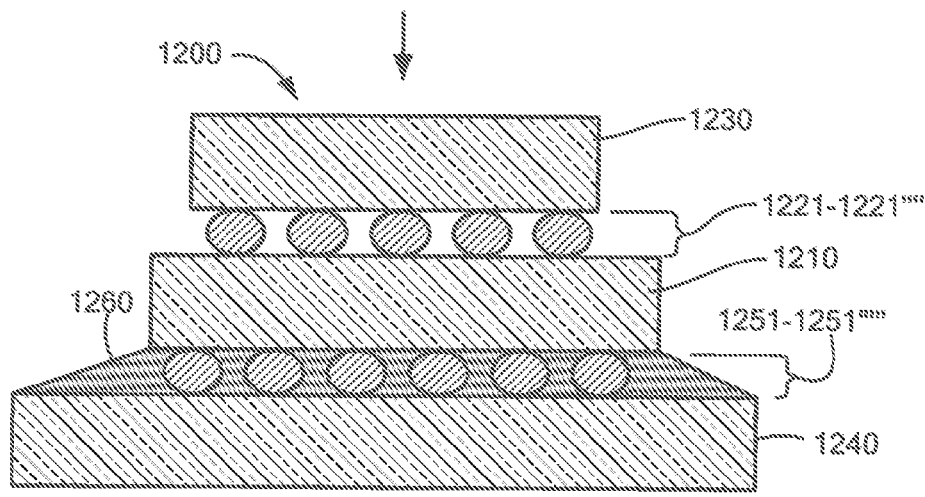

In one embodiment, the bonding approach used to fabricate the semiconductor structures shown in FIGS. 12-12C prefers to handle thick (>200 um) TSV for bumping. It is possible to use a temporary bonding and debonding process for a TSV chip or wafer but a Qubit may experience two bonding cycles and the wafer (e.g., a~200 um thick 8 inch TSV wafer) may experience additional bumping or bonding process/cycles (which may be undesirable in some embodiments).

Figure 11:
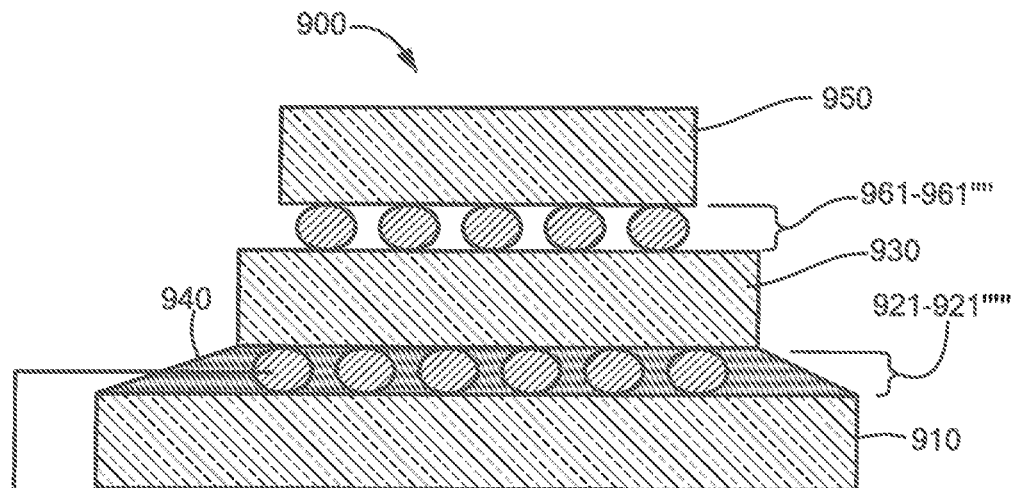
FIGS. 11 and 11A are block diagrams of example semiconductor structures fabricated using interconnect structures according to the disclosure.
Figure 11A:
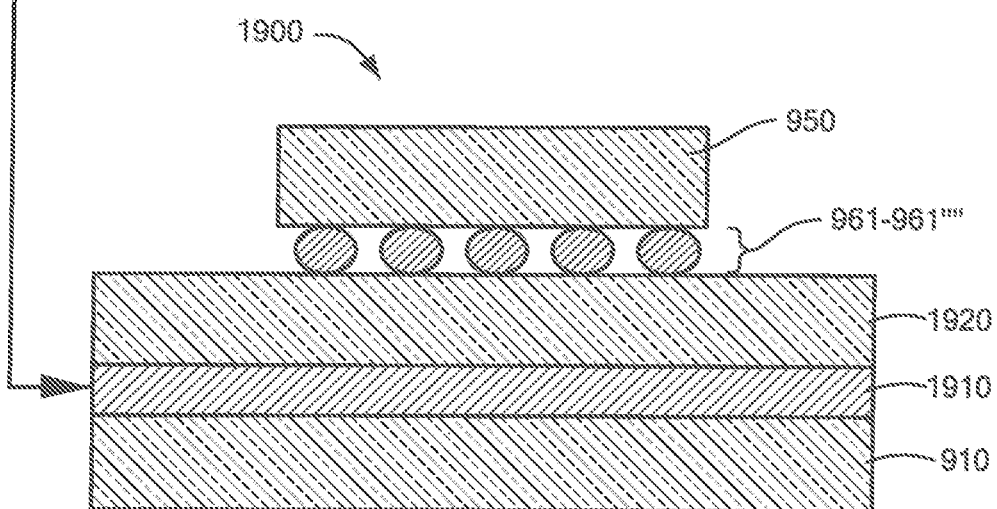

Referring to FIGS. 11 and 11A, in which like elements of FIG. 10D are shown having like reference designations, various configurations of multi-layer semiconductor structures including a superconducting IC are shown. In particular, in FIG. 11, a multi-layer semiconductor structure 900 is shown to include first semiconductor structure 910, second semiconductor structure 930 and third semiconductor structure 950 (here, a superconducting IC). Second semiconductor structure 930 is electrically coupled to first semiconductor structure 910 through interconnect structures 921, 921', 921", 921''', 921'''', 921'''''. Additionally, third semiconductor structure 950 is electrically coupled to second semiconductor structure 930 through interconnect structures 961, 961', 961", 961''', 961''''. An optional "underfill" material 940 is disposed between the second surface of the first semiconductor structure 910 and the first surface of the second semiconductor structure 930.

In FIG. 11A, a multi-layer semiconductor structure 1900 is shown to include first semiconductor structure 910, an oxide bonding layer 1910, a substrate 1920 and third semiconductor structure 950 (here, a superconducting IC). The oxide bonding layer 1910 has first and second opposing surfaces, with the first surface disposed over the second surface of first semiconductor structure 910. Additionally, the substrate 1920 has first and second opposing surfaces and includes a plurality of via structures (e.g., TSV, via first, or via last) (not shown) disposed between select portions of the first and second surfaces. The first surface of substrate 1920 is disposed over the second surface of oxide bonding layer 1910, and the substrate 1920 may be bonded to first semiconductor structure 910 through oxide bonding layer 1910. The oxide bonding layer 1910 may, for example, be formed using via last techniques similar to that which was described above in connection with FIG. 6B. Additionally, the oxide bonding layer 1910 may function in a same or similar manner as interconnect structures 921, 921', 921", 921''', 921'''', 921''''', as further described below.

A plurality of interconnect structures (here, interconnect structures 961, 961', 961", 961''', 961'''') are disposed between the second surface of substrate 1920 and the first surface of third semiconductor structure 950 for coupling the substrate 1920 to third semiconductor structure 950 in a single bonding cycle. In particular, each of the interconnect structures 961, 961', 961", 961''', 961'''' may be electrically coupled to one or more of the via structures in substrate 1920. Additionally, each of the interconnect structures 961, 961', 961", 961''', 961'''' may be electrically coupled to one or more electrical connections in third semiconductor structure 950. In one embodiment, third semiconductor structure 950 is bump bonded to one or more of the interconnect structures 961, 961', 961", 961''', 961'''' prior to being coupled to substrate 1920.

In one aspect of the disclosure, oxide bonding layer 1910 may be used as an interconnect structure for coupling two semiconductor structures together. In other words, one or more conductive structures (not shown) in oxide bonding layer 1910 of FIG. 11A may be used to replace interconnect structures such as interconnect structures 921, 921', 921", 921''', 921'''', 921''''' shown in FIG. 11. In one example embodiment, the conductive structures may have a diameter between about one and about two micrometers and be able to produce very high density, finer pitch interconnect structures which may not be possible by interconnect structures 921, 921', 921", 921''', 921'''', 921''''' shown in FIG. 11.

Additionally, in one aspect of the disclosure, FIG. 11A illustrates an interposer (e.g., 1920) having a TSV and/or a via first and/or via last in a cryogenic package. A method of coupling of a first surface of a superconducting module (e.g., 910) to a second surface (e.g., a second surface) of the interposer in the cryogenic package may include: deposition of a single and/or multiple layer of an oxide material and etching a via through the oxide material to expose a UBM or pads (e.g., interconnect pads) which may be provided on a first surface of the superconducting module and/or a second surface of the interposer.

The method may also include: depositing a micro bump material on the UBM or pads of the first surface of the superconducting module and the second surface of the interposer. The method may additionally include: planarizing and chemical treating the second surface of the interposer. The method may further include: planarizing and chemical treating the first surface of superconducting module. The method may also include: coupling the second surface of the interposer to the first surface of a superconducting module to form one or more electrical connections between first and second ones of the at least two structures (e.g., 910, 1920, 950) of the cryogenic package.

As illustrated above, there are many ways in which a multi-layer semiconductor structure (e.g., 900, 1900) including a superconducting IC may be formed using interconnect structures (e.g., 961) according disclosure.

Referring now to FIGS. 12-12C, example semiconductor structures as may be provided in an example method for fabricating a multi-layer semiconductor structure (e.g., 1200, shown in FIG. 12C) in accordance with the concepts, systems, circuits and techniques sought to be protected herein are shown. While FIGS. 12-12C are illustrated to comprise a sequence of processes, the example method is not limited to performing the illustrated processes in the sequence shown.

Referring now to FIG. 12, an example semiconductor structure 1210 as may be provided in an example multi-layer semiconductor structure (e.g., semiconductor structure 1200, as will be discussed) including a superconducting integrated circuit (e.g., semiconductor structure 950, as will be discussed) is shown. Semiconductor structure 1210 (e.g., a "bumped" TSV substrate) has first and second opposing surfaces and an associated first package pitch. Semiconductor structure 1210 may also have an associated thickness (e.g., a thickness of about 200 micrometers (um)) between the first and second surfaces.

A plurality of interconnect structures (here, interconnect structures 1221, 1221', 1221", 1221''', 1221'''') are disposed over the second surface of semiconductor structure 1210 for coupling the semiconductor structure 910 to one or more other semiconductor structures. Each of the interconnect structures 1221, 1221', 1221", 1221''', 1221'''', 1221''''' (e.g., superconducting or partially superconducting interconnects) may be electrically coupled to one or more electrical connections in semiconductor structure 1210. Additionally, each of the interconnect structures 1221, 1221', 1221", 1221''', 1221'''', 1221''''' may have one or more characteristics (e.g., dimensions) selected based upon the first package pitch or a package pitch associated with the semiconductor structure(s) to which the semiconductor structure 1210 may be coupled.

Referring to FIG. 12A, in which like elements of FIG. 12 are shown having like reference designations, a second semiconductor structure 1230 (here, an "un-bumped Qubit" or "un-bumped superconducting IC") is electrically coupled to semiconductor structure 1210 (here, a first semiconductor structure 121) through the interconnect structures 1221, 1221', 1221", 1221''', 1221''''. In particular, second semiconductor structure 1230 is electrically coupled (e.g., bump bonded) to first semiconductor structure 1210 in a first bonding cycle (of two bonding cycles) by coupling the first surface of second semiconductor structure 1230 to interconnect structures 1221, 1221', 1221", 1221''', 1221''''.

Interconnect structures 1221, 1221', 1221", 1221''', 1221'''' may electrically couple one or more electrical connections in the second semiconductor structure 1230 to one or more electrical connections in the first semiconductor structure 1210. In one embodiment, it is possible to use a temporary bonding and debonding process for electrically coupling (or bonding) second semiconductor structure 1230 to the first semiconductor structure 1210.

Referring to FIG. 12B, a third semiconductor 1240 (e.g., an MCM) which may be coupled to the semiconductor structures shown in FIG. 12A is shown. Third semiconductor structure 1240 has first and second opposing surfaces and an associated third package pitch. A plurality of interconnect structures (here, interconnect structures 1251, 1251', 1251", 1251''', 1251'''', 1251''''') are disposed over the second surface of third semiconductor structure 1240 for coupling the third semiconductor structure 1240 to one or more other semiconductor structures (e.g., 1210, as will be discussed).

Each of the interconnect structures 1251, 1251', 1251", 1251''', 1251'''', 1251''''' may be electrically coupled to one or more electrical connections in third semiconductor structure 1240. Additionally, each of the interconnect structures 1251, 1251', 1251", 1251''', 1251'''', 1251''''' may have one or more characteristics (e.g., dimensions) selected based upon the third package pitch or a package pitch associated with the semiconductor structure(s) to which the semiconductor structure 1240 may be coupled. Third semiconductor structure 1240 shown in FIG. 12B may be referred to as a so-called "bumped semiconductor structure" or a "bumped MCM" due to the third semiconductor structure 1240 being "bump" bonded to interconnect structures 1251, 1251', 1251", 1251''', 1251'''', 1251'''''.

Referring to FIG. 12C, in which like elements of FIGS. 12A and 12B are shown having like reference designations, third semiconductor structure 1240 is electrically coupled to first semiconductor structure 1210 to form a multi-layer semiconductor structure 1200 including semiconductor structures 1210, 1230, 1240. In particular, third semiconductor structure 1240 is electrically coupled (e.g., bump bonded) to first semiconductor structure 1210 in a second bonding cycle through interconnect structures 1251, 1251', 1251", 1251''', 1251'''', 1251'''''. Interconnect structures 1251, 1251', 1251", 1251''', 1251'''', 1251''''' are disposed between the second surface of third semiconductor structure 1210 and the first surface of first semiconductor structure 1210 and may electrically couple one or more electrical connections in the third semiconductor structure 1240 to one or more electrical connections in the first semiconductor structure 1210.

An optional "underfill" material 1260 may be disposed between the second surface of the third semiconductor structure 1240 and the first surface of the first semiconductor structure 1210. The underfill material 1260 may, for example, protect the interconnect structures 1251, 1251', 1251", 1251''', 1251'''', 1251''''' during subsequent (e.g., third, fourth, etc.) bonding cycles by curing and/or freezing one or more portions of the interconnect structures 1251, 1251', 1251", 1251''', 1251'''', 1251'''''. In embodiments in which the underfill material 1260 substantially surrounds the interconnect structures 1251, 1251', 1251", 1251''', 1251'''', 1251''''', the underfill material will be substantially surrounded by the underfill material 1260 may, for example, substantially reduce, or ideally eliminate, deformation of the interconnect structures 1251, 1251', 1251", 1251''', 1251'''', 1251''''' during subsequent bonding cycles.

As described above and will be appreciated by one of skill in the art, embodiments of the disclosure herein may be configured as a system, method, or combination thereof. Accordingly, embodiments of the present disclosure may be comprised of various means including hardware, software, firmware or any combination thereof. Furthermore, embodiments of the present disclosure may take the form of a computer program product on a computer-readable storage medium having computer readable program instructions (e.g., computer software) embodied in the storage medium. Any suitable non-transitory computer-readable storage medium may be utilized.

It is to be appreciated that the concepts, systems, circuits and techniques sought to be protected herein are not limited to use in a particular application (e.g., circuitry in mobile phones, tablets, digital cameras and the like). In contrast, the concepts, systems, circuits and techniques sought to be protected herein may be found useful in substantially any application where a semiconductor manufacturer desires to fabricate multi-layer semiconductor structures (and devices) including superconducting semiconductor structures or integrated circuits.

Having described preferred embodiments, which serve to illustrate various concepts, structures and techniques, which are the subject of this patent, it will now become apparent to those of ordinary skill in the art that other embodiments incorporating these concepts, structures and techniques may be used. Additionally, elements of different embodiments described herein may be combined to form other embodiments not specifically set forth above.

Accordingly, it is submitted that that scope of the patent should not be limited to the described embodiments but rather should be limited only by the spirit and scope of the following claims.

What is claimed is:

1. A multi-layer semiconductor structure, comprising:
   a first semiconductor structure having first and second opposing surfaces and including one or more interconnect pads disposed on at least one of the first and second surfaces;
   a second semiconductor structure having first and second opposing surfaces and including one or more interconnect pads disposed on at least one of the first and second surfaces, wherein at least one of the first and second semiconductor structures is a superconducting semiconductor structure; and
   one or more interconnect structures, each of the interconnect structures disposed between the first and second semiconductor structures and coupled to respective ones of the interconnect pads provided on the first and second semiconductor structures, and each of the interconnect structures including a plurality of interconnect sections, wherein at least one of the interconnect sections includes at least one superconducting and/or a partially superconducting material;
wherein each of the interconnect structures has first and second opposing portions and includes:
a first interconnect section having first and second opposing portions, wherein the first portion of the first interconnect section corresponds to the first portion of the interconnect structure;
a second interconnect section having first and second opposing portions, wherein the first portion of the second interconnect section is disposed over the second portion of the first interconnect section; and
a third interconnect section having first and second opposing portions, wherein the first portion of the third interconnect section is disposed over the second portion of the second interconnect section, and the second portion of the third interconnect section corresponds to the second portion of the interconnect structure;
wherein the first interconnect section includes a plurality of conductive layers, and each of the conductive layers includes a different, respective metal or alloy material or combination of materials; and
wherein the third interconnect section includes a plurality of conductive layers, and each of the conductive layers includes a different, respective metal or alloy material or combination of materials;
wherein each of the conductive layers has a different, respective melting point;
wherein:
the first interconnect section of the first semiconductor structure consists of a first superconducting layer, a second superconducting layer disposed on the first superconducting layer, and a third conductive layer disposed on the second superconducting layer,
the second interconnect section of the first semiconductor structure consists of a superconducting bump disposed on the third layer of the first interconnect section; and
the third interconnect section of the first semiconductor structure consists of a fourth superconducting layer, a fifth superconducting layer disposed on the fourth superconducting layer, and a sixth conductive layer disposed on the fifth superconducting layer;
wherein at least one of the first, second, and third interconnect sections comprise an interface with a second one of the first, second, and third interconnect sections corresponding to a multi-melt interface that includes at least one superconducting and/or a partially superconducting material.

2. The multi-layer semiconductor structure of claim 1 wherein each of the interconnect sections includes one or more electrically conductive materials, and each of interconnect sections has a different, respective melting point than other ones of the interconnect sections.

3. The multi-layer semiconductor structure of claim 1 wherein a first one of the conductive layers includes Titanium (Ti) and/or Lead (Pb), a second one of the conductive layers includes Platinum (Pt) and/or Tin (Sn), and a third one of the conductive layers includes Gold (Au) and/or Indium (In).

4. The multi-layer semiconductor structure of claim 1 wherein the third interconnect section includes a plurality of conductive layers, and each of the conductive layers includes a different, respective metal or alloy material or combination of materials.

5. The multi-layer semiconductor structure of claim 1 wherein the first interconnect section and the third interconnect section are both provided as under bump metals (UBMs).

6. The multi-layer semiconductor structure of claim 5 wherein the second interconnect section is provided as a micro-bump.

7. The multi-layer semiconductor structure of claim 1, wherein the first semiconductor has a first package pitch and the second semiconductor structure has a second package pitch, and one or more characteristics of the interconnect structures are selected based upon at least one of the first package pitch and the second package pitch.

8. The multi-layer semiconductor structure of claim 7 wherein the one or more characteristics include dimensions of the interconnect structures and materials of the interconnect structures.

9. The multi-layer semiconductor structure of claim 1 wherein the interconnect structures form a micro bump assembly on at least one of the first and second semiconductor structures.

10. The multi-layer semiconductor structure of claim 1 wherein the first semiconductor structure is a multi-chip module (MCM) or an interposer module.

11. The multi-layer semiconductor structure of claim 1 wherein the second semiconductor structure includes a qubit.

12. The multi-layer semiconductor structure of claim 1, wherein:
the one or more interconnect pads includes Aluminum (Al) and/or Niobium (Nb), the first and fourth one of the conductive layers includes Titanium (Ti) and/or Lead (Pb) and/or Titanium nitride (TiN), the second and fifth one of the conductive layers includes Platinum (Pt) and/or Tin (Sn) and/or or Titanium nitride (TiN), and the third and sixth one of the conductive layers includes Gold (Au) and/or Indium (In);
the first, second, third, fourth, fifth, and sixth conductive layers each includes the different, respective metal or alloy material or combination of materials;
the first-second-third layers and the fourth-fifth-sixth layers are provided as under bump metals (UBMs); and
the second interconnect section is provided as a solder ball, sphere, pillar, or micro-bump.

* * * * *